United States Patent
Fuji et al.

(10) Patent No.: US 8,213,130 B1
(45) Date of Patent: Jul. 3, 2012

(54) MAGNETORESISTIVE ELEMENT, MAGNETIC HEAD ASSEMBLY, MAGNETIC RECORDING/REPRODUCING APPARATUS, MEMORY CELL ARRAY, AND MANUFACTURING METHOD OF MAGNETORESISTIVE ELEMENT

(75) Inventors: Yoshihiko Fuji, Kanagawa-ken (JP);
Michiko Hara, Kanagawa-ken (JP);
Hideaki Fukuzawa, Kanagawa-ken (JP); Hiromi Yuasa, Kanagawa-ken (JP);
Shuichi Murakami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/234,356

(22) Filed: Sep. 16, 2011

(30) Foreign Application Priority Data

Feb. 25, 2011 (JP) ................................. 2011-040362

(51) Int. Cl.
*G11B 5/33* (2006.01)

(52) U.S. Cl. ...................................................... 360/324

(58) Field of Classification Search ................... 360/324
See application file for complete search history.

(56) References Cited

U.S. PATENT DOCUMENTS

| | | | |
|---|---|---|---|
| 7,301,733 B1 | 11/2007 | Fukuzawa et al. | |
| 7,602,592 B2 * | 10/2009 | Fukuzawa et al. | 360/324.12 |
| 7,719,800 B2 * | 5/2010 | Hashimoto et al. | 360/324 |
| 7,742,262 B2 * | 6/2010 | Fukuzawa et al. | 360/324.12 |
| 7,808,747 B2 * | 10/2010 | Fuji et al. | 360/324.1 |
| 7,821,748 B2 * | 10/2010 | Fukuzawa et al. | 360/324.2 |
| 7,920,362 B2 * | 4/2011 | Hara et al. | 360/324.1 |
| 8,031,443 B2 * | 10/2011 | Fuke et al. | 360/324.1 |
| 8,111,489 B2 * | 2/2012 | Fuji et al. | 360/324 |

FOREIGN PATENT DOCUMENTS

JP    2004-6589    1/2004
WO    WO 2011/064822 A1    6/2011

\* cited by examiner

*Primary Examiner* — Mark Blouin

(74) *Attorney, Agent, or Firm* — Oblon, Spivak, McClelland, Maier & Neustadt, L.L.P.

(57) ABSTRACT

A magnetoresistive element includes a first electrode, a second electrode, a first magnetic layer, a second magnetic layer, a spacer layer, an oxide layer, and a metal layer. The oxide layer is provided between the first electrode and the first magnetic layer, or within the first magnetic layer, or between the first magnetic layer and the spacer layer, or within the spacer layer, or between the spacer layer and the second magnetic layer, or within the second magnetic layer, or between the second magnetic layer and the second electrode. The oxide layer includes at least one element of Zn, In, Sn, and Cd, and at least one element of Fe, Co, and Ni. The metal layer includes at least one element of Zn, In, Sn, and Cd by not less than 5 at % and not more than 80 at %, and at least one element of Fe, Co, and Ni.

10 Claims, 48 Drawing Sheets

TO FIG. 20B

| | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| COMPARATIVE EXAMPLE 1-1 | Fe[1nm]/Zn[0.6nm] prepared by sputtering →ion beam oxidization→reduction (Ar-plasma irradiation) |
| EXAMPLE 1-1 | Fe[1nm]/Zn[0.6nm] prepared by sputtering →ion beam oxidization→reduction (Ar-plasma irradiation) |
| EXAMPLE 1-2 | Fe[1nm]/Zn[0.6nm] prepared by sputtering →ion beam oxidization→reduction (Ar-plasma irradiation) |
| EXAMPLE 1-3 | Fe[1nm]/Zn[0.6nm] prepared by sputtering →ion beam oxidization→reduction (Ar-plasma irradiation) |
| EXAMPLE 1-4 | Fe[1nm]/Zn[0.6nm] prepared by sputtering →ion beam oxidization→reduction (Ar-plasma irradiation) |
| EXAMPLE 1-5 | Fe[1nm]/Zn[0.6nm] prepared by sputtering →ion beam oxidization→reduction (Ar-plasma irradiation) |
| EXAMPLE 1-6 | Fe[1nm]/Zn[0.6nm] prepared by sputtering →ion beam oxidization→reduction (Ar-plasma irradiation) |
| EXAMPLE 1-7 | Fe[1nm]/Zn[0.6nm] prepared by sputtering →ion beam oxidization→reduction (Ar-plasma irradiation) |
| EXAMPLE 1-8 | Fe[1nm]/Zn[0.6nm] prepared by sputtering →ion beam oxidization→reduction (Ar-plasma irradiation) |
| EXAMPLE 1-9 | Fe[1nm]/Zn[0.6nm] prepared by sputtering →ion beam oxidization→reduction (Ar-plasma irradiation) |
| EXAMPLE 1-10 | Fe[1nm]/Zn[0.6nm] prepared by sputtering →ion beam oxidization→reduction (Ar-plasma irradiation) |
| EXAMPLE 1-11 | Fe[1nm]/Zn[0.6nm] prepared by sputtering →ion beam oxidization→reduction (Ar-plasma irradiation) |
| EXAMPLE 1-12 | Fe[1nm]/Zn[0.6nm] prepared by sputtering →ion beam oxidization→reduction (Ar-plasma irradiation) |
| COMPARATIVE EXAMPLE 1-2 | Fe[1nm]/Zn[0.6nm] prepared by sputtering →ion beam oxidization→reduction (Ar-plasma irradiation) |

FIG. 20A

⇦ FROM FIG. 20A

| S20(PREPARATION OF METAL LAYER 50) | MR[%] | RA (Ω μm²) |
|---|---|---|
| - | 10 | 0.25 |
| Fe₅₀Co₅₀(2nm) prepared by sputtering | 10.4 | 0.25 |
| Zn₅(Fe₅₀Co₅₀)₉₅(2nm) prepared by sputtering | 13.3 | 0.24 |
| Zn₁₀(Fe₅₀Co₅₀)₉₀(2nm) prepared by sputtering | 16 | 0.23 |
| Zn₂₅(Fe₅₀Co₅₀)₇₅(2nm) prepared by sputtering | 16.2 | 0.23 |
| Zn₅₀(Fe₅₀Co₅₀)₅₀(2nm) prepared by sputtering | 16.5 | 0.25 |
| Zn₇₅(Fe₅₀Co₅₀)₂₅(2nm) prepared by sputtering | 15.5 | 0.24 |
| Zn₈₀(Fe₅₀Co₅₀)₂₀(2nm) prepared by sputtering | 13.7 | 0.24 |
| (Zn(0.0125nm)/Fe₅₀Co₅₀(0.2375nm)) × 8 prepared by sputtering | 14 | 0.23 |
| (Zn(0.025nm)/Fe₅₀Co₅₀(0.225nm)) × 8 prepared by sputtering | 17 | 0.25 |
| (Zn(0.0635nm)/Fe₅₀Co₅₀(0.1865nm)) × 8 prepared by sputtering | 17 | 0.25 |
| (Zn(0.125nm)/Fe₅₀Co₅₀(0.125nm)) × 8 prepared by sputtering | 17.2 | 0.25 |
| (Zn(0.1865nm)/Fe₅₀Co₅₀(0.0635nm)) × 8 prepared by sputtering | 18 | 0.27 |
| (Zn(0.2nm)/Fe₅₀Co₅₀(0.05nm)) × 8 prepared by sputtering | 14.2 | 0.27 |
| Zn(2nm) prepared by sputtering | 8 | 0.27 |

FIG. 20B

| | S30(PREPARATION OF METAL LAYER 50) |
|---|---|
| REFERENCE EXAMPLE | - |
| COMPARATIVE EXAMPLE 2-1 | Fe$_{50}$Co$_{50}$(2nm) prepared by sputtering |
| EXAMPLE 2-1 | Zn$_5$(Fe$_{50}$Co$_{50}$)$_{95}$(2nm) prepared by sputtering |
| EXAMPLE 2-2 | Zn$_{10}$(Fe$_{50}$Co$_{50}$)$_{90}$(2nm) prepared by sputtering |
| EXAMPLE 2-3 | Zn$_{25}$(Fe$_{50}$Co$_{50}$)$_{75}$(2nm) prepared by sputtering |
| EXAMPLE 2-4 | Zn$_{50}$(Fe$_{50}$Co$_{50}$)$_{50}$(2nm) prepared by sputtering |
| EXAMPLE 2-4 | Zn$_{75}$(Fe$_{50}$Co$_{50}$)$_{25}$(2nm) prepared by sputtering |
| EXAMPLE 2-5 | Zn$_{90}$(Fe$_{50}$Co$_{50}$)$_{10}$(2nm) prepared by sputtering |
| EXAMPLE 2-6 | (Zn(0.0125nm)/Fe$_{50}$Co$_{50}$(0.2375nm)) × 8 prepared by sputtering |
| EXAMPLE 2-7 | (Zn(0.025nm)/Fe$_{50}$Co$_{50}$(0.225nm)) × 8 prepared by sputtering |
| EXAMPLE 2-8 | (Zn(0.0635nm)/Fe$_{50}$Co$_{50}$(0.1865nm)) × 8 prepared by sputtering |
| EXAMPLE 2-9 | (Zn(0.125nm)/Fe$_{50}$Co$_{50}$(0.125nm)) × 8 prepared by sputtering |
| EXAMPLE 2-10 | (Zn(0.1865nm)/Fe$_{50}$Co$_{50}$(0.0635nm)) × 8 prepared by sputtering |
| EXAMPLE 2-10 | (Zn(0.2nm)/Fe$_{50}$Co$_{50}$(0.05nm)) × 8 prepared by sputtering |
| COMPARATIVE EXAMPLE 2-2 | Zn(2nm) prepared by sputtering |

↺ FROM FIG. 22A

| S40(PREPARATION OF OXIDE LAYER 40) | MR(%) | RA ($\Omega\,\mu m^2$) |
|---|---|---|
| Fe(1nm)/Zn(0.6nm) prepared by sputtering →ion beam oxidization→reduction (Ar-plasma irradiation) | 10 | 0.25 |
| Fe(1nm)/Zn(0.6nm) prepared by sputtering →ion beam oxidization→reduction (Ar-plasma irradiation) | 7 | 0.24 |
| Fe(1nm)/Zn(0.6nm) prepared by sputtering →ion beam oxidization→reduction (Ar-plasma irradiation) | 12 | 0.25 |
| Fe(1nm)/Zn(0.6nm) prepared by sputtering →ion beam oxidization→reduction (Ar-plasma irradiation) | 13.6 | 0.26 |
| Fe(1nm)/Zn(0.6nm) prepared by sputtering →ion beam oxidization→reduction (Ar-plasma irradiation) | 13.5 | 0.23 |
| Fe(1nm)/Zn(0.6nm) prepared by sputtering →ion beam oxidization→reduction (Ar-plasma irradiation) | 13.6 | 0.28 |
| Fe(1nm)/Zn(0.6nm) prepared by sputtering →ion beam oxidization→reduction (Ar-plasma irradiation) | 13.6 | 0.29 |
| Fe(1nm)/Zn(0.6nm) prepared by sputtering →ion beam oxidization→reduction (Ar-plasma irradiation) | 12.7 | 0.25 |
| Fe(1nm)/Zn(0.6nm) prepared by sputtering →ion beam oxidization→reduction (Ar-plasma irradiation) | 12.8 | 0.22 |
| Fe(1nm)/Zn(0.6nm) prepared by sputtering →ion beam oxidization→reduction (Ar-plasma irradiation) | 14 | 0.27 |
| Fe(1nm)/Zn(0.6nm) prepared by sputtering →ion beam oxidization→reduction (Ar-plasma irradiation) | 14.2 | 0.23 |
| Fe(1nm)/Zn(0.6nm) prepared by sputtering →ion beam oxidization→reduction (Ar-plasma irradiation) | 14.5 | 0.25 |
| Fe(1nm)/Zn(0.6nm) prepared by sputtering →ion beam oxidization→reduction (Ar-plasma irradiation) | 13.7 | 0.27 |
| Fe(1nm)/Zn(0.6nm) prepared by sputtering →ion beam oxidization→reduction (Ar-plasma irradiation) | 12.9 | 0.27 |
| Fe(1nm)/Zn(0.6nm) prepared by sputtering →ion beam oxidization→reduction (Ar-plasma irradiation) | 6 | 0.28 |

FIG. 22B

| | S50(PREPARATION OF METAL LAYER 50) | S60(PREPARATION OF OXIDE LAYER 40) |
|---|---|---|
| REFERENCE EXAMPLE | - | Fe(1nm)Zn(0.5nm) prepared by sputtering→ion beam oxidization→reduction (Ar-plasma irradiation) |
| COMPARATIVE EXAMPLE 3-1 | $Fe_{50}Co_{50}$(2nm) prepared by sputtering | Fe(1nm)Zn(0.5nm) prepared by sputtering→ion beam oxidization→reduction (Ar-plasma irradiation) |
| EXAMPLE 3-1 | $Zn_5(Fe_{50}Co_{50})_{95}$(2nm) prepared by sputtering | Fe(1nm)Zn(0.5nm) prepared by sputtering→ion beam oxidization→reduction (Ar-plasma irradiation) |
| EXAMPLE 3-2 | $Zn_{10}(Fe_{50}Co_{50})_{90}$(2nm) prepared by sputtering | Fe(1nm)Zn(0.5nm) prepared by sputtering→ion beam oxidization→reduction (Ar-plasma irradiation) |
| EXAMPLE 3-3 | $Zn_{25}(Fe_{50}Co_{50})_{75}$(2nm) prepared by sputtering | Fe(1nm)Zn(0.5nm) prepared by sputtering→ion beam oxidization→reduction (Ar-plasma irradiation) |
| EXAMPLE 3-4 | $Zn_{50}(Fe_{50}Co_{50})_{50}$(2nm) prepared by sputtering | Fe(1nm)Zn(0.5nm) prepared by sputtering→ion beam oxidization→reduction (Ar-plasma irradiation) |
| EXAMPLE 3-5 | $Zn_{75}(Fe_{50}Co_{50})_{25}$(2nm) prepared by sputtering | Fe(1nm)Zn(0.5nm) prepared by sputtering→ion beam oxidization→reduction (Ar-plasma irradiation) |
| EXAMPLE 3-6 | $Zn_{90}(Fe_{50}Co_{50})_{10}$(2nm) prepared by sputtering | Fe(1nm)Zn(0.5nm) prepared by sputtering→ion beam oxidization→reduction (Ar-plasma irradiation) |
| EXAMPLE 3-7 | (Zn(0.0125nm)/$Fe_{50}Co_{50}$(0.2375nm))×8 prepared by sputtering | Fe(1nm)Zn(0.5nm) prepared by sputtering→ion beam oxidization→reduction (Ar-plasma irradiation) |
| EXAMPLE 3-8 | (Zn(0.025nm)/$Fe_{50}Co_{50}$(0.225nm))×8 prepared by sputtering | Fe(1nm)Zn(0.5nm) prepared by sputtering→ion beam oxidization→reduction (Ar-plasma irradiation) |
| EXAMPLE 3-9 | (Zn(0.0635nm)/$Fe_{50}Co_{50}$(0.1865nm))×8 prepared by sputtering | Fe(1nm)Zn(0.5nm) prepared by sputtering→ion beam oxidization→reduction (Ar-plasma irradiation) |
| EXAMPLE 3-10 | (Zn(0.125nm)/$Fe_{50}Co_{50}$(0.125nm))×8 prepared by sputtering | Fe(1nm)Zn(0.5nm) prepared by sputtering→ion beam oxidization→reduction (Ar-plasma irradiation) |
| EXAMPLE 3-11 | (Zn(0.1865nm)/$Fe_{50}Co_{50}$(0.0635nm))×8 prepared by sputtering | Fe(1nm)Zn(0.5nm) prepared by sputtering→ion beam oxidization→reduction (Ar-plasma irradiation) |
| EXAMPLE 3-12 | (Zn(0.2nm)/$Fe_{50}Co_{50}$(0.05nm))×8 prepared by sputtering | Fe(1nm)Zn(0.5nm) prepared by sputtering→ion beam oxidization→reduction (Ar-plasma irradiation) |
| COMPARATIVE EXAMPLE 3-2 | Zn(2nm) prepared by sputtering | Fe(1nm)Zn(0.5nm) prepared by sputtering→ion beam oxidization→reduction (Ar-plasma irradiation) |

↰ FROM FIG. 23A

| S70(PREPARATION OF METAL LAYER 60) | MR[%] | RA [Ω μm] |
|---|---|---|
| - | 10 | 0.25 |
| $Fe_{50}Co_{50}$[2nm] prepared by sputtering | 6.5 | 0.25 |
| $Zn_5(Fe_{50}Co_{50})_{95}$[2nm] prepared by sputtering | 14.5 | 0.27 |
| $Zn_{25}(Fe_{50}Co_{50})_{75}$[2nm] prepared by sputtering | 15.5 | 0.27 |
| $Zn_{25}(Fe_{50}Co_{50})_{75}$[2nm] prepared by sputtering | 15.8 | 0.24 |
| $Zn_{50}(Fe_{50}Co_{50})_{50}$[2nm] prepared by sputtering | 15 | 0.23 |
| $Zn_{75}(Fe_{50}Co_{50})_{25}$[2nm] prepared by sputtering | 14.8 | 0.26 |
| $Zn_{80}(Fe_{50}Co_{50})_{20}$[2nm] prepared by sputtering | 12.3 | 0.26 |
| (Zn[0.0125nm]/$Fe_{50}Co_{50}$[0.2375nm]) × 8 prepared by sputtering | 15 | 0.25 |
| (Zn[0.025nm]/$Fe_{50}Co_{50}$[0.225nm]) × 8 prepared by sputtering | 16.7 | 0.24 |
| (Zn[0.0635nm]/$Fe_{50}Co_{50}$[0.1865nm]) × 8 prepared by sputtering | 16.8 | 0.26 |
| (Zn[0.125nm]/$Fe_{50}Co_{50}$[0.125nm]) × 8 prepared by sputtering | 15.5 | 0.24 |
| (Zn[0.1865nm]/$Fe_{50}Co_{50}$[0.0635nm]) × 8 prepared by sputtering | 15 | 0.23 |
| (Zn[0.2nm]/$Fe_{50}Co_{50}$[0.05nm]) × 8 prepared by sputtering | 13 | 0.23 |
| Zn[2nm] prepared by sputtering | 6 | 0.36 |

| | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| COMPARATIVE EXAMPLE 4-1 | Fe[1nm]/Zn[0.6nm] prepared by sputtering →ion beam oxidization→reduction (Ar-plasma irradiation) |
| EXAMPLE 4-1 | Fe[1nm]/Zn[0.6nm] prepared by sputtering →ion beam oxidization→reduction (Ar-plasma irradiation) |
| EXAMPLE 4-2 | Fe[1nm]/Zn[0.6nm] prepared by sputtering →ion beam oxidization→reduction (Ar-plasma irradiation) |
| EXAMPLE 4-3 | Fe[1nm]/Zn[0.6nm] prepared by sputtering →ion beam oxidization→reduction (Ar-plasma irradiation) |
| EXAMPLE 4-4 | Fe[1nm]/Zn[0.6nm] prepared by sputtering →ion beam oxidization→reduction (Ar-plasma irradiation) |
| EXAMPLE 4-5 | Fe[1nm]/Zn[0.6nm] prepared by sputtering →ion beam oxidization→reduction (Ar-plasma irradiation) |
| EXAMPLE 4-6 | Fe[1nm]/Zn[0.6nm] prepared by sputtering →ion beam oxidization→reduction (Ar-plasma irradiation) |
| EXAMPLE 4-7 | Fe[1nm]/Zn[0.6nm] prepared by sputtering →ion beam oxidization→reduction (Ar-plasma irradiation) |
| EXAMPLE 4-8 | Fe[1nm]/Zn[0.6nm] prepared by sputtering →ion beam oxidization→reduction (Ar-plasma irradiation) |
| EXAMPLE 4-9 | Fe[1nm]/Zn[0.6nm] prepared by sputtering →ion beam oxidization→reduction (Ar-plasma irradiation) |
| EXAMPLE 4-10 | Fe[1nm]/Zn[0.6nm] prepared by sputtering →ion beam oxidization→reduction (Ar-plasma irradiation) |
| EXAMPLE 4-11 | Fe[1nm]/Zn[0.6nm] prepared by sputtering →ion beam oxidization→reduction (Ar-plasma irradiation) |
| EXAMPLE 4-12 | Fe[1nm]/Zn[0.6nm] prepared by sputtering →ion beam oxidization→reduction (Ar-plasma irradiation) |
| COMPARATIVE EXAMPLE 4-2 | Fe[1nm]/Zn[0.6nm] prepared by sputtering →ion beam oxidization→reduction (Ar-plasma irradiation) |

FIG. 24A

⇦ FROM FIG. 24A

| S20(PREPARATION OF METAL LAYER 50) | MR[%] | RA [Ω μm] |
|---|---|---|
| - | 10 | 0.26 |
| Fe[2nm] prepared by sputtering | 8.5 | 0.24 |
| $Zn_5Fe_{95}$[2nm] prepared by sputtering | 10 | 0.24 |
| $Zn_{10}Fe_{90}$[2nm] prepared by sputtering | 11.5 | 0.26 |
| $Zn_{25}Fe_{75}$[2nm] prepared by sputtering | 12.5 | 0.25 |
| $Zn_{50}Fe_{50}$[2nm] prepared by sputtering | 13 | 0.23 |
| $Zn_{75}Fe_{25}$[2nm] prepared by sputtering | 12.8 | 0.26 |
| $Zn_{90}Fe_{10}$[2nm] prepared by sputtering | 11.2 | 0.26 |
| (Zn[0.0125nm]/Fe[0.2375nm]) × 8 prepared by sputtering | 11.3 | 0.28 |
| (Zn[0.025nm]/Fe[0.225nm]) × 8 prepared by sputtering | 12.2 | 0.25 |
| (Zn[0.0635nm]/Fe[0.1865nm]) × 8 prepared by sputtering | 13 | 0.24 |
| (Zn[0.125nm]/Fe[0.125nm]) × 8 prepared by sputtering | 13.7 | 0.23 |
| (Zn[0.1865nm]/Fe[0.0635nm]) × 8 prepared by sputtering | 13 | 0.29 |
| (Zn[0.2nm]/Fe[0.05nm]) × 8 prepared by sputtering | 11.5 | 0.29 |
| Zn[2nm] prepared by sputtering | 8 | 0.26 |

FIG. 24B

| | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| COMPARATIVE EXAMPLE 5-1 | Fe[1nm]/Zn[0.6nm] prepared by sputtering →ion beam oxidization→reduction (Ar-plasma irradiation) |
| EXAMPLE 5-1 | Fe[1nm]/Zn[0.6nm] prepared by sputtering →ion beam oxidization→reduction (Ar-plasma irradiation) |
| EXAMPLE 5-2 | Fe[1nm]/Zn[0.6nm] prepared by sputtering →ion beam oxidization→reduction (Ar-plasma irradiation) |
| EXAMPLE 5-3 | Fe[1nm]/Zn[0.6nm] prepared by sputtering →ion beam oxidization→reduction (Ar-plasma irradiation) |
| EXAMPLE 5-4 | Fe[1nm]/Zn[0.6nm] prepared by sputtering →ion beam oxidization→reduction (Ar-plasma irradiation) |
| EXAMPLE 5-5 | Fe[1nm]/Zn[0.6nm] prepared by sputtering →ion beam oxidization→reduction (Ar-plasma irradiation) |
| EXAMPLE 5-6 | Fe[1nm]/Zn[0.6nm] prepared by sputtering →ion beam oxidization→reduction (Ar-plasma irradiation) |
| EXAMPLE 5-7 | Fe[1nm]/Zn[0.6nm] prepared by sputtering →ion beam oxidization→reduction (Ar-plasma irradiation) |
| EXAMPLE 5-8 | Fe[1nm]/Zn[0.6nm] prepared by sputtering →ion beam oxidization→reduction (Ar-plasma irradiation) |
| EXAMPLE 5-9 | Fe[1nm]/Zn[0.6nm] prepared by sputtering →ion beam oxidization→reduction (Ar-plasma irradiation) |
| EXAMPLE 5-10 | Fe[1nm]/Zn[0.6nm] prepared by sputtering →ion beam oxidization→reduction (Ar-plasma irradiation) |
| EXAMPLE 5-11 | Fe[1nm]/Zn[0.6nm] prepared by sputtering →ion beam oxidization→reduction (Ar-plasma irradiation) |
| EXAMPLE 5-12 | Fe[1nm]/Zn[0.6nm] prepared by sputtering →ion beam oxidization→reduction (Ar-plasma irradiation) |
| COMPARATIVE EXAMPLE 5-2 | Fe[1nm]/Zn[0.6nm] prepared by sputtering →ion beam oxidization→reduction (Ar-plasma irradiation) |

↰ FROM FIG. 25A

| S20(PREPARATION OF METAL LAYER 50) | MR[%] | RA ($\Omega \mu m^2$) |
|---|---|---|
| - | 10 | 0.25 |
| $Co_{90}Fe_{10}$[2nm] prepared by sputtering | 7.6 | 0.24 |
| $Zn_5(Co_{90}Fe_{10})_{95}$[2nm] prepared by sputtering | 11.2 | 0.26 |
| $Zn_{50}(Co_{90}Fe_{10})_{90}$[2nm] prepared by sputtering | 12.6 | 0.26 |
| $Zn_{25}(Co_{90}Fe_{10})_{75}$[2nm] prepared by sputtering | 12.7 | 0.25 |
| $Zn_{50}(Co_{90}Fe_{10})_{50}$[2nm] prepared by sputtering | 13.2 | 0.24 |
| $Zn_{75}(Co_{90}Fe_{10})_{25}$[2nm] prepared by sputtering | 11.8 | 0.243 |
| $Zn_{80}(Co_{90}Fe_{10})_{20}$[2nm] prepared by sputtering | 10.8 | 0.243 |
| (Zn[0.0125nm]/$Co_{90}Fe_{10}$[0.2375nm]) × 8 prepared by sputtering | 11.5 | 0.24 |
| (Zn[0.025nm]/$Co_{90}Fe_{10}$[0.225nm]) × 8 prepared by sputtering | 13.2 | 0.26 |
| (Zn[0.0635nm]/$Co_{90}Fe_{10}$[0.1865nm]) × 8 prepared by sputtering | 13.5 | 0.26 |
| (Zn[0.125nm]/$Co_{90}Fe_{10}$[0.125nm]) × 8 prepared by sputtering | 13.8 | 0.24 |
| (Zn[0.1865nm]/$Co_{90}Fe_{10}$[0.0635nm]) × 8 prepared by sputtering | 12.1 | 0.25 |
| (Zn[0.2nm]/$Co_{90}Fe_{10}$[0.05nm]) × 8 prepared by sputtering | 11 | 0.25 |
| Zn[2nm] prepared by sputtering | 8 | 0.26 |

FIG. 25B

|  | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| COMPARATIVE EXAMPLE 6-1 | Fe[1nm]/Zn[0.6nm] prepared by sputtering →ion beam oxidization→reduction (Ar-plasma irradiation) |
| EXAMPLE 6-1 | Fe[1nm]/Zn[0.6nm] prepared by sputtering →ion beam oxidization→reduction (Ar-plasma irradiation) |
| EXAMPLE 6-2 | Fe[1nm]/Zn[0.6nm] prepared by sputtering →ion beam oxidization→reduction (Ar-plasma irradiation) |
| EXAMPLE 6-3 | Fe[1nm]/Zn[0.6nm] prepared by sputtering →ion beam oxidization→reduction (Ar-plasma irradiation) |
| EXAMPLE 6-4 | Fe[1nm]/Zn[0.6nm] prepared by sputtering →ion beam oxidization→reduction (Ar-plasma irradiation) |
| EXAMPLE 6-5 | Fe[1nm]/Zn[0.6nm] prepared by sputtering →ion beam oxidization→reduction (Ar-plasma irradiation) |
| EXAMPLE 6-6 | Fe[1nm]/Zn[0.6nm] prepared by sputtering →ion beam oxidization→reduction (Ar-plasma irradiation) |
| EXAMPLE 6-7 | Fe[1nm]/Zn[0.6nm] prepared by sputtering →ion beam oxidization→reduction (Ar-plasma irradiation) |
| EXAMPLE 6-8 | Fe[1nm]/Zn[0.6nm] prepared by sputtering →ion beam oxidization→reduction (Ar-plasma irradiation) |
| EXAMPLE 6-9 | Fe[1nm]/Zn[0.6nm] prepared by sputtering →ion beam oxidization→reduction (Ar-plasma irradiation) |
| EXAMPLE 6-10 | Fe[1nm]/Zn[0.6nm] prepared by sputtering →ion beam oxidization→reduction (Ar-plasma irradiation) |
| EXAMPLE 6-11 | Fe[1nm]/Zn[0.6nm] prepared by sputtering →ion beam oxidization→reduction (Ar-plasma irradiation) |
| EXAMPLE 6-12 | Fe[1nm]/Zn[0.6nm] prepared by sputtering →ion beam oxidization→reduction (Ar-plasma irradiation) |
| COMPARATIVE EXAMPLE 6-2 | Fe[1nm]/Zn[0.6nm] prepared by sputtering →ion beam oxidization→reduction (Ar-plasma irradiation) |

⇧ FROM FIG. 26A

| S20(PREPARATION OF METAL LAYER 50) | MR[%] | RA ($\Omega \mu m$) |
|---|---|---|
| — | 10 | 0.28 |
| $Fe_{50}Ni_{50}$[2nm] prepared by sputtering | 6 | 0.25 |
| $Zn_5(Fe_{50}Ni_{50})_{95}$[2nm] prepared by sputtering | 11 | 0.25 |
| $Zn_{25}(Fe_{50}Ni_{50})_{75}$[2nm] prepared by sputtering | 12.2 | 0.24 |
| $Zn_{25}(Fe_{50}Ni_{50})_{75}$[2nm] prepared by sputtering | 13 | 0.24 |
| $Zn_{50}(Fe_{50}Ni_{50})_{50}$[2nm] prepared by sputtering | 13.2 | 0.23 |
| $Zn_{75}(Fe_{50}Ni_{50})_{25}$[2nm] prepared by sputtering | 12.5 | 0.23 |
| $Zn_{95}(Fe_{50}Ni_{50})_{5}$[2nm] prepared by sputtering | 11.2 | 0.23 |
| (Zn[0.0125nm]/$Fe_{50}Ni_{50}$[0.2375nm]) × 8 prepared by sputtering | 11.5 | 0.26 |
| (Zn[0.025nm]/$Fe_{50}Ni_{50}$[0.225nm]) × 8 prepared by sputtering | 12.7 | 0.24 |
| (Zn[0.0635nm]/$Fe_{50}Ni_{50}$[0.1865nm]) × 8 prepared by sputtering | 13.2 | 0.25 |
| (Zn[0.125nm]/$Fe_{50}Ni_{50}$[0.125nm]) × 8 prepared by sputtering | 13.4 | 0.26 |
| (Zn[0.1865nm]/$Fe_{50}Ni_{50}$[0.0635nm]) × 8 prepared by sputtering | 13 | 0.24 |
| (Zn[0.2nm]/$Fe_{50}Ni_{50}$[0.05nm]) × 8 prepared by sputtering | 11.5 | 0.24 |
| Zn[2nm] prepared by sputtering | 8 | 0.25 |

| | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| COMPARATIVE EXAMPLE 7-1 | Fe[1nm]/Zn[0.6nm] prepared by sputtering →ion beam oxidization→reduction (Ar-plasma irradiation) |
| EXAMPLE 7-1 | Fe[1nm]/Zn[0.6nm] prepared by sputtering →ion beam oxidization→reduction (Ar-plasma irradiation) |
| EXAMPLE 7-2 | Fe[1nm]/Zn[0.6nm] prepared by sputtering →ion beam oxidization→reduction (Ar-plasma irradiation) |
| EXAMPLE 7-3 | Fe[1nm]/Zn[0.6nm] prepared by sputtering →ion beam oxidization→reduction (Ar-plasma irradiation) |
| EXAMPLE 7-4 | Fe[1nm]/Zn[0.6nm] prepared by sputtering →ion beam oxidization→reduction (Ar-plasma irradiation) |
| EXAMPLE 7-5 | Fe[1nm]/Zn[0.6nm] prepared by sputtering →ion beam oxidization→reduction (Ar-plasma irradiation) |
| EXAMPLE 7-6 | Fe[1nm]/Zn[0.6nm] prepared by sputtering →ion beam oxidization→reduction (Ar-plasma irradiation) |
| EXAMPLE 7-7 | Fe[1nm]/Zn[0.6nm] prepared by sputtering →ion beam oxidization→reduction (Ar-plasma irradiation) |
| EXAMPLE 7-8 | Fe[1nm]/Zn[0.6nm] prepared by sputtering →ion beam oxidization→reduction (Ar-plasma irradiation) |
| EXAMPLE 7-9 | Fe[1nm]/Zn[0.6nm] prepared by sputtering →ion beam oxidization→reduction (Ar-plasma irradiation) |
| EXAMPLE 7-10 | Fe[1nm]/Zn[0.6nm] prepared by sputtering →ion beam oxidization→reduction (Ar-plasma irradiation) |
| EXAMPLE 7-11 | Fe[1nm]/Zn[0.6nm] prepared by sputtering →ion beam oxidization→reduction (Ar-plasma irradiation) |
| EXAMPLE 7-12 | Fe[1nm]/Zn[0.6nm] prepared by sputtering →ion beam oxidization→reduction (Ar-plasma irradiation) |
| COMPARATIVE EXAMPLE 7-2 | Fe[1nm]/Zn[0.6nm] prepared by sputtering →ion beam oxidization→reduction (Ar-plasma irradiation) |

FIG. 27A

◊ FROM FIG. 27A

| S20(PREPARATION OF METAL LAYER 50) | MR[%] | RA ($\Omega\mu m^2$) |
|---|---|---|
| - | 10 | 0.25 |
| $Co_{50}Ni_{50}$[2nm] prepared by sputtering | 7 | 0.24 |
| $Zn_5(Co_{50}Ni_{50})_{95}$[2nm] prepared by sputtering | 11 | 0.24 |
| $Zn_{10}(Co_{50}Ni_{50})_{90}$[2nm] prepared by sputtering | 11.9 | 0.28 |
| $Zn_{25}(Co_{50}Ni_{50})_{75}$[2nm] prepared by sputtering | 12.2 | 0.25 |
| $Zn_{50}(Co_{50}Ni_{50})_{50}$[2nm] prepared by sputtering | 12.3 | 0.23 |
| $Zn_{75}(Co_{50}Ni_{50})_{25}$[2nm] prepared by sputtering | 12 | 0.26 |
| $Zn_{90}(Co_{50}Ni_{50})_{10}$[2nm] prepared by sputtering | 11.1 | 0.26 |
| (Zn[0.0125nm]/$Co_{50}Ni_{50}$[0.2375nm])×8 prepared by sputtering | 11.2 | 0.28 |
| (Zn[0.025nm]/$Co_{50}Ni_{50}$[0.225nm])×8 prepared by sputtering | 12.2 | 0.25 |
| (Zn[0.0635nm]/$Co_{50}Ni_{50}$[0.1865nm])×8 prepared by sputtering | 12.8 | 0.24 |
| (Zn[0.125nm]/$Co_{50}Ni_{50}$[0.125nm])×8 prepared by sputtering | 13 | 0.23 |
| (Zn[0.1865nm]/$Co_{50}Ni_{50}$[0.0635nm])×8 prepared by sputtering | 12.8 | 0.29 |
| (Zn[0.2nm]/$Co_{50}Ni_{50}$[0.05nm])×8 prepared by sputtering | 11.5 | 0.29 |
| Zn[2nm] prepared by sputtering | 8 | 0.26 |

FIG. 27B

| | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| EXAMPLE 6-1 | Fe[1nm]/Zn[0.6nm] prepared by sputtering →ion beam oxidization→reduction (Ar-plasma irradiation) |
| EXAMPLE 6-2 | Fe[1nm]/Zn[0.6nm] prepared by sputtering →ion beam oxidization→reduction (Ar-plasma irradiation) |
| EXAMPLE 6-3 | Fe[1nm]/Zn[0.6nm] prepared by sputtering →ion beam oxidization→reduction (Ar-plasma irradiation) |
| EXAMPLE 6-4 | Fe[1nm]/Zn[0.6nm] prepared by sputtering →ion beam oxidization→reduction (Ar-plasma irradiation) |
| EXAMPLE 6-5 | Fe[1nm]/Zn[0.6nm] prepared by sputtering →ion beam oxidization→reduction (Ar-plasma irradiation) |

TO FIG. 28B 

FIG. 28A

⇩ FROM FIG. 28A

| S20(PREPARATION OF METAL LAYER 80) | MR[%] | RA [Ω μm²] |
|---|---|---|
| - | 10 | 0.25 |
| $Zn_{50}(Co_{90}Fe_{10})_{50}$[2nm] prepared by sputtering | 13.2 | 0.24 |
| $Zn_{50}(Co_{75}Fe_{25})_{50}$[2nm] prepared by sputtering | 16.3 | 0.26 |
| $Zn_{50}(Fe_{50}Co_{50})_{50}$[2nm] prepared by sputtering | 16.5 | 0.25 |
| $Zn_{50}(Fe_{80}Co_{20})_{50}$[2nm] prepared by sputtering | 16.5 | 0.24 |
| $Zn_{50}Fe_{50}$[2nm] prepared by sputtering | 13 | 0.23 |

FIG. 28B

| | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| EXAMPLE 9-1 | Fe[1nm]/Zn[0.6nm] prepared by sputtering →ion beam oxidization→reduction (Ar-plasma irradiation) |
| EXAMPLE 9-2 | Fe[1nm]/Zn[0.6nm] prepared by sputtering →ion beam oxidization→reduction (Ar-plasma irradiation) |
| EXAMPLE 9-3 | Fe[1nm]/Zn[0.6nm] prepared by sputtering →ion beam oxidization→reduction (Ar-plasma irradiation) |
| EXAMPLE 9-4 | Fe[1nm]/Zn[0.6nm] prepared by sputtering →ion beam oxidization→reduction (Ar-plasma irradiation) |
| EXAMPLE 9-5 | Fe[1nm]/Zn[0.6nm] prepared by sputtering →ion beam oxidization→reduction (Ar-plasma irradiation) |
| EXAMPLE 9-6 | Fe[1nm]/Zn[0.6nm] prepared by sputtering →ion beam oxidization→reduction (Ar-plasma irradiation) |
| EXAMPLE 9-7 | Fe[1nm]/Zn[0.6nm] prepared by sputtering →ion beam oxidization→reduction (Ar-plasma irradiation) |
| EXAMPLE 9-8 | Fe[1nm]/Zn[0.6nm] prepared by sputtering →ion beam oxidization→reduction (Ar-plasma irradiation) |
| EXAMPLE 9-9 | Fe[1nm]/Zn[0.6nm] prepared by sputtering →ion beam oxidization→reduction (Ar-plasma irradiation) |
| EXAMPLE 9-10 | Fe[1nm]/Zn[0.6nm] prepared by sputtering →ion beam oxidization→reduction (Ar-plasma irradiation) |
| EXAMPLE 9-11 | Fe[1nm]/Zn[0.6nm] prepared by sputtering →ion beam oxidization→reduction (Ar-plasma irradiation) |
| EXAMPLE 9-12 | Fe[1nm]/Zn[0.6nm] prepared by sputtering →ion beam oxidization→reduction (Ar-plasma irradiation) |

⇧ FROM FIG. 29A

| S20(PREPARATION OF METAL LAYER 50) | MR[%] | RA ($\Omega \mu m^2$) |
|---|---|---|
| - | 10 | 0.25 |
| $Zn_{50}(Fe_{50}Co_{50})_{50}$[0.1nm] prepared by sputtering | 11.5 | 0.26 |
| $Zn_{50}(Fe_{50}Co_{50})_{50}$[0.25nm] prepared by sputtering | 13.8 | 0.24 |
| $Zn_{50}(Fe_{50}Co_{50})_{50}$[0.5nm] prepared by sputtering | 14 | 0.23 |
| $Zn_{50}(Fe_{50}Co_{50})_{50}$[1nm] prepared by sputtering | 15.4 | 0.26 |
| $Zn_{50}(Fe_{50}Co_{50})_{50}$[2nm] prepared by sputtering | 16.5 | 0.27 |
| $Zn_{50}(Fe_{50}Co_{50})_{50}$[4nm] prepared by sputtering | 15 | 0.23 |
| Zn[0.05nm]/$Fe_{50}Co_{50}$[0.05nm] prepared by sputtering | 11.8 | 0.24 |
| Zn[0.125nm]/$Fe_{50}Co_{50}$[0.125nm] prepared by sputtering | 14 | 0.23 |
| (Zn[0.125nm]/$Fe_{50}Co_{50}$[0.125nm]) × 8 prepared by sputtering | 14.3 | 0.26 |
| (Zn[0.125nm]/$Fe_{50}Co_{50}$[0.125nm]) × 8 prepared by sputtering | 16 | 0.24 |
| (Zn[0.125nm]/$Fe_{50}Co_{50}$[0.125nm]) × 8 prepared by sputtering | 17.2 | 0.25 |
| (Zn[0.125nm]/$Fe_{50}Co_{50}$[0.125nm]) × 8 prepared by sputtering | 15.4 | 0.24 |

FIG. 29B

|  | S10(PREPARATION OF OXIDE LAYER 40) |
|---|---|
| REFERENCE EXAMPLE | Fe[1nm]/Zn[0.6nm] prepared by sputtering →ion beam oxidization→reduction (Ar-plasma irradiation) |
| EXAMPLE 10-1 | Fe[1nm]/Zn[0.6nm] prepared by sputtering →ion beam oxidization→reduction (Ar-plasma irradiation) |
| COMPARATIVE EXAMPLE 10-1 | Fe[1nm]/Zn[0.6nm] prepared by sputtering →ion beam oxidization→reduction (Ar-plasma irradiation) |
| COMPARATIVE EXAMPLE 10-2 | Fe[1nm]/Zn[0.6nm] prepared by sputtering →ion beam oxidization→reduction (Ar-plasma irradiation) |

↺ FROM FIG. 30A

| S20(PREPARATION OF METAL LAYER 50) | MR[%] | RA ($\Omega\,\mu m^2$) |
|---|---|---|
| - | 10 | 0.25 |
| $Zn_{80}(Fe_{50}Co_{50})_{20}$[2nm] prepared by sputtering | 16.5 | 0.25 |
| $Cu_{80}(Fe_{50}Co_{50})_{20}$[2nm] prepared by sputtering | 10.1 | 0.23 |
| $Ag_{80}(Fe_{50}Co_{50})_{20}$[2nm] prepared by sputtering | 10.2 | 0.24 |

| | S10(PREPARATION OF OXIDE LAYER 40) |
|---|---|
| REFERENCE EXAMPLE | Fe$_{50}$Co$_{50}$[1nm]/Zn[0.6nm] prepared by sputtering →ion beam oxidization→reduction (Ar-plasma irradiation) |
| COMPARATIVE EXAMPLE 11-1 | Fe$_{50}$Co$_{50}$[1nm]/Zn[0.6nm] prepared by sputtering →ion beam oxidization→reduction (Ar-plasma irradiation) |
| EXAMPLE 11-1 | Fe$_{50}$Co$_{50}$[1nm]/Zn[0.6nm] prepared by sputtering →ion beam oxidization→reduction (Ar-plasma irradiation) |
| EXAMPLE 11-2 | Fe$_{50}$Co$_{50}$[1nm]/Zn[0.6nm] prepared by sputtering →ion beam oxidization→reduction (Ar-plasma irradiation) |
| EXAMPLE 11-3 | Fe$_{50}$Co$_{50}$[1nm]/Zn[0.6nm] prepared by sputtering →ion beam oxidization→reduction (Ar-plasma irradiation) |
| EXAMPLE 11-4 | Fe$_{50}$Co$_{50}$[1nm]/Zn[0.6nm] prepared by sputtering →ion beam oxidization→reduction (Ar-plasma irradiation) |
| EXAMPLE 11-5 | Fe$_{50}$Co$_{50}$[1nm]/Zn[0.6nm] prepared by sputtering →ion beam oxidization→reduction (Ar-plasma irradiation) |
| EXAMPLE 11-6 | Fe$_{50}$Co$_{50}$[1nm]/Zn[0.6nm] prepared by sputtering →ion beam oxidization→reduction (Ar-plasma irradiation) |
| EXAMPLE 11-7 | Fe$_{50}$Co$_{50}$[1nm]/Zn[0.6nm] prepared by sputtering →ion beam oxidization→reduction (Ar-plasma irradiation) |
| EXAMPLE 11-8 | Fe$_{50}$Co$_{50}$[1nm]/Zn[0.6nm] prepared by sputtering →ion beam oxidization→reduction (Ar-plasma irradiation) |
| EXAMPLE 11-9 | Fe$_{50}$Co$_{50}$[1nm]/Zn[0.6nm] prepared by sputtering →ion beam oxidization→reduction (Ar-plasma irradiation) |
| EXAMPLE 11-10 | Fe$_{50}$Co$_{50}$[1nm]/Zn[0.6nm] prepared by sputtering →ion beam oxidization→reduction (Ar-plasma irradiation) |
| COMPARATIVE EXAMPLE 1-2 | Fe$_{50}$Co$_{50}$[1nm]/Zn[0.6nm] prepared by sputtering →ion beam oxidization→reduction (Ar-plasma irradiation) |

FIG. 31A

◇ FROM FIG. 31A

| S20(PREPARATION OF METAL LAYER 50) | MR[%] | RA [Ω μm²] |
|---|---|---|
| - | 9.7 | 0.25 |
| $Fe_{50}Co_{50}$[2nm] prepared by sputtering | 9.9 | 0.25 |
| $Zn_5(Fe_{50}Co_{50})_{95}$[2nm] prepared by sputtering | 13 | 0.28 |
| $Zn_{10}(Fe_{50}Co_{50})_{90}$[2nm] prepared by sputtering | 15.5 | 0.25 |
| $Zn_{25}(Fe_{50}Co_{50})_{75}$[2nm] prepared by sputtering | 15.8 | 0.24 |
| $Zn_{50}(Fe_{50}Co_{50})_{50}$[2nm] prepared by sputtering | 16 | 0.26 |
| $Zn_{75}(Fe_{50}Co_{50})_{25}$[2nm] prepared by sputtering | 13.5 | 0.25 |
| (Zn[0.0125nm]/$Fe_{50}Co_{50}$[0.2375nm]) × 8 prepared by sputtering | 14 | 0.28 |
| (Zn[0.025nm]/$Fe_{50}Co_{50}$[0.225nm]) × 8 prepared by sputtering | 16.5 | 0.24 |
| (Zn[0.0635nm]/$Fe_{50}Co_{50}$[0.1865nm]) × 8 prepared by sputtering | 16.8 | 0.25 |
| (Zn[0.125nm]/$Fe_{50}Co_{50}$[0.125nm]) × 8 prepared by sputtering | 17 | 0.24 |
| (Zn[0.1865nm]/$Fe_{50}Co_{50}$[0.0635nm]) × 8 prepared by sputtering | 13.5 | 0.25 |
| Zn[2nm] prepared by sputtering | 7.9 | 0.25 |

FIG. 31B

| | S10(PREPARATION OF OXIDE LAYER 40) TO FIG. 32B |
|---|---|
| REFERENCE EXAMPLE 12-1 | Fe(1nm)/Zn(0.6nm) prepared by sputtering →ion beam oxidization→reduction (Ar-plasma irradiation) |
| REFERENCE EXAMPLE 12-2 | Fe(1nm)/Zn(0.6nm) prepared by sputtering →ion beam oxidization |
| REFERENCE EXAMPLE 12-3 | $Fe_{50}Co_{50}$(1nm)/Zn(0.6nm) prepared by sputtering →ion beam oxidization→reduction (Ar-plasma irradiation) |
| REFERENCE EXAMPLE 12-4 | $Fe_{50}Co_{50}$(1nm)/Zn(0.6nm) prepared by sputtering →ion beam oxidization |
| EXAMPLE 12-1 | Fe(1nm)/Zn(0.6nm) prepared by sputtering →ion beam oxidization→reduction (Ar-plasma irradiation) |
| EXAMPLE 12-2 | Fe(1nm)/Zn(0.6nm) prepared by sputtering →ion beam oxidization |
| EXAMPLE 12-3 | $Fe_{50}Co_{50}$(1nm)/Zn(0.6nm) prepared by sputtering →ion beam oxidization→reduction (Ar-plasma irradiation) |
| EXAMPLE 12-4 | $Fe_{50}Co_{50}$(1nm)/Zn(0.6nm) prepared by sputtering →ion beam oxidization |

FIG. 32A

⇧ FROM FIG. 32A

| S20(PREPARATION OF METAL LAYER 50) | MR[%] | RA ($\Omega \mu m^2$) |
|---|---|---|
| - | 10 | 0.25 |
| - | 6.5 | 0.28 |
| - | 9.7 | 0.25 |
| - | 5.7 | 0.31 |
| $Zn_{50}(Fe_{50}Co_{50})_{50}$[2nm] prepared by sputtering | 16.5 | 0.25 |
| $Zn_{50}(Fe_{50}Co_{50})_{50}$[2nm] prepared by sputtering | 12.2 | 0.28 |
| $Zn_{50}(Fe_{50}Co_{50})_{50}$[2nm] prepared by sputtering | 16 | 0.26 |
| $Zn_{50}(Fe_{50}Co_{50})_{50}$[2nm] prepared by sputtering | 12 | 0.29 |

FIG. 32B

MAGNETORESISTIVE ELEMENT, MAGNETIC HEAD ASSEMBLY, MAGNETIC RECORDING/REPRODUCING APPARATUS, MEMORY CELL ARRAY, AND MANUFACTURING METHOD OF MAGNETORESISTIVE ELEMENT

CROSS REFERENCE TO RELATED APPLICATION

This application is based upon and claims the benefit of priority from the prior Japanese Patent Application No. 2011-040362, filed on Feb. 25, 2011, the entire contents of which are incorporated herein by reference.

FIELD

Embodiments relate basically to a magnetoresistive element, a magnetic head assembly, a magnetic recording/reproducing apparatus, a memory cell array, and a manufacturing method of the magnetoresistive element.

BACKGROUND

A magnetoresistive element (magnetoresistive effect element) has a spacer layer between two magnetic layers. A magnetoresistive effect is generated by a change in a relative angle between magnetization directions of the two magnetic layers. Examples of the magnetoresistive element include a tunnel magneto-resistance effect element (TMR: Tunneling Magneto Resistance) having an insulating spacer layer and a CPP-GMR element (Current Perpendicular to plane-Giant Magneto Resistance).

BRIEF DESCRIPTION OF DRAWINGS

Aspects of this disclosure will become apparent upon reading the following detailed description and upon reference to accompanying drawings.

FIGS. 3A and 3B are views showing a function of a metal layer.

FIG. 20 is a table showing manufacturing conditions, MR (%) and RA ($\Omega\mu m^2$) of magnetoresistive elements.

FIG. 22 is a table showing manufacturing conditions, MR (%) and RA ($\Omega\mu m^2$) of magnetoresistive elements.

FIG. 23 is a table showing manufacturing conditions, MR (%) and RA ($\Omega\mu m^2$) of magnetoresistive elements.

FIG. 24 is a table showing manufacturing conditions, MR (%) and RA ($\Omega\mu m^2$) of magnetoresistive elements.

FIG. 25 is a table showing manufacturing conditions, MR (%) and RA ($\Omega\mu m^2$) of magnetoresistive elements.

FIG. 26 is a table showing manufacturing conditions, MR (%) and RA ($\Omega\mu m^2$) of magnetoresistive elements.

FIG. 27 is a table showing manufacturing conditions, MR (%) and RA ($\Omega\mu m^2$) of magnetoresistive elements.

FIG. 28 is a table showing manufacturing conditions, MR (%) and RA ($\Omega\mu m^2$) of magnetoresistive elements.

FIG. 29 is a table showing manufacturing conditions, MR (%) and RA ($\Omega\mu m^2$) of magnetoresistive elements.

FIG. 30 is a table showing manufacturing conditions, MR (%) and RA ($\Omega\mu m^2$) of magnetoresistive elements.

FIG. 31 is a table showing manufacturing conditions, MR (%) and RA ($\Omega\mu m^2$) of magnetoresistive elements.

FIG. 32 is a table showing manufacturing conditions, MR (%) and RA ($\Omega\mu m^2$) of magnetoresistive elements.

DESCRIPTION

Figure 1:
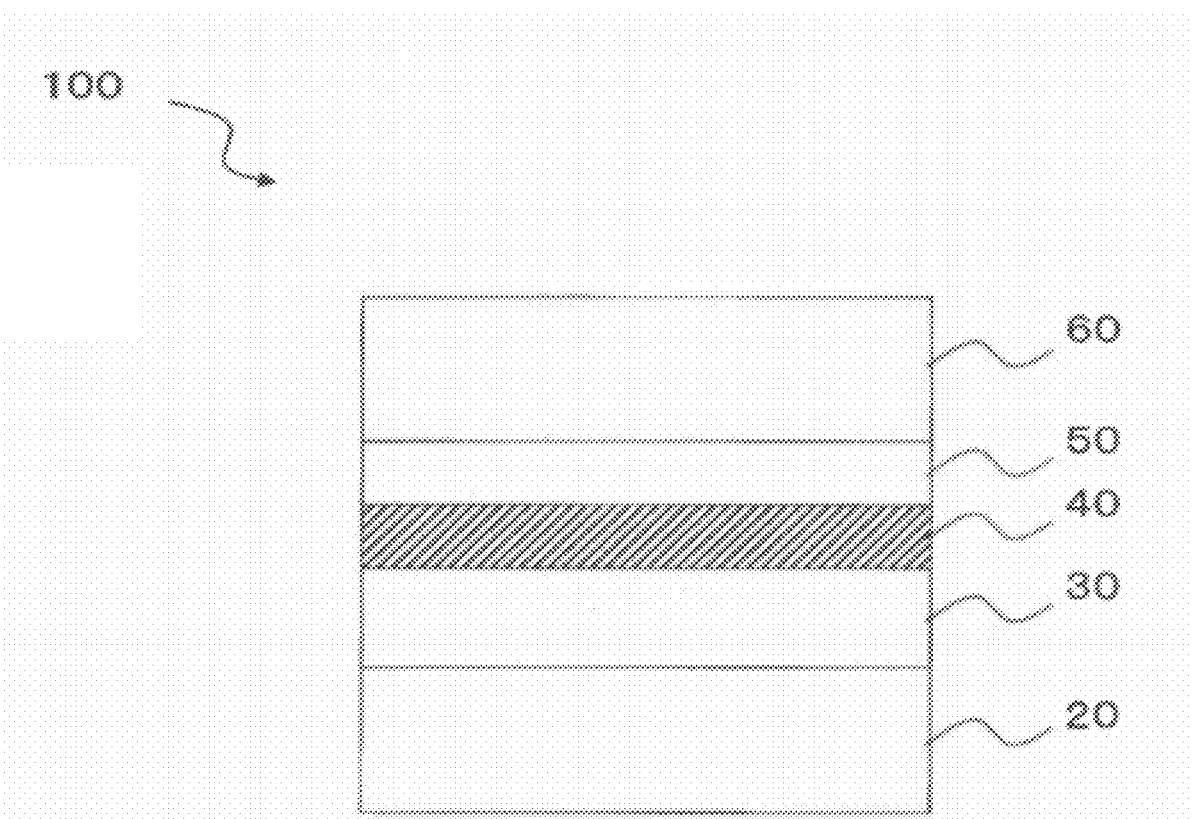
FIG. 1 is a view showing a magnetoresistive element in accordance with a first embodiment.

As will be described below, in accordance with an embodiment, a magnetoresistive element includes a first electrode, a second electrode, a first magnetic layer, a second magnetic layer, a spacer layer, an oxide layer, and a metal layer. The first magnetic layer is provided between the first electrode and the second electrode, and has first magnetization whose direction is fixed or variable to an external magnetic field. The second magnetic layer is provided between the first magnetic layer and the second magnetic layer, and has second magnetization whose direction is variable to the external magnetic field. The spacer layer is provided between the first magnetic layer and the second magnetic layer. The oxide layer is provided between the first electrode and the first magnetic layer, or within the first magnetic layer, or between the first magnetic layer and the spacer layer, or within the spacer layer, or between the spacer layer and the second magnetic layer, or within the second magnetic layer, or between the second magnetic layer and the second electrode. The oxide layer includes at least one element selected from the group consisting of Zn, In, Sn, and Cd, and at least one element selected from the group consisting of Fe, Co, and Ni. The metal layer is provided in a direction and in contact with the oxide layer. The direction is substantially perpendicular to both the first layer and the second layer. The metal layer includes at least one element selected from the group consisting of Zn, In, Sn, and Cd by not less than 5 at % and not more than 80 at %. The metal layer also includes at least one element selected from the group consisting of Fe, Co, and Ni.

Embodiments will be described below with reference to drawings. Wherever possible, the same reference numerals or marks will be used to denote the same or like portions throughout figures. The drawings are conceptual. Therefore, a relationship between a thickness and width of each portion and a proportionality factor among the respective portions are not necessarily the same as an actual thing. Even when the same portions are drawn, their sizes or proportionality factors may be drawn differently from each other with respect to the drawings.

First Embodiment

FIG. 1 is a view showing a magnetoresistive element 100. The magnetoresistive element 100 is provided with a first magnetic layer 20, a spacer layer 30, an oxide layer 40, a metal layer 50, and a second magnetic layer 60. The oxide layer 40 and the metal layer 50 are in contact with each other. The magnetoresistive element 100 passes a current from the first magnetic layer 20 toward the second magnetic layer 60, or from the second magnetic layer 60 toward the first magnetic layer 20.

The first magnetic layer 20 is ferromagnetic. Magnetization of the first magnetic layer 20 is substantially fixed and the magnetization direction thereof can vary in response to an external magnetic field. The second magnetic layer 60 is ferromagnetic. A magnetization direction of the second magnetic layer 60 changes in response to an external magnetic field.

Ferromagnetic metals containing Co, Fe, and Ni can be employed for the first magnetic layer 20 and the second magnetic layer 60. The ferromagnetic metals include $Fe_{50}Co_{50}$ [3 nm] and a double-layer of $Co_{90}Fe_{10}$ [1 nm]/ $Ni_{83}Fe_{17}$ [3.5 nm]. The double-layer is formed so that the CoFe layer is disposed on the side of the spacer layer 30. Here, a symbol '/' denotes a sequential lamination of two layers from a layer of the substance written on the left side of the symbol. For example, Au/Cu/Ru shows that a Cu layer is laminated on an Au layer and a Ru layer is further successively laminated on the Cu layer. Moreover, '×2' denotes that the same multilayers are double laminated. For example, (Au/Cu)×2 shows the following serial lamination steps:
A first Cu layer is laminated on a first Au layer;
A second Au layer is laminated on the first Cu; and
A second Cu layer is laminated on the second Au layer.
Moreover, '[ ]' denotes a film thickness of the substance.

A material to be employed for the first magnetic layer 20 depends on whether the first magnetic layer 20 is a magnetization fixed layer or a magnetization free layer. The magnetization of the magnetization fixed layer is fixed in a direction. A magnetization direction of the magnetization free layer varies in response to an external magnetic field.

When the first magnetic layer 20 is the magnetization fixed layer, $Fe_{50}Co_{50}$ can be employed therefor. $Fe_{50}Co_{50}$ is a magnetic material having a bcc structure. This material has a large effect of spin-dependent interfacial scattering to enable it to acquire a high MR change rate. Examples of the FeCo-series alloy having a bcc structure include $Fe_xCo_{100-x}$ (x=30 to 100) and $Fe_xCo_{100-x}$ with some elements added. Among the examples, $Fe_xCO_y$ (x=40 to 80, y=20 to 60) has well-balanced properties and is easy to use. When the first magnetic layer 20 is made from a magnetic layer having a bcc structure suitable to generate a high MR change rate, the entire film thickness of the first magnetic layer 20 is preferably 1.5 nm or more. The thickness of 1.5 nm or more is necessary to stably maintain a bcc structure.

Most of the metallic materials for a spin-valve film are fcc (face-centered cubic) or fct (face-centered tetragonal) in structure. Therefore, only the first magnetic layer 20 can have a bcc structure. For this reason, if the first magnetic layer 20 is too thin, it is difficult for the first magnetic layer 20 to stably maintain the bcc structure, thereby making it impossible to acquire a high MR change rate.

Moreover, a $(Co_xFe_{100-x})_{100-y}B_y$ alloy (x=0 to 100, y=0 to 30) can also be employed as a material of the first magnetic layer 20. Employing an amorphous alloy such as $(Co_xFe_{100-x})_{100-y}B_y$ therefor allows it to reduce variations in characteristics of a smaller-size MR element. The variations are caused by crystalline grains of the first magnetic layer 20, which are specific to such a smaller size element.

Employing such an amorphous alloy also allows it to smooth the first magnetic layer 20 and the spacer layer 30 to be further formed thereon.

Smoothing the spacer layer 30 reduces frequency of a defect thereof. As a result, the smoothing of the spacer layer 30 allows it to acquire a high MR change rate with a low areal resistance. When an MgO layer is formed for the spacer layer 30 on such an amorphous alloy $(Co_xFe_{100-x})_{100-y}B_y$, the amorphous alloy enhances a (100) orientation of the MgO layer. The (100) orientation of the MgO layer can provide a high MR change rate. In addition, annealing crystallizes the amorphous alloy $(Co_xFe_{100-x})_{100-y}B_y$ on a (100) crystalline plane of MgO as a template so that the crystalline $(Co_xFe_{100-x})_{100-y}B_y$ has crystallographical matching with the (100) plane of MgO. The thicker the first magnetic layer 20 is, the higher the MR change rate is. Despite, it is preferable to make the first magnetic layer 20 thinner in order to acquire a higher pinning magnetic field. For example, the first magnetic layer 20 is preferably not less than 1.5 nm in order to stabilize a bcc structure of an FeCo alloy layer to be employed. Moreover, the first magnetic layer 20 is preferably not less than 1.5 nm in order also to employ an FeCo alloy layer having an fcc structure. On the other hand, in order to acquire a high pinning magnetic field, the thickness of the first magnetic layer 20 is 5 nm or less at most. As mentioned above, the film thickness of the first magnetic layer 20 is not less than 1.5 nm and not more than 5 nm. Instead of a magnetic material having a bcc structure, a $Co_{90}Fe_{10}$ alloy having an fcc structure, Co, and a Co alloy both having an hcp structure are employed for the first magnetic layer 20. The $Co_{90}Fe_{10}$ alloy is widely used for conventional magnetoresistive elements. For the first magnetic layer 20, the alloy containing simple metals, such as Co, Fe, or Ni, or an alloy containing at least one of these elements can be employed. An FeCo alloy with a bcc structure, a Co alloy having a Co composition of 50 at % or more, and a Ni alloy having a Ni composition of 50 at % or more are advantageous for a high MR change rate as the first magnetic layer 20. The denotation of at %, i.e., atomic percent will be referred simply to % below. Alternatively, Heusler magnetic alloys, such as $Co_2MnGe$, $Co_2MnSi$, and $Co_2MnAl$, $Co_2FeSi$, $Co_2FeAl$, $Co_2FeGe$ may be employed for the first magnetic layer 20. When the first magnetic layer 20 is a magnetization free layer, a double-layer $Ni_{83}Fe_{17}$ [3.5 nm]/$Co_{90}Fe_{10}$ [1 nm] is formed to be employed so that the CoFe layer is disposed on the side of the spacer layer 30. Alternatively, $Fe_xCo_{100-x}$ (x=10 to 100) may be employed for the CoFe layer on the side of the spacer layer 30. Moreover, the CoFe layer may be a triple-layer of CoFe/NiFe/CoFe. Alternatively, when using no NiFe layer, a $Co_{90}Fe_{10}$ [4 nm] monolayer may be employed. The $Co_{90}Fe_{10}$ alloy stably has soft magnetic properties. The film thickness of the CoFe alloy is set to not less than 0.5 nm and not more than 4 nm. In addition, $Fe_xCo_{100-x}$ (x=10 to 100) may also be employed. Alternatively, a multilayer with CoFe layers and ultra-thin Cu layers laminated plurally alternately, or a multilayer with Fe layers and ultra-thin Cu layers laminated plurally alternately may be employed for the first magnetic layer 20. The film thicknesses of the CoFe layers are not less than 1 nm and not more than 2 nm. The film thicknesses of the Cu layers are not less than 0.1 nm and not more than 0.8 nm. Alternatively, an amorphous layer, e.g., a CoZrNb layer may be employed as a portion of the first magnetic layer 20. As a structure of the first magnetic layer 20, the following configuration is employed when viewing the first magnetic layer 20 from the spacer layer 30. That is, the structures include (1) crystalline single-layer, (2) lamination of crystalline layer/amorphous layer, and (3) lamination of crystalline layer/amorphous layer/crystalline layer. In all the cases (1) to (3), a crystalline layer is in contact with both the spacer layer 30 and the first magnetic layer 20. Alternatively, Heusler magnetic alloy layers, such as $Co_2MnGe$, $Co_2MnSi$, and $Co_2MnAl$ layers, may be employed for the first magnetic layer 20.

A material for the second magnetic layer 60 whose magnetization direction is variable in response to an external magnetic field may be the same as the material for the first magnetic layer 20 to serve as a magnetization free layer.

Figure 2:
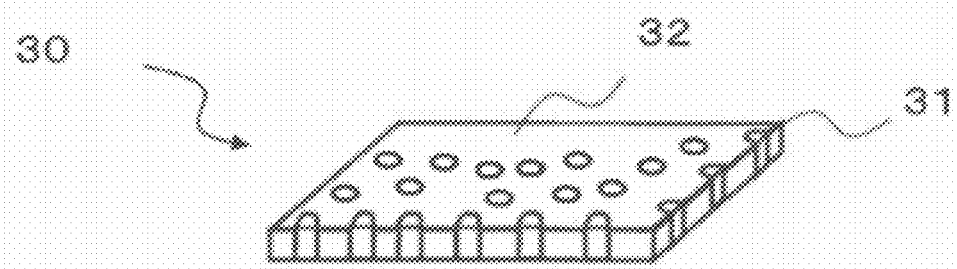
FIG. 2 is a view showing an example of a current constriction layer.

Examples of the spacer layer 30 include a metal, an insulator or an insulating layer 32 including current paths 31. The insulating layer 32 including current paths 31 is referred to as a current constriction layer. FIG. 2 is a view showing an example of the current constriction layer which is an insulating layer 32 including current paths 31.

Metals to be employed for the spacer layer 30 include Au, Ag, Cu, and Zn. Alternatively, Ru, Rh, Re, Ir, and Os may be employed for the spacer layer 30. Oxides containing at least one element selected from the group consisting of Mg, Al, Ti, Zr, Hf, or Zn can be employed for the insulator. Specifically, MgO is employed therefor. MgO provides a coherent spin-dependent tunneling phenomenon to allow it to acquire a high MR change rate.

Materials of the insulating layer 32 include an oxide, a nitride, and an oxynitride. The specific examples of the insulating layer 32 include $Al_2O_3$ and $Al_2O_3$ with some additives. A 2 nm-thick $Al_2O_3$ layer can be employed, for example. The additives include Ti, Hf, Mg, Zr, V, Mo, Si, Cr, Nb, Ta, W, B, C, and Zn. The amounts of the additives suitably range from 0% to 50%. Mg oxides, Zn oxides, Ti oxides, Hf oxides, Mn oxides, Zr oxides, Cr oxides, Ta oxides, Nb oxides, Mo oxides, Si oxides, V oxides, etc. can be employed for the insulating layer 32 instead of employing Al oxides such as $Al_2O_3$. The above-mentioned additives can be added to these oxides. The amounts of the additives suitably range from 0% to 50%. Alternatively, nitrides and oxynitrides based on Al, Si, Hf, Ti, Mg, Zr, V, Mo, Nb, Ta, W, B, and C may be employed for the insulating layer 32 instead of employing oxides.

The current path 31 is to pass a current through the current constriction layer 32 in a direction perpendicular thereto and to constrict the current. At least one element selected from the group consisting of Cu, Au, Ag, Ni, Co, and Fe is employed for the current path 31. Alloys including these elements are also employed therefor. The alloys include CuNi, CuCo, CuFe. The current path 31 is crystalline and contains less than half as much oxygen or nitrogen as the insulating layer 32. The current path 31 has a lower resistance than the insulating layer 32 to easily serve as a current path.

The thickness of the spacer layer 30 is not less than 0.5 nm and not more than 5 nm.

The oxide layer 40 can control up-spin electrons or down-spin electrons passing therethrough. Such an effect is referred to as a spin filter effect. The oxide layer 40 contains at least one element selected from the group consisting of Zn, In, Sn and at least one element selected from the group consisting of Cd and Fe, Co, and Ni. These substances are master metals of the oxide layer 40. Specifically, a mixed oxide of $Fe_{50}Co_{50}$ and Zn can be employed for the oxide layer 40. Oxides of Zn, In, Sn, or Cd have a wide gap of 3 eV or more. Specifically, the oxides having such a wide gap include ZnO, $In_2O_3$, $SnO_2$, ZnO, CdO, $CdIn_2O_4$, $Cd_2SnO_4$, and $Zn_2SnO_4$. Reduction of these oxides makes the chemical compositions thereof deviate from stoichiometric compositions thereof, thereby forming donor levels due to intrinsic defects such as oxygen vacancies. For this reason, the density of conduction electrons is not less than $10^{18}$ cm$^{-3}$ and not more than $10^{19}$ cm$^{-3}$. In this condition, a valence band of the oxide is formed mainly of 2p-orbitals of oxygen atoms, and a conduction band is formed mainly of s-orbits of metal atoms. When carrier density increases up to more than $10^{12}$ cm$^{-3}$, a Fermi level reaches the conduction band to degenerate. Such a condition is referred to as n-type degeneration in which high-density conduction electrons with high mobility are induced in the oxide layer 40, thereby providing the oxide layer 40 with a low resistance. However, the oxide layer 40 is not given ferromagnetism only with the oxide of the above-mentioned Zn, In, Sn, or Cd. Co, Fe, and Ni are ferromagnetic at room temperature. For this reason, the oxide layer 40 will have a high spin-dependent scattering effect. Therefore, the oxide layer 40 has low resistivity in addition to the high spin-dependent scattering effect. Accordingly, the magnetoresistive element 100 has a high MR change rate. Zn belongs to the same period as that of Fe, Co and Ni in a periodic table, and has, therefore, a tendency to be given ferromagnetism. For this reason, the magnetization of the oxide layer 40 can be stabilized.

Alternatively, some additives may be added to the oxide layer 40 including an oxide containing Zn. When Al is added to a Zn oxide as one of the additives, a heat resistance of the Zn oxide is reported to increase. In addition to Zn, the additives include B, Ga, In, C, Si, Ge, and Sn. A mechanism to increase a heat resistance has not yet been clarified completely. However, the mechanism is considered as follows. The Zn oxide is slightly reduced to create oxygen vacancies therein. The oxygen vacancies decrease as a result of thermal reoxidation thereof due to the Al addition. The decrease in the oxygen vacancies changes carrier density to enhance the heat resistance of the Zn oxide. The above-described elements are dopants of III group or IV group, and enhance the thermal reoxidation of Zn atoms. It is expected that the thermal reoxidation controls a variation in the carrier density or a resistivity change with heat.

The film thickness of the oxide layer 40 is set to 0.5 nm or more in order to acquire the spin filter effect. In order to acquire the oxide layer 40 having a homogeneous film thickness, the film thickness thereof is set to 1 nm or more, provided that the thickness homogeneity depends on manufacturing equipment to be used. On the other hand, the upper limit of the film thickness is 10 nm or less, provided that a read-gap of a reproducing head is to be narrow.

The metal layer 50 contains at least one element selected from the group consisting of Zn, In, Sn and Cd by 5% to 80%, and at least one element selected from the group consisting of Fe, Co and Ni. Alternatively, the metal layer 50 may be a double-layer including a first layer and a second layer. The first layer contains at least one element selected from the group consisting of Zn, In, Sn and Cd. The second layer contains at least one element selected from the group consisting of Fe, Co and Ni. Specifically, a 2 nm-thick $Zn_{50}(Fe_{50}Co_{50})_{50}$ can be employed. A multilayer $Zn[0.25 nm]/Fe_{50}Co_{50}[0.25 nm])\times 4$ may be employed as well. FIGS. 3A and 3B are views showing a function of the metal layer 50. When the oxide layer 40 is heated without the metal layer 50, oxygen atoms diffuse from the oxide layer 40 to the second magnetic layer 60 adjacent thereto, thereby oxidizing the second magnetic layer 60. For this reason, a magnetoresistive element deteriorates easily without the metal layer 50. Here, "heat" means annealing to be employed in a manufacturing process, annealing to fix magnetization of a magnetic layer, and Joule heat to be caused by passing a current through a magnetoresistive element.

When the metal layer 50 is arranged to be in contact with the oxide layer 40, the oxide layer 40 causes oxygen in the oxide layer 40 to oxidize the metal layer 50 by heating (FIG. 3B). The metal layer 50 shares substances in common with the oxide layer 40. This contributes to preservation of the function of the oxide layer 40 and allows it to prevent the magnetoresistive element 100 from oxidation. Moreover, the metal layer 50 shares master metals in common with the oxide layer 40 and is, therefore, provided with a high spin-dependent scattering effect. For this reason, even if the metal layer 50 is left, the metal layer 50 has no detrimental influence on the magnetoresistive element 100. As mentioned above, the effect of the metal layer 50 has been explained using the second magnetic layer 60 as an example. The same effect can be acquired not only for the second magnetic layer 60 but also for electrodes and the spacer layer 30. The metal layer 50 allows it to prevent the electrodes from oxidation. The spacer layer can be a metal, an insulator, or an oxide layer including current paths. The metal layer 50 allows it to prevent a metallic spacer layer from oxidation. When the spacer layer 30 is an insulator, the metal layer 50 also allows it to prevent the insulator from excessive oxidation. When the spacer layer 30 is the insulating layer including the current paths, the metal layer 50 allows it to prevent the current paths from oxidation.

When the metal layer 50 is too thin to perfectly absorb excessive oxygen from the oxide layer 40, the metal layer 50 results in the oxidation of a layer formed thereon to form a low spin-filter layer, i.e., a layer having a low spin filter effect. For this reason, the film thickness of the metal layer 50 is preferably 0.25 nm or more. Moreover, when the metal layer 50 is too thick, the magnetoresistive element becomes so thick that such a thick element is not desirable for narrowing a gap. For this reason, the film thickness of the metal layer 50 is preferably 4 nm or less.

The magnetoresistive element 100 has been explained as being provided with the spacer layer 30, the oxide layer 40, the metal layer 50, and the second magnetic layer 60, all of which are formed on the first magnetic layer 20. However, the magnetoresistive element 100 may have structures as shown in FIGS. 4 to 9.

Each basic structure shown in FIGS. 4A to 4K has the first magnetic layer 20, the spacer layer 30, and the second magnetic layer 60 in this order from the bottom. Alternatively, the respective structures may be upside-down. That is, the first magnetic layer 20 may be a top layer and the second magnetic layer 60 may be a bottom layer, and vice versa. This is true in FIGS. 5A to 8 in the same way as in FIGS. 4A to 4K.

Figure 4A:
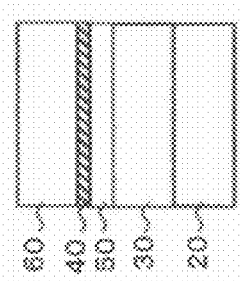
FIGS. 4A to 4K are views showing each basic structure of the magnetoresistive element in accordance with the first embodiment.

FIG. 4A is a view showing a structure in which the oxide layer 40 is provided between the spacer layer 30 and the second magnetic layer 60, and the metal layer 50 is provided between the oxide layer 40 and the spacer layer 30. Such a case prevents the spacer layer 30 from being degraded.

Figure 4B:
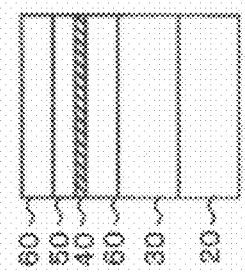
Figure 4C:
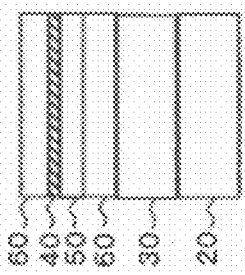

FIGS. 4B and 4C are views showing structures in which the oxide layer 40 is inserted to the second magnetic layer 60, and the metal layer 50 is provided between the oxide layer 40 and the second magnetic layer 60. In FIG. 4B, the oxide layer 40 is provided on the side of the spacer layer 30. In FIG. 4C, the metal layer 50 is provided on the side of the spacer layer 30. In both cases shown in FIGS. 4B and 4C, oxidation takes place on the side of the second magnetic layer 60 which is in contact with the oxide layer 40. In spite of the oxidation, a high MR change rate arises from the side of the second magnetic layer which is in contact with the metal layer 50, thereby leading to the magnetoresistive element 100 having a high MR change rate as a whole.

Figure 4D:
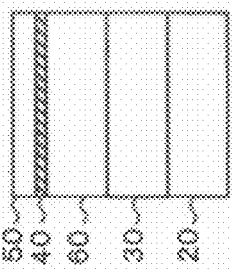
Figure 4E:
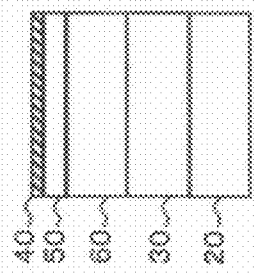

FIG. 4D is a view showing a structure in which the oxide layer 40 and the metal layer 50 are provided on the second magnetic layer 60. FIG. 4E is a view showing a structure in which the metal layer 50 and the oxide layer 40 are provided on the second magnetic layer 60.

Figure 4F:
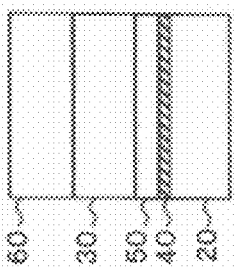
Figure 4G:
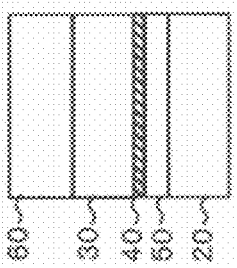

FIG. 4F is a view showing a structure in which the oxide layer 40 is provided between the first magnetic layer 20 and the spacer layer 30, and the metal layer 50 is provided between the oxide layer 40 and the spacer layer 30. FIG. 4G is a view showing a structure in which the oxide layer 40 is provided between the first magnetic layer 20 and the spacer layer 30, and the metal layer 50 is provided between the oxide layer 40 and the first magnetic layer 20.

Figure 4H:
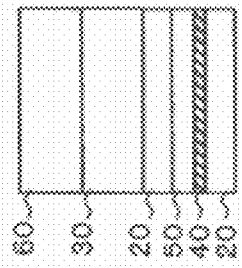
Figure 4I:
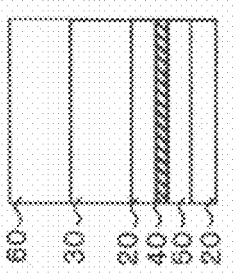

FIGS. 4H and 4I are views showing structures in which the oxide layer 40 is inserted into the first magnetic layer 20, and the metal layer 50 is provided between the oxide layer 40 and the first magnetic layer 20. In FIG. 4H, the metal layer 50 is provided on the side of the spacer layer 30. In FIG. 4I, the oxide layer 40 is provided on the side of the spacer layer 30.

Figure 4J:
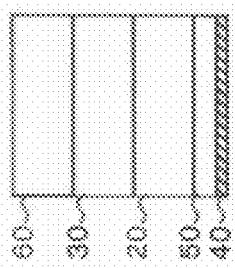
Figure 4K:
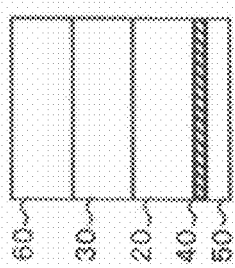

FIG. 4J is a view showing a structure in which the metal layer 50 and the oxide layer 40 are provided under the second magnetic layer 20. FIG. 4K is a view showing a structure in which the oxide layer 40 and the metal layer 50 are provided under the second magnetic layer 20.

FIGS. 5A to 5F are views showing structures in which the oxide layer 40 is sandwiched between the two metal layers 50. Each basic structure shown in FIGS. 5A to 5F has the first magnetic layer 20, the spacer layer 30, and the second magnetic layer 60 in this order from the bottom.

Figure 5A:
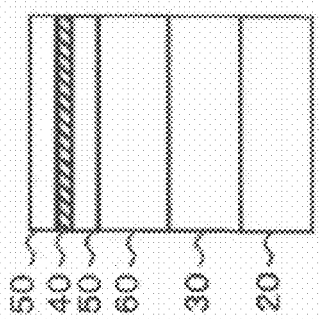
FIGS. 5A to 5F are views showing each basic structure of the magnetoresistive element in accordance with the first embodiment.
Figure 5D:
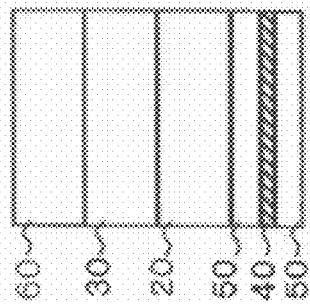
Figure 5B:
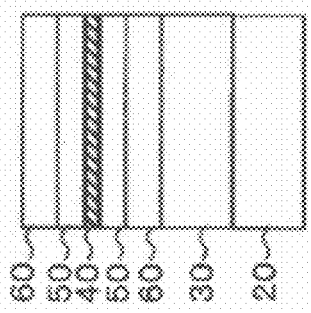
Figure 5E:
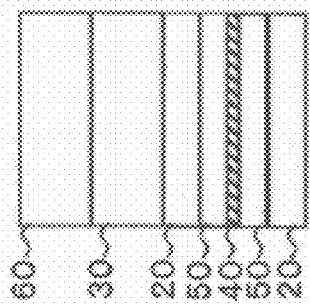
Figure 5C:
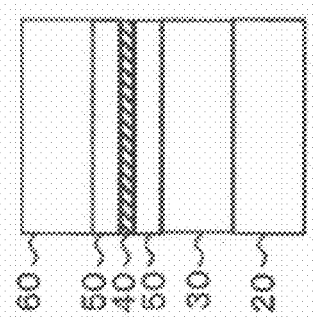
Figure 5F:
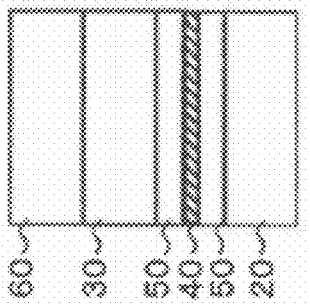

FIG. 5A is a view showing a structure in which the oxide layer 40 is provided between the spacer layer 30 and the second magnetic layer 60. FIG. 5B is a view showing a structure in which the oxide layer 40 sandwiched between the two metal layers 50 is inserted into the second magnetic layer 60. FIG. 5C is a view showing a structure in which the oxide layer 40 sandwiched between the two metal layers 50 is provided on the second magnetic layer 60. FIG. 5D is a view showing a structure in which the oxide layer 40 sandwiched between the two metal layers 50 is provided between the spacer layer 30 and the first magnetic layer 20. FIG. 5E is a view showing a structure in which the oxide layer 40 sandwiched between the two metal layers 50 is inserted into the first magnetic layer 20. FIG. 5F is a view showing a structure in which the oxide layer 40 sandwiched between the two metal layers 50 is provided under the first magnetic layer 20.

Figure 6A:
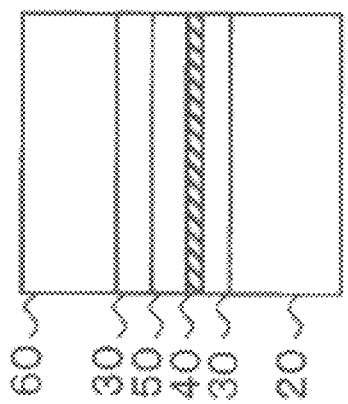
FIGS. 6A to 6C are views showing basic structures including a first magnetic layer, a spacer layer, and a second magnetic layer in the order from the bottom thereof.
Figure 6B:
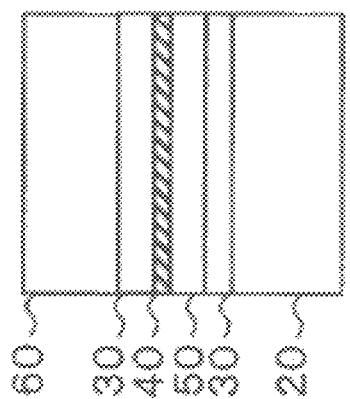
Figure 6C:
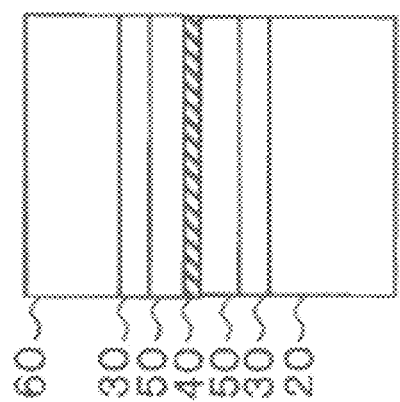

FIGS. 6A to 6C are views showing basic structures, each including the first magnetic layer 20, the spacer layer 30, and the second magnetic layer 60 in this order from the bottom. In FIGS. 6A and 6B, the oxide layer 40 is inserted into the spacer layer 30 so that the metal layer 50 is sandwiched between the oxide layer 40 and the spacer layer 30. In FIG. 6A, the oxide layer 40 is provided on the side of the first magnetic layer 20. In FIG. 6B, the metal layer 50 is provided on the side of the first magnetic layer 20. In FIG. 6C, the oxide layer 40 sandwiched between the two metal layers 50 is inserted into the spacer layer 30. In FIGS. 6A to 6C, all the structures are provided substantially with the two spacer layers 30. Therefore, the two spacer layers 30 have a spin filter effect to enhance a MR change rate of the magnetoresistive element 100.

Figure 7A:
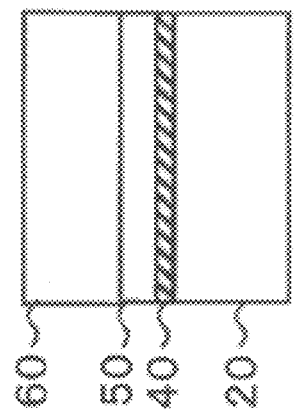
FIG. 7 are views showing structures employing an oxide layer and the metal layer instead of the spacer layer.
Figure 7B:
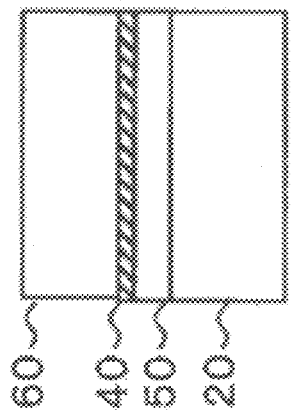
Figure 7C:
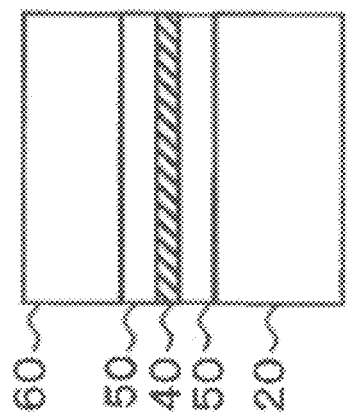

FIGS. 7A to 7C are views showing structures employing the oxide layer 40 and the metal layer 50 instead of the spacer layer 30. In FIG. 7A, the oxide layer 40 is provided between the first magnetic layer 20 and the second magnetic layer 60, and the metal layer 50 is provided between the second magnetic layer 60 and the oxide layer 40. In FIG. 7B, the oxide layer 40 is provided between the first magnetic layer 20 and the second magnetic layer 60, and the metal layer 50 is provided between the first magnetic layer 20 and the oxide layer 40. In FIG. 7C, the oxide layer 40 sandwiched between the two metal layers 50 is further sandwiched between the first magnetic layer 20 and the second magnetic layer 60. In the structures shown in FIGS. 7A to 7C, the spacer layer is not needed, thereby allowing it to miniaturize the magnetoresistive element 100. Here, the oxide layer 40 includes master metals of Fe, Co, and Ni to have relatively high magnetization. When these master metals are employed for the spacer layer 30 as shown in FIG. 7, the spacer layer 30 does not serve as a spacer layer. This is because the first magnetic layer 20 and the second magnetic layer 60 are strongly coupled magnetically with each other. On the other hand, when at least a nonmagnetic element selected from the group consisting of Zn, In, Sn, and Cd is added to the master metals as an additive, the oxide layer 40 with the additive has lower magnetization than the oxide layer 40 without additive, or the oxide layer 40 with the additive becomes nonmagnetic. Accordingly, when the additive is added to the spacer layer 30, the magnetic coupling becomes sufficiently weak between the first magnetic layer 20 and the second magnetic layer 60 so that the spacer layer 30 serves as a spacer layer.

Figure 8:
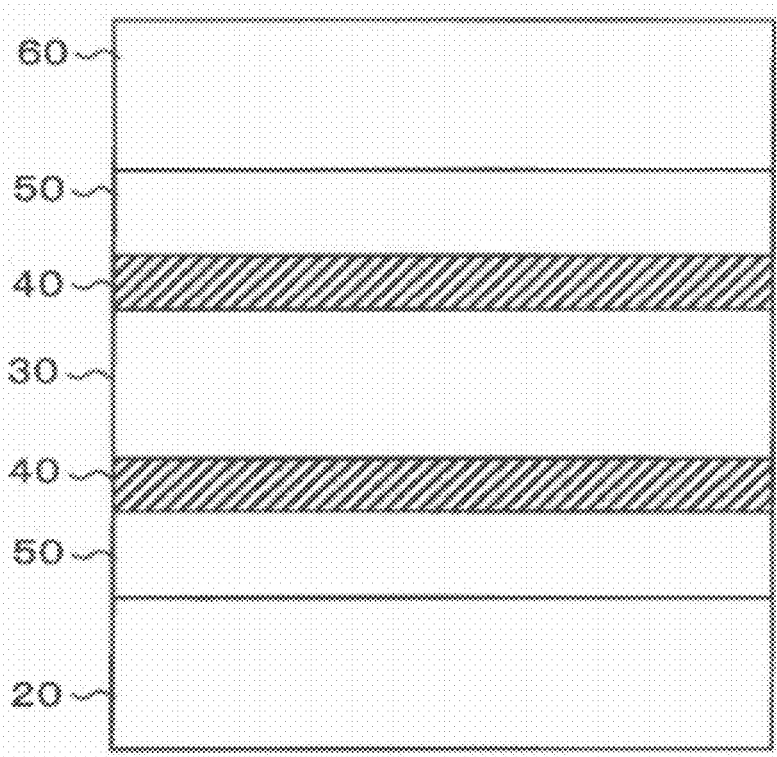
FIG. 8 is a view showing a structure where the oxide layer is provided between the first magnetic layer and the spacer layer, and also between the first magnetic layer and the second magnetic layer.

FIG. 8 is a view showing a structure where the oxide layer 40 is provided between the first magnetic layer 20 and the spacer layer 30, and also between the first magnetic layer 20 and the second magnetic layer 60. In addition, the respective metal layers 50 are provided between the oxide layer 40 and the first magnetic layer 20, and also between the oxide layer 40 and the second magnetic layer 60. Such a structure prevents both the first magnetic layer 20 and the second magnetic layer 60 from being degraded.

Figure 9:
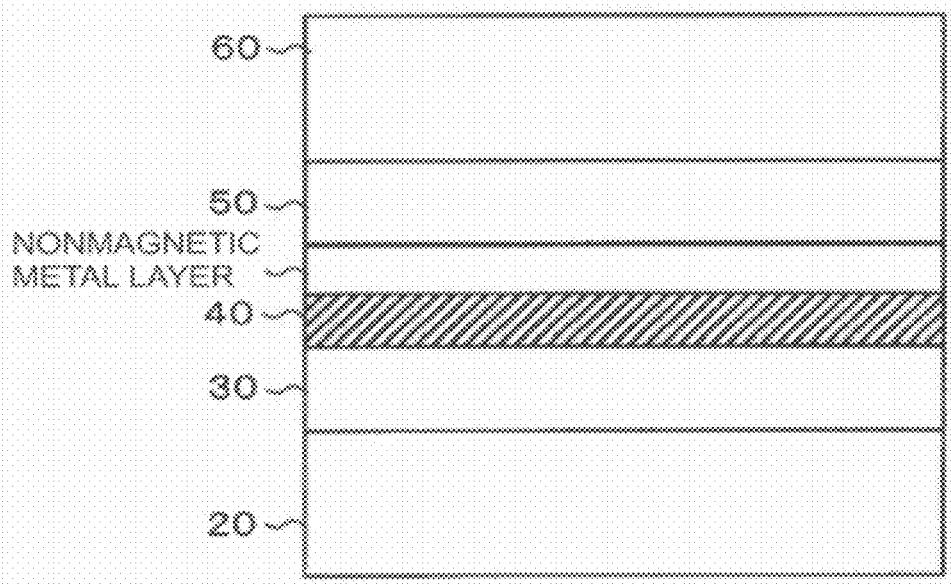
FIG. 9 is a view showing a structure including the oxide layer, the metal layer, and a nonmagnetic metal layer.

FIG. 9 is a view showing a structure including the following layers in the following order below:
the oxide layer 40 is provided between the spacer layer 30 and the second magnetic layer 60;
the metal layer 50 is provided between the oxide layer 40 and the second magnetic layer 60; and
a nonmagnetic metal layer is provided between the metal layer 50 and the oxide layer 40.
Such a structure allows oxygen in the oxide layer 40 to oxidize the metal layer 50 through the nonmagnetic metal layer when the thickness of the nonmagnetic metal layer is not less than 1 nm and not more than 2 nm.

Next, a manufacturing method of the magnetoresistive element 100 will be explained.

Figures 10A, 10B:
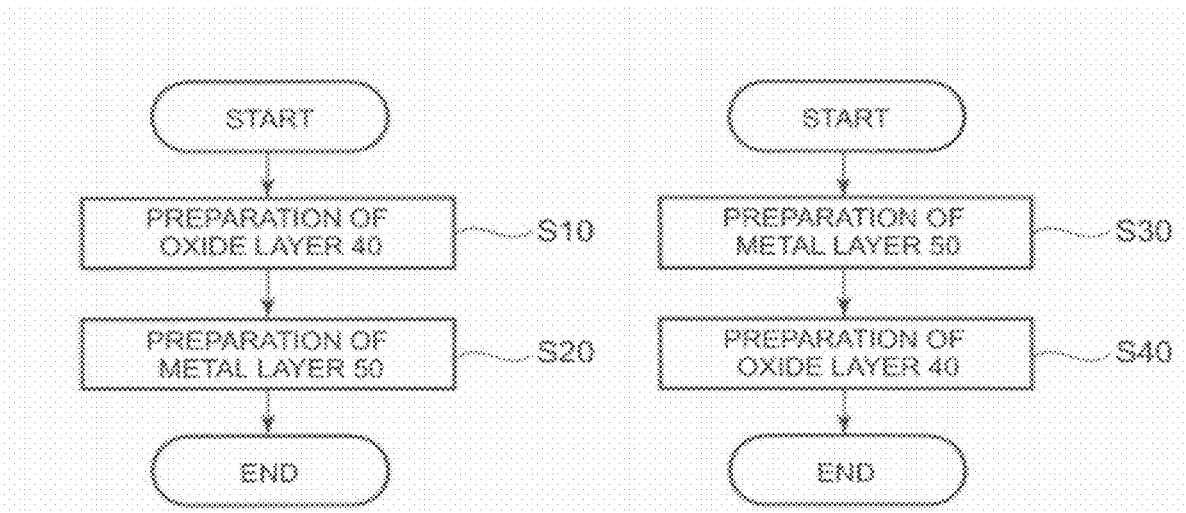
FIGS. 10A to 10C are flow charts to partially show a manufacturing method of the magnetoresistive element in accordance with the first embodiment.
Figure 10C:
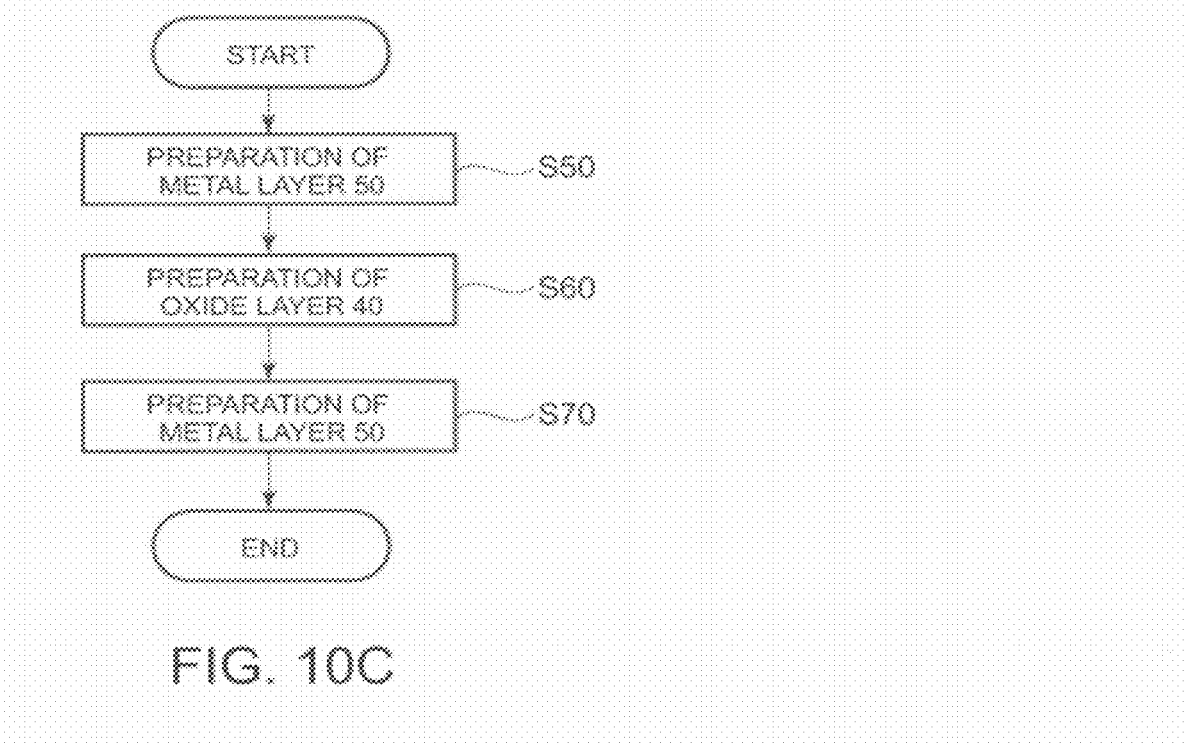

FIGS. 10A to 10C are flow charts to partially show the manufacturing method of the magnetoresistive element 100. Three kinds of the key processes will be explained for the manufacturing method of the magnetoresistive element 100. The first one is a process to form the metal layer 50 after forming the oxide layer 40. The second one is a process to form the oxide layer 40 after forming the metal layer 50. The third is a process to form the metal layer 50, the oxide layer 40, and the metal layer 50 in this order. The manufacturing method includes a sputtering technique, a vapor-deposition technique, a CVD (Chemical Vapor Deposition) technique, and an MBE (Molecular Beam Epitaxy) technique in the processes. The specific examples of the sputtering technique include a DC magnetron sputtering, an RF magnetron sputtering and an ion beam sputtering techniques.

FIG. 10A shows a process flow to form the metal layer 50 (S20) on the oxide layer 40 after forming the oxide layer 40 (S10). Alternatively, the oxidation of the metal layer 50 may be enhanced by heat treatment using oxygen of the oxide layer 40 after forming the metal layer 50. However, the oxygen of the oxide layer 40 can enhance the oxidation of the metal layer 50 even without heat treatment. This arises from the fact that oxygen can react with the metal layer 50 around at room temperature (300K).

FIG. 10B shows a process flow to form the oxide layer 40 on the metal layer 50 (S40) after forming the metal layer 50 (S30). Alternatively, the oxidation of the metal layer 50 may be enhanced by heat treatment with oxygen in the oxide layer 40 after forming the oxide layer 40. The oxygen of the oxide layer 40 can enhance the oxidation of the metal layer 50 even without the heat treatment.

FIG. 10C shows a process flow to form the first metal layer 50 (S50), the oxide layer 40 (S60) on the first metal layer 50, and the second metal layer (S70) on the oxide layer 40. Alternatively, after forming the oxide layer 40 on the first metal layer 50 or after forming the second metal layer 50, heat treatment may be applied to enhance the oxidation of the metal layers 50 with oxygen in the oxide layer 40. However, the oxygen of the oxide layer 40 can enhance the oxidation of the metal layers 50 even without heat treatment.

As oxidation treatment, ion beam oxidization and plasma oxidation can be employed. The ion-beam assist or the plasma assist enables it to form the oxidation layer 40 with the assistance of ion energy or plasma energy for oxidation. Alternatively, reduction treatment such as Ar-plasma irradiation or hydrogen ion irradiation may be applied after forming the oxide layer 40. The reduction treatment allows it to control the oxygen content of the oxide layer 40.

Second Embodiment

Figure 11:
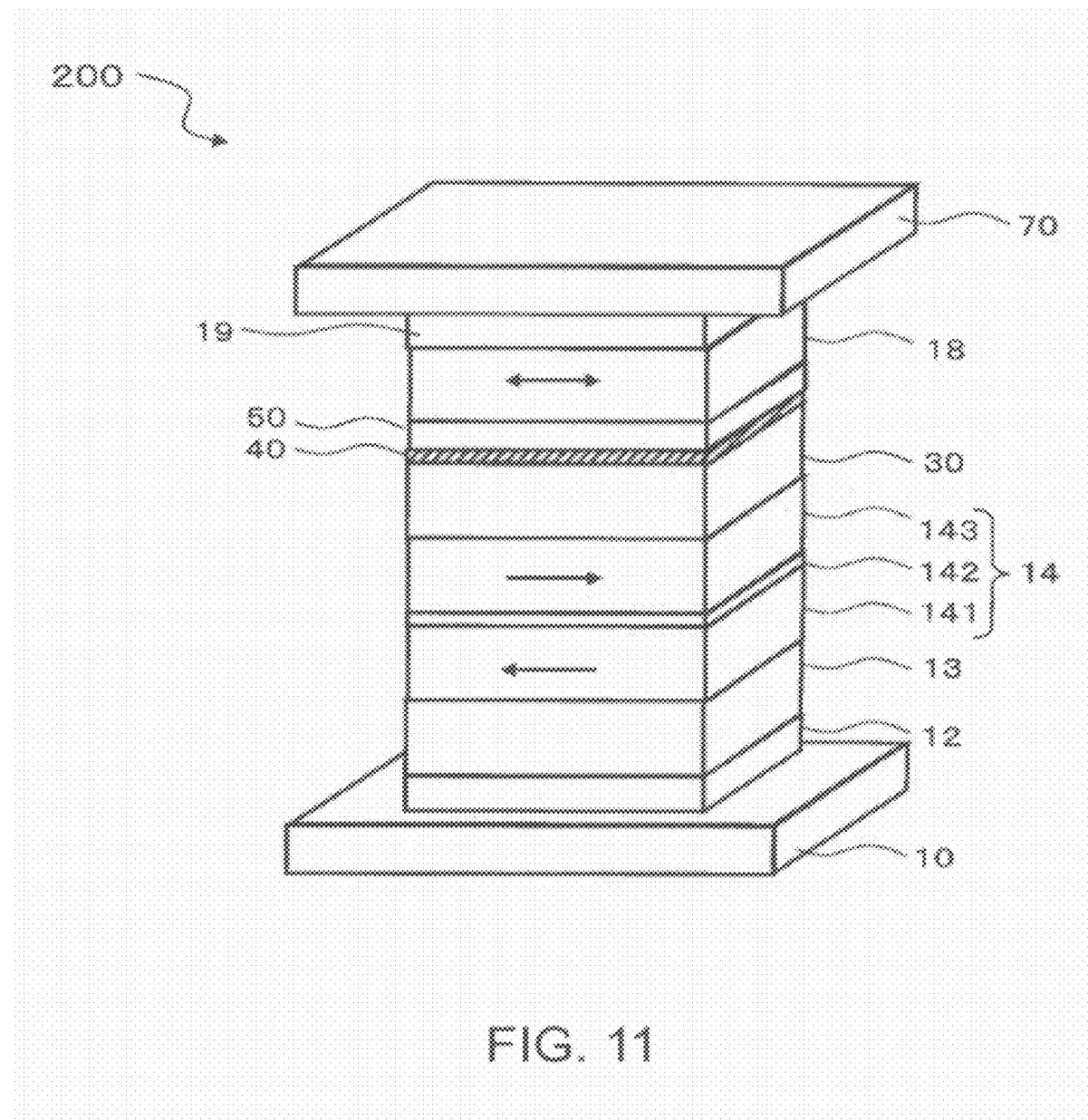
FIG. 11 is a schematic view showing a configuration of a magnetoresistive element in accordance with a second embodiment.

FIG. 11 is a schematic view showing a configuration of a magnetoresistive element 200 in accordance with a second embodiment.

The magnetoresistive element 200 is provided with the following layers:

a cap layer 19 to protect the magnetoresistive element 200 from being oxidized;

a pinned layer 14 whose magnetization is pinned in one direction;

a free layer 18 provided between the cap layer 19 and the pinned layer 14 where a magnetization direction thereof varies in response to an external magnetic field;

a spacer layer 30 provided between the pinned layer 14 and the free layer 18;

an oxide layer 40 provided between the spacer layer 30 and the free layer 18; and a metal layer 50 provided between the oxide layer 40 and the free layer 18.

The free layer 18 is equivalent to the first magnetic layer 20 of the first embodiment. The pinned layer 14 is equivalent to the second magnetic layer 60 of the first embodiment.

Moreover, the magnetoresistive element 200 is provided with a pair of electrodes 10 and 70 to pass a current therethrough in a direction perpendicular to the layers included therein. The magnetoresistive element 200 is further provided with a pinning layer 13 and an underlayer 12. The pinning layer 13 is provided between the electrode 10 and the pinned layer 14 and includes an anti-ferromagnetic body to pin the magnetization direction of the pinned layer 14. The under layer 12 is provided between the pinning layer 13 and the electrode 10.

A voltage is applied between the electrode 10 and the electrode 70 to pass a current through the magnetoresistive element 200 in a direction perpendicular to the layers included therein.

The current enables it to detect a resistance change due to a magnetoresistive effect, i.e., a change in magnetization directions of the pinned layer 14 and the free layer 18. Cu or Au having a low resistance is employed for the electrodes 10 and 70 to pass a current through the magnetoresistive element 200.

The underlayer 12 includes a multilayer with a buffer layer and a seed layer laminated. Here, the buffer layer is disposed on the side of the electrode 10 and the seed layer is dispose on the side of the pinning layer 13.

The buffer layer reduces the roughness of the surface of the electrode 10 and enhances the crystallinity of a layer laminated thereon. As the buffer layer, Ta, Ti, V, W, Zr, Hf, Cr, or alloys of these can be employed, for example. The film thickness of the buffer layer is not less than 1 nm and not more than 10 nm. An excessively thin buffer layer looses a buffer effect. An excessively thick buffer layer increases serial resistance without contribution to the MR change rate. In addition, when the seed layer formed on the buffer layer has the buffer effect, the buffer layer is not necessarily provided. A 1 nm-thick Ta layer can serve as such a seed layer.

The seed layer controls crystalline orientation and sizes of crystalline grains of a layer laminated thereon. As the seed layer, metals having an fcc structure (face-centered cubic structure), an hcp structure (hexagonal close-packed structure) or a bcc structure (body-centered cubic structure) are employed.

For example, an hcp Ru layer or an fcc NiFe layer are employed to acquire a layer with crystalline orientation of fcc (111) which is laminated on the hcp Ru layer or the fcc NiFe layer. Moreover, when the pinning layer 13 includes IrMn, the IrMn layer having an excellent fcc (111) orientation is acquired. When the pinning layer 13 includes PtMn, the PtMn layer having an ordered fct (111) orientation is acquired. Here, fct denotes a face-centered tetragonal structure. Moreover, when an fcc metal is employed for the free layer 18 and the pinned layer 14, an excellent fcc (111) orientation is given thereto. When a bcc metal is employed therefor, an excellent bcc (110) orientation is given thereto. In order for the seed layer to serve as a seed layer, the thickness of the seed layer is not less than 1 nm and not more than 5 nm. A 2 nm-thick Ru layer can be formed as an example of the seed layer.

In addition, a NiFe-base alloy, e.g., $Ni_xFe_{100-x}$ (x=50 to 90) or a nonmagnetic $(Ni_xFe_{100-x})_{100-y}A_y$ (A=Cr, V, Nb, Hf, Zr, or Mo as a third additive) can be employed for the seed layer instead of the Ru layer. When the NiFe-base alloy is employed for the seed layer, it is comparatively easy to provide the seed layer with an excellent crystalline orientation of which X-ray rocking curve has a half-value width of 3° to 5°.

The seed layer not only enhances a crystalline orientation of a layer laminated thereon, but also controls grain size of the layer laminated thereon. Specifically, it is possible to set the grains of the layer laminated on the seed layer to not less than 5 nm and not more than 20 nm in size, thereby enabling a high MR change rate without variations in characteristics of a magnetoresistive element to be miniaturized.

In addition, grains of the seed layer are set to not less than 5 nm and not more than 20 nm in size to reduce electron diffused reflection and electron inelastic scattering both being caused by grain boundaries in the seed layer. A 2 nm-thick Ru layer is formed in order to acquire grains having such size. Moreover, when $(Ni_xFe_{100-x})_{100-y}A_y$ (A=Cr, V, Nb, Hf, Zr, or Mo as a third additive) is employed for the material of the seed layer, a 2 nm-thick seed layer of $(Ni_xFe_{100-x})_{100-y}A_y$ is formed with a composition y of the third additive ranging from 0% to 30% (including 0%).

The grain size of the layer laminated on the seed layer can be seen by observing grain size of a layer disposed between the seed layer and the spacer layer 30. For example, the grain size can be measured using a cross-sectional TEM observation. In a bottom-type spin valve film where the pinned layer 14 is located under the spacer layer 30, the grain size of both the pinning layer 13 and the pinned layer 14 is controlled mostly by the grain size of the seed layer.

The pinning layer 13 gives unidirectional anisotropy to the pinned layer 14 formed thereon to pin the magnetization of the pinned layer 14. Materials of the pinning layer 13 include IrMn, PtMn, PdPtMn, and RuRhMn, all of which are antiferromagnetic. Among the above-mentioned antiferromagnetic materials, IrMn is advantageous for a magnetic head for high storage density. Even an IrMn layer thinner than a PtMn layer can give the unidirectional anisotropy to a pinned layer laminated thereon. Accordingly, the IrMn layer is suitable for narrowing a gap.

In order to give sufficient strength of the unidirectional anisotropy, the thickness of the pinning layer 13 is appropriately set. When PtMn or PdPtMn is employed for the pinning layer 13, the thickness thereof is not less than 8 nm and not more than 20 nm. When IrMn is employed for the pinning layer 13, even the IrMn layer, i.e., the pinning layer 13 thinner than a PtMn layer, etc. can give the uniaxial anisotropy. A preferable thickness of the IrMn layer is not less than 4 nm and not more than 18 nm. A 7 nm-thick $Ir_{22}Mn_{78}$ can be employed for the pinning layer, for example.

As the pinning layer 13, a hard magnetic layer can be employed instead of the antiferromagnetic layers. Materials of the hard magnetic layer include CoPt (Co=50%-85%), $(Co_xPt_{100-x})_{100-y}Cr_y$ (x=50 to 85, y=0 to 40), and FePt (Pt=40%-60%) to be employed. The hard magnetic layer (e.g., CoPt) has a comparatively small specific resistance to control an increase in a series resistance and an areal resistance RA (i.e., Resistance×Area).

Here, the areal resistance RA is defined as a product of an area by a resistance. The area is a cross section of the magnetoresistive element 200 through which a current is passed in the lamination direction thereof. The resistance is measured between the two electrodes through which the current is passed.

The pinned layer 14, the spacer layer 30, the free layer 18, and the pinning layer 13 are evaluated for the crystalline orientations using an X-ray diffraction method. The half-value widths of the X-ray rocking curves are estimated to be 3.5° to 6° for the fcc (111) peaks of the pinned layer 14 and the free layer 18, and for the fct (111) peak or bcc (110) peak of the pinning layer 13 (PtMn). That is, the pinned layer 14, the free layer 18, and the pinning layer 13 are provided with excellent crystalline orientations. In addition, the dispersion angles, i.e., the half-value widths for the crystalline orientations can be understood in terms of diffraction spots of a cross-sectional TEM.

The pinned layer 14 includes a multilayer where a lower pinned layer 141, a magnetic coupling layer 142, and an upper pinned layer 143 are laminated in this order from the side of the pinning layer 13.

The pinning layer 13 and the lower pinned layer 141 are magnetically exchange-coupled with each other so that unidirectional anisotropy is provided thereto. The lower pinned layer 141 and the upper pinned layer 143 sandwiches in the magnetic coupling layer 142 therebetween, and are strongly coupled with each other so that magnetization directions thereof become anti-parallel to each other.

Materials of the lower pinned layer 141 include a $Co_xFe_{100-x}$ alloy (x=0 to 100), a $Ni_xFe_{100-x}$ alloy (x=0 to 100), and these alloys with nonmagnetic elements added. Moreover, the materials of the lower pinned layer 141 include single elements, such as Co, Fe, and Ni, and alloys of these. Alternatively, a $(Co_xFe_{100-x})_{100-y}B_x$ alloy (x=0 to 100, y=0 to 30, B is boron) may be employed for the lower pinned layer 141. Employing an amorphous alloy, e.g., a $(Co_xFe_{100-x})_{100-y}B_x$ alloy enables it to reduce variations from sample to sample of magnetoresistive elements when the magnetoresistive elements are miniaturized.

The thickness of the lower pinned layer 141 is not less than 1.5 nm and not more than 5 nm. The confined thickness is to strengthen unidirectional anisotropy and an antiferromagnetic coupling field. The unidirectional anisotropy is due to the pinning layer 13. The antiferromagnetic coupling field is a magnetic coupling field between the lower pinned layer 141 and the upper pinned layer 143 via the magnetic coupling layer 142.

Moreover, if the lower pinned layer 141 is too thin, the upper pinned layer 143 affecting the MR change rate must be thin. The thin upper pinned layer 143 reduces the MR change rate. On the other hand, if the lower pinned layer 141 is too thick, it becomes difficult to acquire a sufficient unidirectional anisotropy field necessary for operation of a magnetoresistive element.

Moreover, when a magnetic film thickness of the lower pinned layer 141 is taken into consideration, the magnetic film thickness thereof is almost the same as that of the upper pinned layer 143. The magnetic film thickness means a product of saturation magnetization Bs by a film thickness t (Bs·t product). That is, the magnetic film thickness of the upper pinned layer 143 and the magnetic film thickness of the lower pinned layer 141 are taken into consideration.

For example, when the upper pinned layer 143 is a 3 nm-thick $Fe_{50}Co_{50}$ layer, the saturation magnetization of a thin $Fe_{50}Co_{50}$ film is 2.2 T. As a result, the magnetic film thickness of the 3 nm-thick $Fe_{50}Co_{50}$ layer is 2.2 T×3 nm=6.6 Tnm. A $Co_{75}Fe_{25}$ layer has saturation magnetization of about 2.1 T. The film thickness equivalent to the above magnetic film thickness, i.e., 6.6 Tnm is 6.6 Tnm/2.1 T=3.15 nm of which value corresponds to the film thickness of the lower pinned layer 141. Therefore, a 3.2 nm-thick $CO_{75}Fe_{25}$ layer is employed for the lower pinned layer 141.

The magnetic coupling layer 142 couples the lower pinned layer 141 and the upper pinned layer 143 antiferromagnetically with each other. The lower pinned layer 141 and the upper pinned layer 143 sandwich in the magnetic coupling layer 142 therebetween to form a synthetic pin structure. Ru can be employed for the magnetic coupling layer 142. In such a case, the film thickness of the magnetic coupling layer 142 is not less than 0.8 nm and not more than 1 nm. Alternatively, any material other than Ru may be employed for the magnetic coupling layer 142, provided that the material to be employed therefor couples the lower pinned layer 141 and the upper pinned layer 143 antiferromagnetically with each other. When the film thickness of the magnetic coupling layer 142 is not less than 0.8 nm and not more than 1 nm, the film thickness thereof corresponds to a second peak of RKKY (Ruderman-Kittel-Kasuya-Yoshida) coupling. Alternatively, the film thickness thereof may be not less than 0.3 nm and not more than 0.6 nm as corresponding to a first peak of the RKKY coupling. Here, a 0.9 nm-thick Ru layer allows it to provide reliable and stable coupling, for example. Re, Rh, Ir, and Os can also be employed for the magnetic coupling layer 142.

The upper pinned layer 143 is a magnetic layer which contributes to the MR effect.

$Fe_{50}Co_{50}$ can be employed for the upper pinned layer 143. $Fe_{50}Co_{50}$ is a magnetic material having a bcc structure. This material, i.e., $Fe_{50}Co_{50}$ has a large effect of spin-dependent interfacial scattering to enable a high MR change rate. FeCo-series alloys having a bcc structure include $Fe_xCo_{100-x}$ (x=30 to 100) and $Fe_xCo_{100-x}$ with some additives. Among the FeCo-series alloys, $Fe_xCO_y$ (x=40% to 80%, y=20% to 60%) has overall characteristics and is easy to use.

When the upper pinned layer 143 includes a magnetic layer with a bcc structure suitable for a high MR change rate, the total film thickness of this magnetic layer is preferably 1.5 nm or more. The total film thickness is adjusted to stabilize a bcc structure. Most metallic materials have an fcc structure or an fct structure to be used for a spin valve film. Therefore, only the upper pinned layer 143 could have the bcc structure. For this reason, if the upper pinned layer 143 is too thin, it is difficult to stably maintain the bcc structure, thereby making it impossible to acquire a high MR change rate.

Alternatively, a $(Co_xFe_{100-x})_{100-y}B_y$ alloy (x=0 to 100, y=0 to 30) may be employed for a material of the upper pinned layer 143. Employing an amorphous alloy such as $(Co_xFe_{100-x})_{100-y}B_y$ therefor allows it to reduce variations in characteristics of an MR element to be miniaturized. The variations are caused by crystalline grains of the miniaturized MR element, which are specific thereto. Employing such an amorphous alloy also allows it to smooth the upper pinning layer 143 and the spacer layer 30 to be further formed thereon. Smoothing the spacer layer 30 reduces defects thereof and is essential to acquire a high MR change rate with a low areal resistance. When an MgO layer is employed for the spacer layer 30, the MgO layer is formed on such an amorphous alloy $(Co_xFe_{100-x})_{100-y}B_y$. The amorphous alloy enhances a (100) orientation of the MgO layer. The (100) orientation of the MgO layer is essential to acquire a high MR change rate. In addition, the amorphous alloy $(Co_xFe_{100-x})_{100-y}B_y$ crystallizes on a (100) crystalline plane of MgO as a template to have crystallographical matching with the (100) plane of MgO.

A thick upper pinned layer 143 can easily provide a high MR change rate, while a thin upper pinned layer 143 can provide a high pinning magnetic field. For example, when an FeCo alloy layer with a bcc structure is employed for the upper pinned layer 143, the thickness thereof is preferably 1.5 nm or more. Moreover, when a CoFe alloy layer with an fcc structure is employed therefor, the thickness thereof is preferably 1.5 nm or more. On the other hand, the thickness of the upper pinned layer 143 is preferably 5 nm or less in order to acquire a high pinning magnetic field. As mentioned above, the film thickness of the upper pinned layer 143 is preferably not less than 1.5 nm and not more than 5 nm.

Instead of a magnetic material having a bcc structure, a $CO_{90}Fe_{10}$ alloy having an fcc structure, Co, and a Co alloy both having an hcp structure are employed for the upper pinned layer 143. The $Co_{90}Fe_{10}$ alloy is widely used for conventional magnetoresistive elements. For the upper pinned layer 143, the alloy containing simple metals, such as Co, Fe, or Ni, or an alloy containing at least one of these elements can be employed. An FeCo alloy with a bcc structure, a Co alloy having a Co composition of 50% or more, and a Ni alloy having a Ni composition of 50% or more are advantageous for a high MR change rate as the upper pinned layer 143.

Alternatively, Heusler magnetic alloys may be employed for the upper pinned layer 143. The Heusler magnetic alloys include $Co_2MnGe$, $CO_2MnSi$, and $Co_2MnAl$.

The spacer layer 30 includes a metal, an insulator, or the insulating layer 32 including current paths. The insulating layer 32 including the current paths 31 is referred to as a current constriction layer.

Metals to be employed for the spacer layer 30 include Au, Ag, Cu, and Zn. Oxides containing at least one element selected from the group consisting of Mg, Al, Ti, Zr, Hf, or Zn can be employed for the insulator. Specifically, MgO is employed therefor. MgO allows a coherent spin-dependent tunneling phenomenon to provide a high MR change rate.

Materials of the insulating layer 32 include an oxide, a nitride, and an oxynitride. The specific examples of the insulating layer 32 include $Al_2O_3$ and $Al_2O_3$ with additives. A 2 nm-thick $Al_2O_3$ layer can be employed, for example. The additives include Ti, Hf, Mg, Zr, V, Mo, Si, Cr, Nb, Ta, W, B, C, and Zn. The amounts of additives suitably range from 0% to 50%. Instead of Al oxides such as $Al_2O_3$, other metals can be employed for the insulating layer 32. The other metals include Mg oxides, Zn oxides, Ti oxides, Hf oxides, Mn oxides, Zr oxides, Cr oxides, Ta oxides, Nb oxides, Mo oxides, Si oxides, V oxides. The above-mentioned additives can be added to these oxides. The amounts of the additives suitably range from 0% to 50%. Alternatively, nitrides and oxynitrides based on Al, Si, Hf, Ti, Mg, Zr, V, Mo, Nb, Ta, W, B, and C may be employed for the insulating layer 32 instead of oxides.

A current path 31 is to pass a current through the current constriction layer 32 in a direction perpendicular thereto and is to constrict the current. At least one element selected from the group consisting of Cu, Au, Ag, Ni, Co, and Fe is employed for the current path 31. Alloys of these elements are also employed therefor. The alloys include CuNi, CuCo, and CuFe. The current path 31 is crystalline and contains less than half as much oxygen or nitrogen as that included in the insulating layer 32. The current path 31 has a lower resistance than the insulating layer 32 to easily serve as a current path. The thickness of the spacer layer 30 is not less than 0.5 nm and not more than 5 nm.

A double-layer can be employed for the first magnetic layer 20 and the second magnetic layer 60. The double-layer has $Co_{90}Fe_{10}[1 nm]/Ni_{83}Fe_{17}$ [3.5 nm] with CoFe formed at the interface therebetween. Alternatively, the double layer may be a 4 nm-thick $Co_{90}Fe_{10}$ single layer. Alternatively, the double layer may be a trilayer including CoFe/NiFe/CoFe. Here, a symbol '/' denotes a sequential lamination of two layers from a layer of the substance written on the left side of the symbol. For example, Au/Cu/Ru shows that a Cu layer is laminated on an Au layer and a Ru layer is further successively laminated on the Cu layer. Moreover, '×2' denotes that the same multilayers are double laminated successively. For example, (Au/Cu)×2 shows the following serial lamination steps:

A first Cu layer is laminated on a first Au layer;
A second Au layer is laminated on the first Cu; and
A second Cu layer is laminated on the second Au layer.
Moreover, '[ ]' denotes a film thickness of the substance.

A CoFe alloy can be employed for the first magnetic layer 20 and the second magnetic layer 60. The $Co_{90}Fe_{10}$ alloy has stable soft magnetic properties. The thickness of the CoFe alloy is set to not less than 0.5 nm and not more than 4 nm. In addition, $Fe_xCo_{100-x}$ (x=10 to 100) may also be employed. Alternatively, a multilayer with CoFe layers and ultra-thin Cu layers laminated plurally alternately, or a multilayer with Fe layers and ultra-thin Cu layers laminated plurally alternately may be employed for the first magnetic layer 20 and the second magnetic layer 60. The thicknesses of the CoFe layers are not less than 1 nm and not more than 2 nm. The thicknesses of the Cu layers are not less than 0.1 nm and not more than 0.8 nm. Alternatively, an amorphous layer, e.g., a CoZrNb layer may be employed as a part of the first magnetic layer 20 and a part of the second magnetic layer 60. As a structure of the first magnetic layer 20, the following configuration is employed when viewing the first magnetic layer 20 from the spacer layer 30. That is, examples of the structures include (1) crystalline single layer (2) lamination of crystalline layer/amorphous layer, (3) lamination of crystalline layer/amorphous layer/crystalline layer. In all the cases (1) to (3), a crystalline layer is in contact with both the spacer layer 30 and the first magnetic layer 20.

The cap layer 19 serves as a protection layer to protect a layer thereunder. The cap layer 19 can include two or more metallic layers, e.g., a double-layer of Cu [1 nm]/Ru [10 nm]. Alternatively, the cap layer may include a Ru/Cu layer of which Ru layer is disposed on the side of the free layer 18. In this case, the Ru layer is not less than 0.5 nm and not more than 2 nm. The cap layer 19 having the Ru/Cu layer is employed when the free layer 18 is a NiFe layer, for example. Ru does not form solid solution with Ni, thereby reducing magnetostriction of an interdiffusion layer to be formed between the free layer 18 and the cap layer 19.

When the cap layer 19 includes Cu/Ru or Ru/Cu, the film thickness of the Cu layer can be not less than 0.5 nm and not more than 10 nm, whereas the film thickness of the Ru layer can be not less than 0.5 nm and not more than 5 nm.

Alternatively, other metal layers may be employed for the cap layer 19 instead of the Cu layer or the Ru layer.

An example of the manufacturing method of the magnetoresistive element 200 will be explained below.

An electrode 10 is formed on a substrate using a microfabrication process.
An underlayer 12 is formed on the electrode 10.
A pinning layer 13 is formed on the underlayer 12.
A pinned layer 14 is formed on the pinning layer 13.
A spacer layer 30 is formed on the pinned layer 14.
An oxide layer 40 is formed on the spacer layer 30.
Metal layers of Fe and Zn are formed on the spacer layer 30, and are oxidized to provide an oxide layer 40. The metal layers include Fe/Zn, Fe/Zn, (Fe/Zn)×2, and alloys of Zn and Fe. The oxidization of the metal layers employs so called "ion assisted oxidization (IAO)", heating treatment, or natural oxidation. IAO is an oxidizing method which irradiates metals with an ion beam or plasma of noble gases such as Ar, Xe, He, Ne, Kr or so, while gassing oxygen. Alternatively, pure oxygen may be used for the ion beam or plasma without using noble gases. Heating treatment is applied by gassing oxygen at temperatures of not less than 100° C. and not more than 300° C. The oxide layer 40 can be formed in this manner. Alternatively, metal layers may be laminated and oxidized two or more times repeatedly to form the oxide layer 40.

Next, a metal layer 50 is formed on the oxide layer 40. A free layer 18 is formed on the metal layer 50. A cap layer 19 is formed on the free layer 18, and annealing treatment is applied thereto. Finally, an electrode 70 is formed on the cap layer 19.

First Modification

Figure 12:
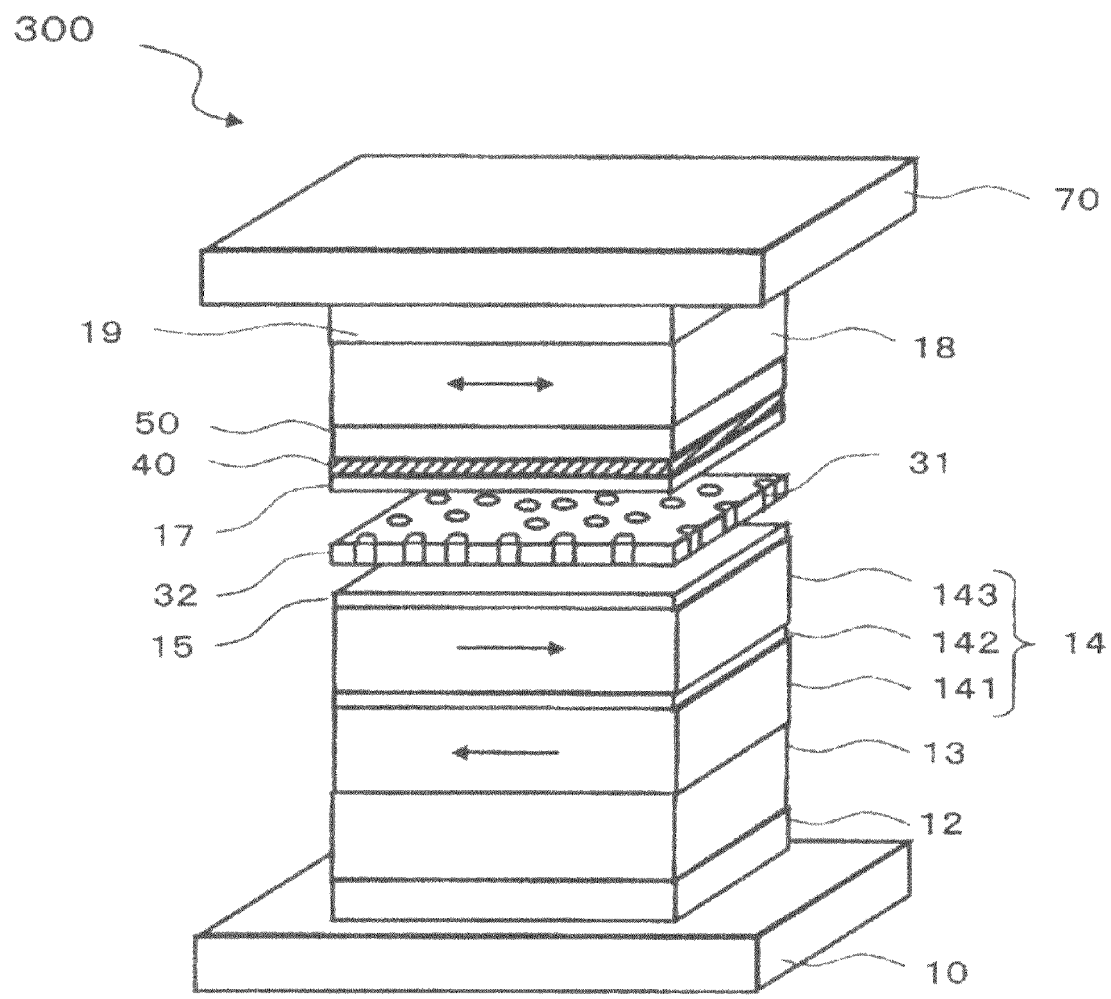
FIG. 12 is a view showing a first modification of the magnetoresistive element.

FIG. 12 is a view showing a magnetoresistive element 300. The magnetoresistive element 300 is a modification of the magnetoresistive element 200. The magnetoresistive element 300 is different from the magnetoresistive element 200 in that a spacer layer 30 is a current constriction layer including a current path 31 and an insulating layer 32. The current constriction layer is sandwiched between a lower metal layer 15 and an upper metal layer 17.

The lower metal layer 15 is to form the current path 31 and serves as a source side of the current path 31. The lower metal layer 15 also serves as a stopper layer to control the oxidation of an upper pinned layer 143 disposed thereunder when forming the insulating layer 32 disposed thereon.

The current path 31 includes Cu, the lower metal layer 15 including the same (Cu) thereas. When the current path 31 includes a magnetic material, the magnetic material may be the same as or different from the magnetic material of a pinned layer 14. Alternatively, the current path 31 may include Au and Ag in addition to Cu.

The upper metal layer 17 serves as a barrier layer and a seed layer. As the barrier layer, the upper metal layer 17 prevents oxygen and nitrogen included in a current constriction layer 32 from diffusing into a free layer 18. The upper metal layer 17 serves as a seed layer to enhance a crystalline growth of the free layer 18.

Specifically, the upper metal layer 17 protects the free layer 18 formed thereon from being in contact with oxide, nitride, and oxynitride included in the current constriction layer 32 so that the free layer 18 is neither oxidized nor nitrided. That is, the upper metal layer 17 prevents the current paths 31 from being directly in contact with the oxide layer 40. Moreover, the upper metal layer 17 improves the crystallinity of the free layer 18. When the insulating layer 32 (e.g., $Al_2O_3$) is amorphous, crystallinity of a metal layer formed thereon typically becomes worse. However, the crystallinity of the metal layer, i.e., the free layer 18 can be remarkably improved when arranging an ultra-thin seed layer (e.g., a Cu layer) between the metal layer and the insulating layer 32.

The upper metal layer 17 preferably includes the same material as that of the current paths 31, e.g., Cu. This is due to the following reasons. When the material of the upper metal layer 17 differs from that of the current path 31, there is an increase in interface resistance therebetween. In contrast, when the two materials are the same, there is no increase in the interface resistance. Alternatively, when the current path 31 includes a magnetic material, the magnetic material may be the same as or different from that of the free layer 18. Materials of the upper metal layer 17 can include Cu, Au, and Ag.

Second Modification

Figure 13:
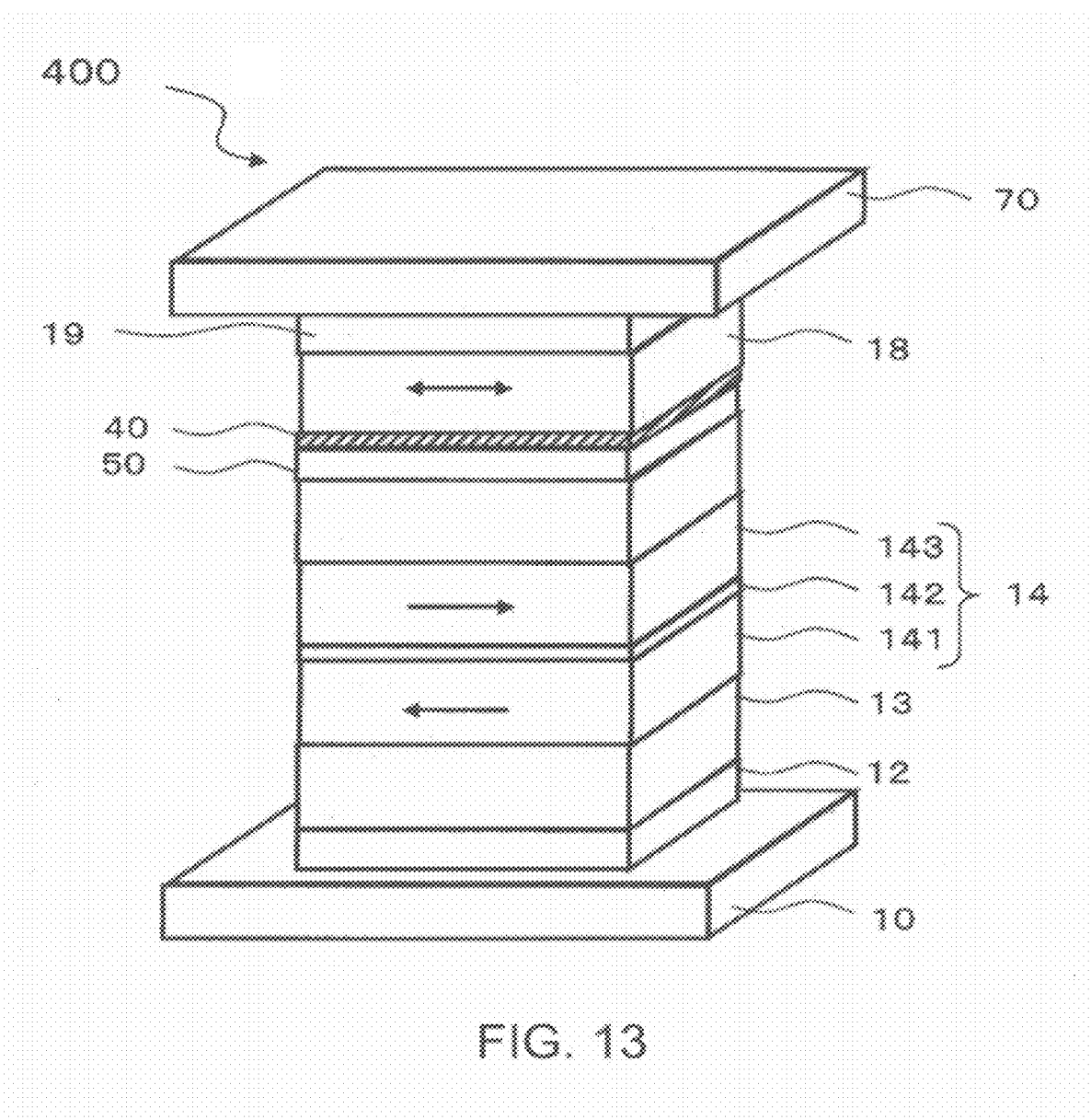
FIG. 13 is a view showing a second modification of the magnetoresistive element.

FIG. 13 is a view showing a magnetoresistive element 400. The magnetoresistive element 400 is a second modification of the magnetoresistive element 200. The magnetoresistive element 400 differs from the magnetoresistive element 200 in that a oxide layer 40 and a metal layer 50 switch positions with each other.

Third Modification

Figure 14:
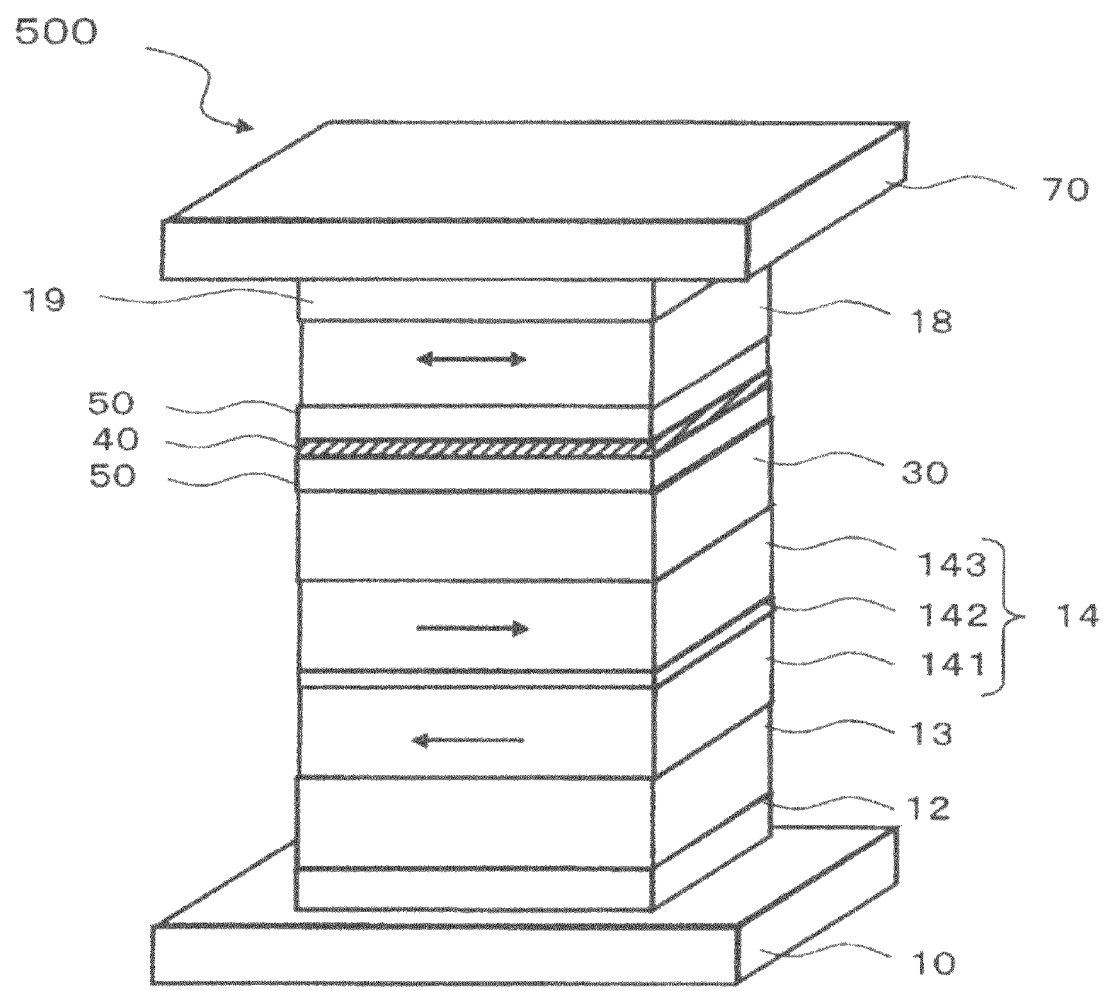
FIG. 14 is a view showing a third modification of the magnetoresistive element.

FIG. 14 is a view showing a magnetoresistive element 500. The magnetoresistive element 500 is a third modification of the magnetoresistive element 200. The magnetoresistive element 500 differs from the magnetoresistive element 200 in that a trilayer is sandwiched between a spacer layer 30 and a free layer 18. The trilayer includes an oxide layer 40 sandwiched between two metal layers.

Fourth Modification

Figure 15:
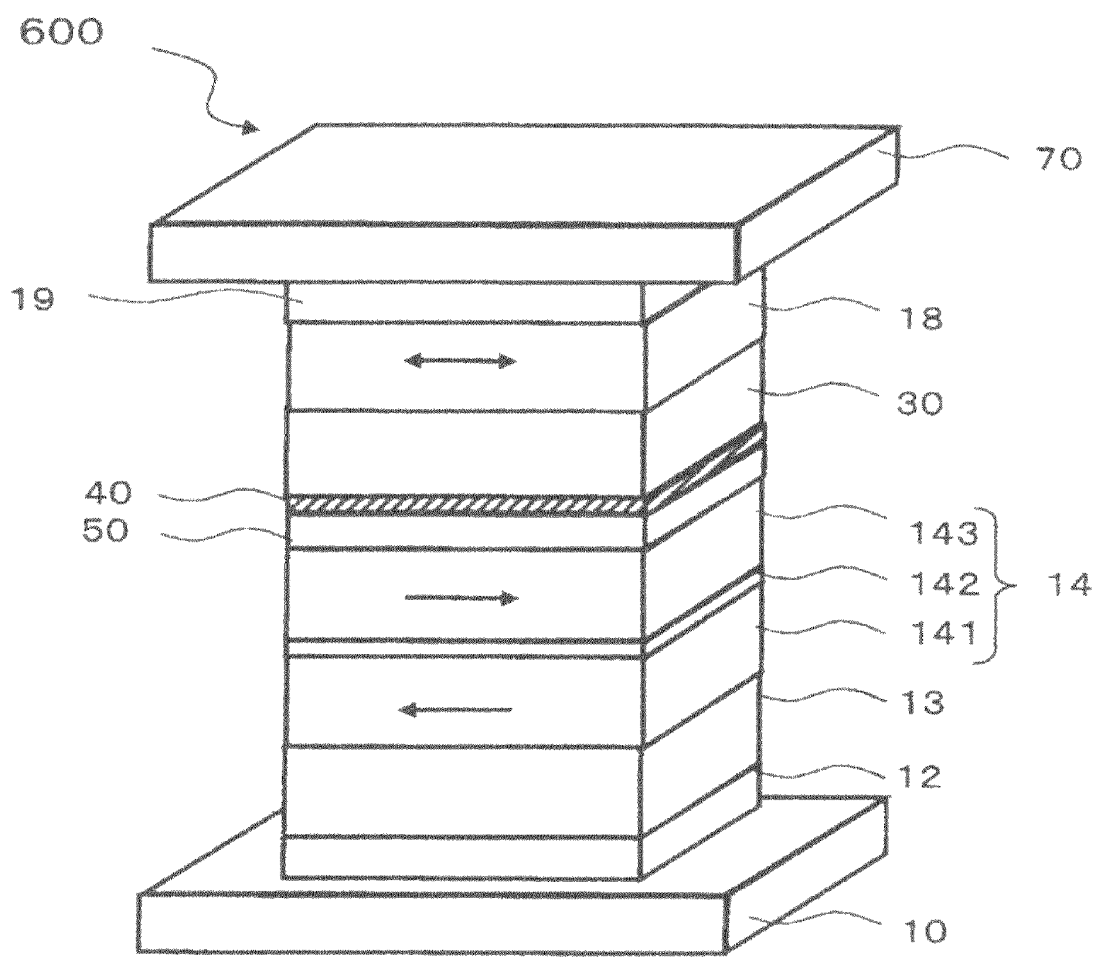
FIG. 15 is a view showing a fourth modification of the magnetoresistive element.

FIG. 15 is a view showing a magnetoresistive element 600. The magnetoresistive element 600 is a fourth modification of the magnetoresistive element 200. The magnetoresistive element 600 differs from the magnetoresistive element 200 in that an oxide layer 40 is provided between a spacer layer 30 and a pinned layer 14, and a metal layer 50 is provided between the oxide layer 40 and the pinned layer 14.

Fifth Modification

Figure 16:
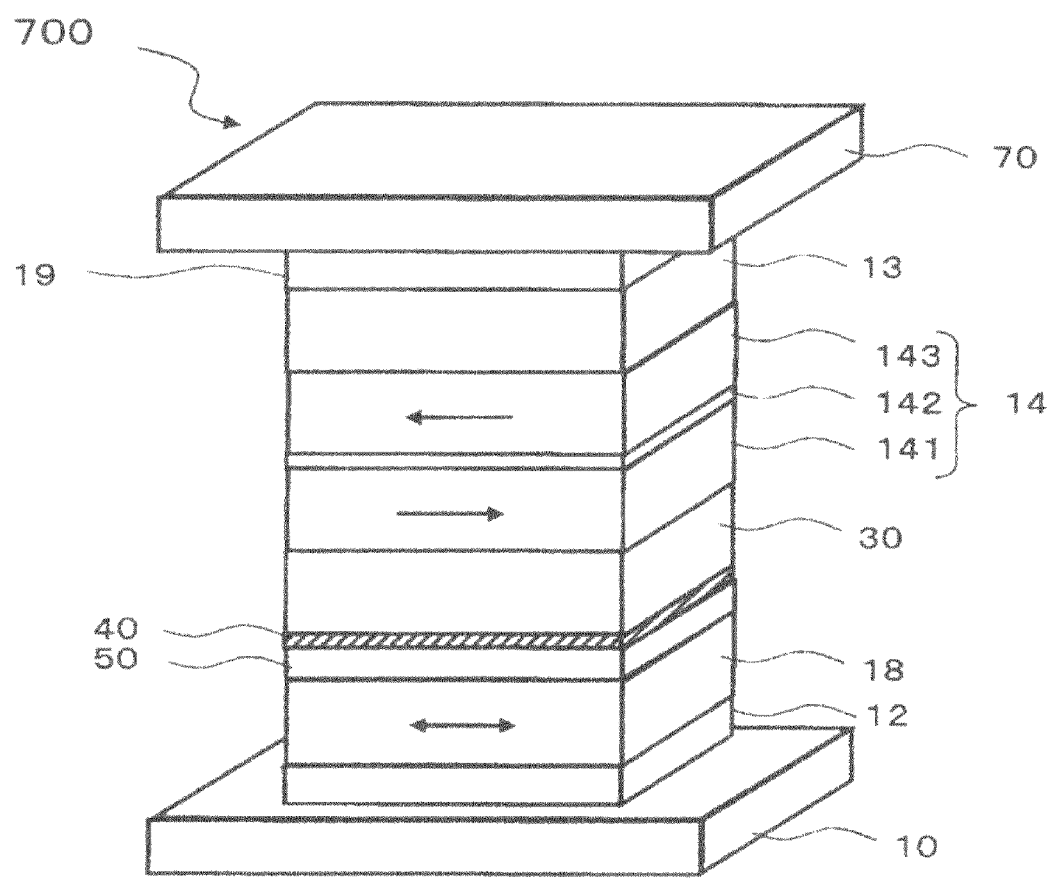
FIG. 16 is a view showing a fifth modification of the magnetoresistive element.

FIG. 16 is a view showing a magnetoresistive element 700. The magnetoresistive element 700 is a fifth modification of the magnetoresistive element 200. The magnetoresistive element 700 is provided with a free layer 18, a metal layer 50, an oxide layer 40, a spacer layer 30, a pinned layer 14, a pinning layer 13, and a cap layer 19, all of which are laminated on an underlayer 12 in this order. The magnetoresistive element 700 differs from the magnetoresistive element 200 in that the free layer 18 is provided on the side of the underlayer 12, and the metal layer 50 and the oxide layer 40 switch positions with each other.

Sixth Modification

Figure 17:
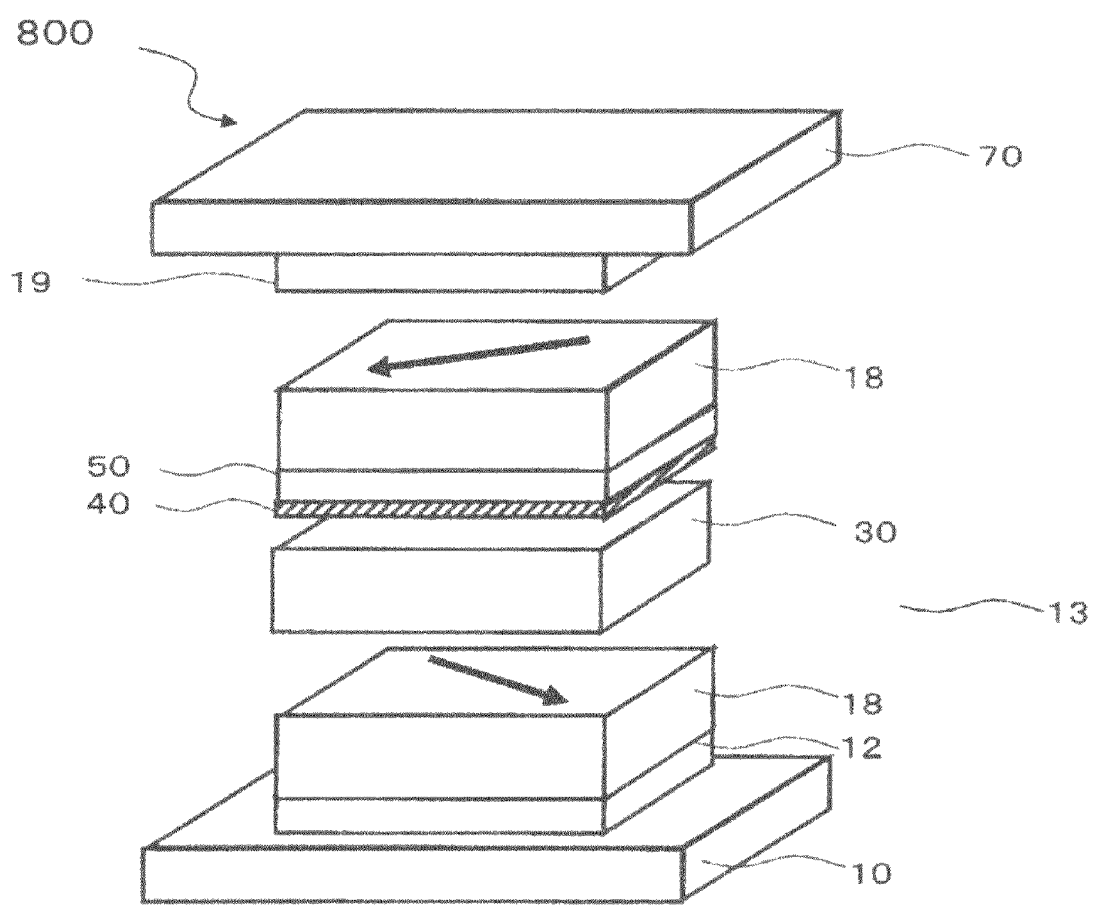
FIG. 17 is a view showing a sixth modification of the magnetoresistive element.

FIG. 17 is a view showing a magnetoresistive element 800. The magnetoresistive element 800 is a sixth modification of the magnetoresistive element 200. The magnetoresistive element 800 differs from the magnetoresistive element 200 in that a pinning layer 13 and a pinned layer 14 are replaced with two free layers 18. The two free layers 18 are magnetically biased applying no magnetic field so that the magnetization directions thereof are at right angles to each other. A combination of magnetic coupling via a spacer layer 30 and hard bias is employed in order to make the two magnetization directions at right angles to each other.

Seventh Modification

Figure 18:
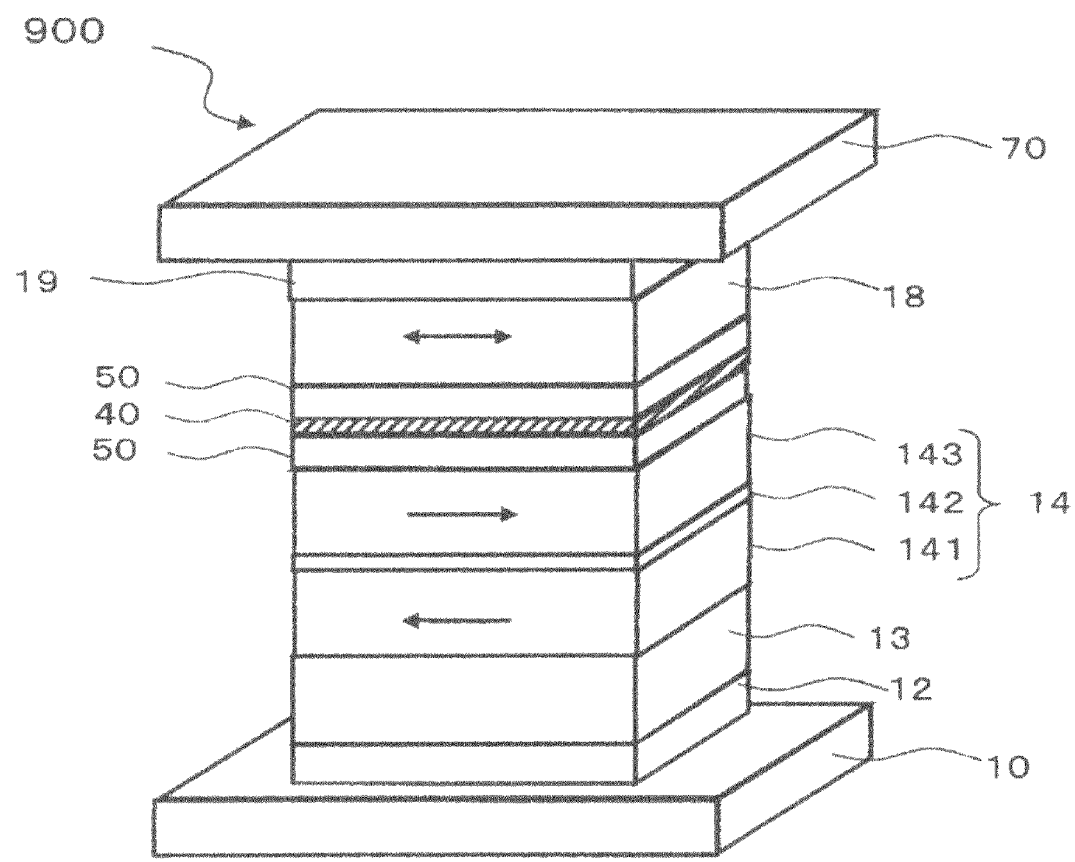
FIG. 18 is a view showing a seventh modification of the magnetoresistive element.

FIG. 18 is a view showing a magnetoresistive element 900. The magnetoresistive element 900 is a seventh modification of the magnetoresistive element 200. The magnetoresistive element 900 differs from the magnetoresistive element 200 in that an oxide layer 40 is sandwiched between two metal layers 50.

Eighth Modification

Figure 19:
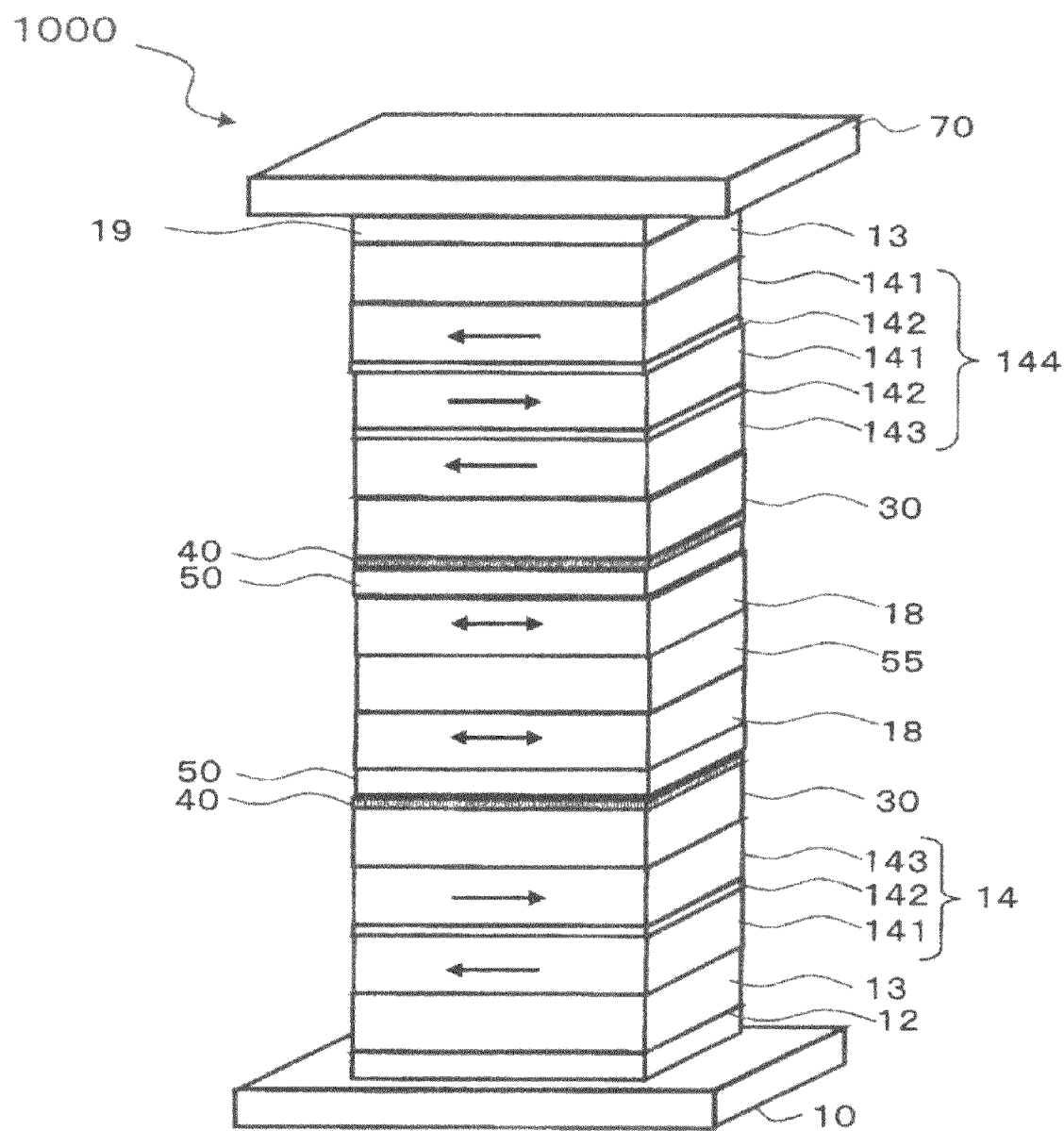
FIG. 19 is a view showing an eighth modification of the magnetoresistive element.

FIG. 19 is a view showing a magnetoresistive element 1000. The magnetoresistive element 1000 is provided with an intermediate layer 55 and differs from the magnetoresistive element 200 dominantly in that the magnetization directions of two upper pinned layers 143 on the upper and lower sides of the intermediate layer 55 are opposite to each other. Alternatively, the magnetoresistive element 1000 may have an upside-down lamination structure. The magnetoresistive element 1000 has so called a differential type structure. Changes in the resistances of the upper and lower parts across the intermediate layer 55 are opposite to each other in response to an external magnetic field. Therefore, when the magnetoresistive element 1000 employs a perpendicular magnetization recording medium, output is acquired in the magnetization transition region where upward magnetization and downward magnetization are adjacent to each other. That is, the magnetoresistive element 1000 performs differential type detection. In addition, a 5 nm-thick Cu layer is employed for the intermediate layer 55, for example. Other materials of the intermediate layer 55 include Au, Ag, Ru, Ir, Os, Re, Rh, and Ta. Alternatively, a lamination structure having a nonmagnetic metal layer sandwiched between two ferromagnetic layers may be employed for the intermediate layer 55 when the lamination structure generates anti-ferromagnetic coupling for the two ferromagnetic layers. An element selected from the group consisting of Ir, Os, Re, and Rh is employed for the nonmagnetic metal layer. An element selected from Co, Fe, and Ni is employed for the respective ferromagnetic layers. This structure makes the magnetization directions of free layers 18a and 18b anti-parallel to each other.

EXAMPLE 1

Magnetoresistive elements 200 were manufactured. The manufacturing conditions, MR (%) and RA ($\Omega\mu m^2$) of the magnetoresistive elements 200 are shown in FIG. 20. The details of the respective layers in the magnetoresistive elements 200 are as follows.

An underlayer 12 has Ta [1 nm]/Ru [2 nm];
a pinning Layer 13 has $Ir_{22}Mn_{78}$ [7 nm];
a pinned layer 14 has $Co_{75}Fe_{25}$ [4 nm]/Ru [0.8 nm]/$Fe_{50}Co_{50}$ [4 nm];
a spacer Layer 30 has Cu [1.5 nm];
an oxide layer 40 is manufactured using S10 shown in FIG. 20;
a metal layer 50 is manufactured using S20 shown in FIG. 20; and
a free Layer 18 has $Fe_{50}Co_{50}$[3 nm].
The oxide layer 40 was made of Fe [1 nm]/Zn [0.6 nm] of which surface underwent an IOA treatment to be Zn—Fe—O [1.6 nm]. Next, Zn—Fe—O [1.6 nm] was reduced using Ar plasma as reducing gas.

Two kinds of the metal layers 50 were formed as alloyed and laminated. The alloyed metal layers 50 were formed as $Zn(Fe_{50}Co_{50})$ [2 nm] with various Zn compositions. Various laminated metal layers 50 were formed as laminated structures including $(Zn/Fe_{50}Co_{50})\times 8$ with a total thickness of 2 nm. Changing the respective thicknesses of Zn and $Fe_{50}Co_{50}$ provided the metal layers 50 with various Zn compositions. As a reference example, a magnetoresistive element lacking the metal layer 50 was prepared. Moreover, an $Fe_{50}CO_{50}$ [2 nm] layer, i.e., the metal layer 50 without containing Zn was prepared as a comparative example 1-1. A Zn [2 nm] layer, i.e., the metal layer 50 without containing $Fe_{50}Co_{50}$ was prepared as a comparative example 1-2.

The respective magnetoresistive elements manufactured were evaluated for MR change rates and areal resistances RA. The MR change rates and the areal resistances RA were measured with a DC four-terminal method.

As shown in FIG. 20, the magnetoresistive elements in accordance with examples 1-1 to 1-12 showed MR change rates higher than those of the magnetoresistive elements in accordance with the reference example, the comparative examples 1-1 and 1-2. Moreover, when the metal layer contained Zn by not less than 5% and not more than 80%, it was shown that high MR change rates were acquired.

Figure 21A:
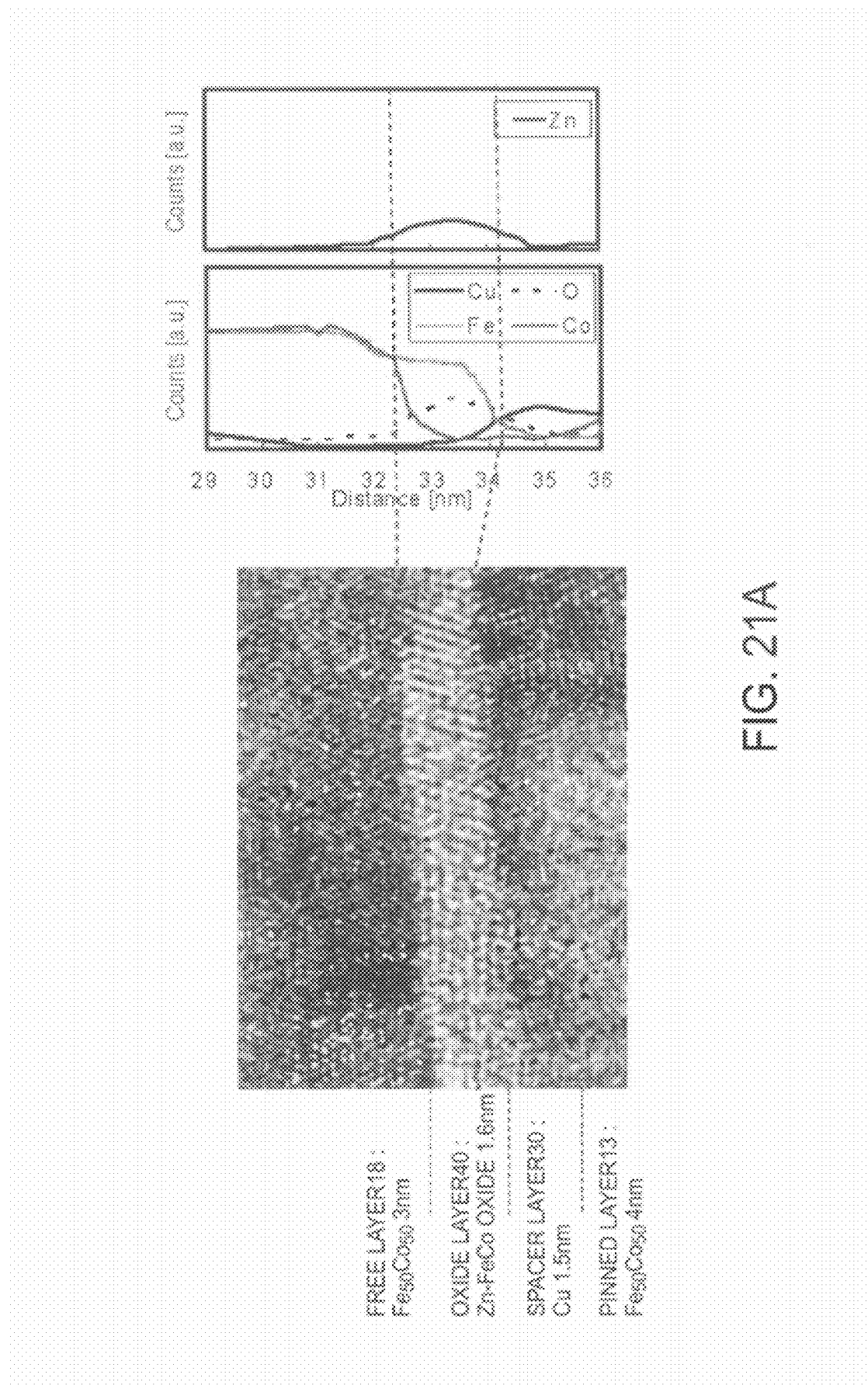
FIGS. 21A and 21B are views showing cross-sectional TEM observation and EDX (energy dispersive X-ray) line analysis on magnetoresistive elements in accordance with a reference example and an example.
Figure 21B:
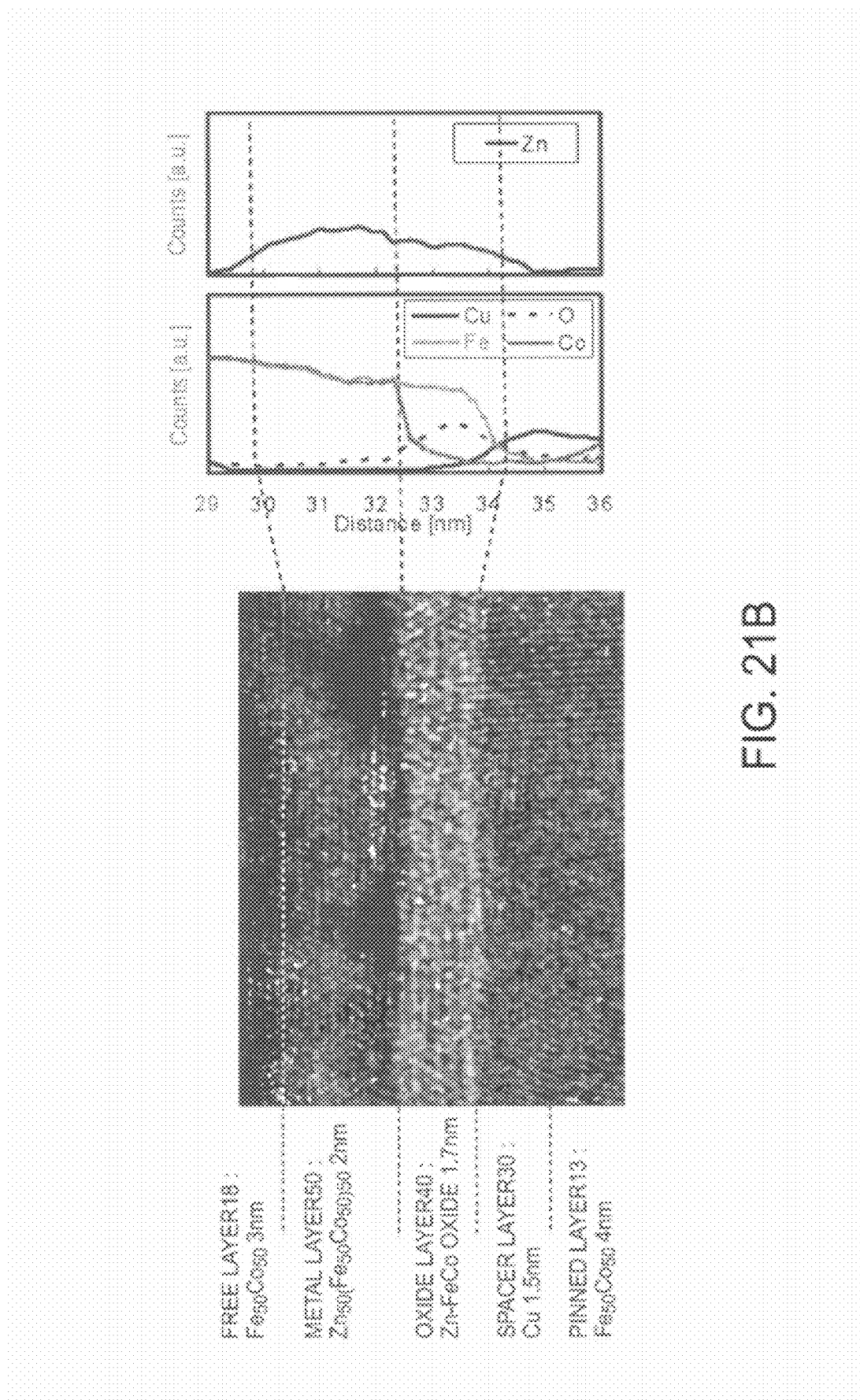

FIGS. 21A and 21B are views showing cross-sectional TEM observation and EDX (energy dispersive X-ray) line analysis on magnetoresistive elements in accordance with the reference example and the example 1-1. FIG. 21A shows the magnetoresistive element of the reference example. FIG. 21B shows the magnetoresistive element of the example 1-1.

The cross-sectional TEM observation and EDX line analysis are shown in FIGS. 21A and 21B. The cross-sectional TEM observation revealed that the thickness of the oxide layer of the reference example was 1.6 nm as was estimated from FIG. 21A. Also revealed that the thickness of the oxide layer of the example 1-1 was 1.7 nm as was estimated from FIG. 21B. The thickness of the oxide layer revealed by the cross-sectional TEM observation sums the thicknesses of the oxide layer 40 formed at S120 and the oxide layers as a result of the oxidation of the layers vertically adjacent to the oxide layer 40. The EDX line analysis revealed that the upper side of the oxide layer 40 lacks Zn in the reference example as shown in FIG. 21A, whereas the upper side of the oxide layer 40 contains Zn in the example 1-1 as shown in FIG. 21B. This result shows that Zn—$Fe_{50}Co_{50}$ [2 nm] formed as the metal layer 50 is not entirely re-oxidized and a part of Zn—$Fe_{50}Co_{50}$ [2 nm] is left as a metal layer.

A three-dimensional atomic force microscope can be used in addition to the cross-sectional TEM. The three-dimensional atomic force microscope enables it to conduct a chemical composition analysis of atomic level.

EXAMPLE 2

Magnetoresistive elements 400 were manufactured. The manufacturing conditions, MR (%), and RA ($\Omega\mu m^2$) of the magnetoresistive elements 400 manufactured are shown in FIG. 22. The details of the respective layers of the magnetoresistive elements 400 are as follows.

An underlayer 12 has Ta [1 nm]/Ru [2 nm];
a pinning layer 13 has $Ir_{22}Mn_{78}$ [7 nm];
a pinned layer 14 has $Co_{75}Fe_{25}$ [4 nm]/Ru [0.8 nm]/$Fe_{50}Co_{50}$ [4 nm];
a spacer Layer 30 has Cu [1.5 nm];
a metal layer 50 is formed using S30 shown in FIG. 22;
an oxide layer 40 is formed using S40 shown in FIG. 22; and
a free layer 18 has $Fe_{50}Co_{50}$ [3 nm].
The oxide layer 40 was made of Fe [1 nm]/Zn [0.6 nm] of which surface underwent an IOA treatment to be Zn—Fe—O[1.6 nm].
Next, Zn—Fe—O [1.6 nm] was reduced using Ar plasma as reducing gas.

Two kinds of the metal layers 50 were prepared as alloyed and laminated. The alloyed metal layer 50 was formed as $Zn(Fe_{50}Co_{50})$ [2 nm] with various Zn compositions. Various laminated metal layers 50 were formed as laminated structures including $(Zn/Fe_{50}Co_{50})\times 8$ with a total thickness of 2 nm. Changing the respective thicknesses of Zn and $Fe_{50}Co_{50}$ provided the metal layers 50 with various Zn compositions. As a reference example, the magnetoresistive element without the metal layer 50 was prepared. Moreover, a $Fe_{50}Co_{50}$ [2 nm] layer, i.e., the metal layer 50 lacking Zn was prepared as a comparative example 2-1. A Zn [2 nm] layer, i.e., the metal layer 50 without containing $Fe_{50}Co_{50}$ was prepared as a comparative example 2-2.

The respective magnetoresistive elements were evaluated for MR change rates and areal resistances RA. The MR change rates and the areal resistances RA were measured with a DC four-terminal method.

As shown in FIG. 22, the magnetoresistive elements in accordance with examples 2-1 to 2-10 showed MR change rates higher than those of the magnetoresistive elements in accordance with the reference example, the comparative examples 2-1 and 2-2. Moreover, the metal layer 50 having a Zn composition of not less than 5% and not more than 80% showed high MR change rates.

EXAMPLE 3

Magnetoresistive elements 500 were manufactured. The manufacturing conditions, MR (%), and RA ($\Omega\mu m^2$) of the magnetoresistive elements 500 manufactured are shown in FIG. 23. The details of the respective layers of the magnetoresistive elements 500 are as follows.

An underlayer 12 has Ta [1 nm]/Ru [2 nm];
a pinning layer 13 has $Ir_{22}Mn_{78}$ [7 nm];
a pinned layer 14 has $Co_{75}Fe_{25}$ [4 nm]/Ru [0.8 nm]/$Fe_{50}Co_{50}$ [4 nm];
a spacer Layer 30 has Cu [1.5 nm];
a metal layer 50 is formed using S30 shown in FIG. 23;
an oxide layer 40 is formed using S40 shown in FIG. 23;
a metal layer 50 is formed using S70 shown in FIG. 23; and
a free layer 18 has $Fe_{50}Co_{50}$ [3 nm].

Two kinds of the metal layers 50 were formed as alloyed and laminated.

The alloyed metal layer 50 was formed as $Zn(Fe_{50}CO_{50})$ [2 nm] with various Zn compositions. Various laminated metal layers 50 were formed as laminated structures including (Zn/$Fe_{50}Co_{50}$)×8 with a total thickness of 2 nm. Changing the respective thicknesses of Zn and $Fe_{50}Co_{50}$ provided the metal layers 50 with various Zn compositions. As a reference example, the magnetoresistive element without the metal layer 50 was prepared. Moreover, an $Fe_{50}Co_{50}$ [2 nm] layer, i.e., the metal layer 50 lacking Zn was prepared as a comparative example 3-1. Moreover, a Zn [2 nm] layer, i.e., the metal layer 50 without containing $Fe_{50}Co_{50}$ was prepared as a comparative example 3-2.

The respective magnetoresistive elements manufactured were evaluated for MR change rates and areal resistances RA. The MR change rates and the areal resistances RA were measured with a DC four-terminal method.

As shown in FIG. 23, the magnetoresistive elements in accordance with examples 3-1 to 3-12 showed MR change rates higher than those of the magnetoresistive elements in accordance with the reference example, the comparative examples 3-1 and 3-2. Moreover, when the metal layer 50 contained Zn by not less than 5% and not more than 80%, it was shown that high MR change rates were acquired.

EXAMPLE 4

Magnetoresistive elements 200 were manufactured. The manufacturing conditions, MR (%), and RA ($\Omega\mu m^2$) of the magnetoresistive elements 200 manufactured are shown in FIG. 24.

Examples 4-1 to 4-12 differ from the examples 1-1 to 1-12 in that Zn and Fe are employed for metal layers 50 prepared at S20.

Two kinds of the metal layers 50 were formed as alloyed and laminated. The alloyed metal layers 50 were formed as ZnFe [2 nm] with various Zn compositions. Various laminated metal layers 50 were formed as laminated structures including (Zn/Fe)×8 with a total thickness of 2 nm. Changing the respective thicknesses of Zn and Fe provided the metal layers 50 with various Zn compositions. As a reference example, the magnetoresistive element without the metal layer 50 was prepared. Moreover, an Fe [2 nm] layer, i.e., the metal layer 50 lacking Zn was prepared as a comparative example 4-1. A Zn [2 nm] layer, i.e., the metal layer 50 lacking $Fe_{20}Co_{20}$ was prepared as a comparative example 4-2.

The respective magnetoresistive elements manufactured were evaluated for MR change rates and areal resistances RA. The MR change rates and the areal resistances RA were measured with a DC four-terminal method.

As shown in FIG. 24, the magnetoresistive elements in accordance with examples 4-1 to 4-12 showed MR change rates higher than those of the magnetoresistive elements in accordance with the reference example, the comparative examples 4-1 and 4-2. Moreover, when the metal layer contained Zn by not less than 5% and not more than 80%, it was shown that high MR change rates were acquired.

EXAMPLE 5

Magnetoresistive elements 200 were manufactured. The manufacturing conditions, MR (%), and RA ($\Omega\mu m^2$) of the magnetoresistive elements 200 manufactured are shown in FIG. 25.

Examples 5-1 to 5-12 differ from the examples 1-1 to 1-12 in that Zn and $Co_{90}Fe_{10}$ are employed for metal layers 50 prepared at S20.

Two kinds of the metal layers 50 were formed as alloyed and laminated. The alloyed metal layers 50 were formed as $Zn(Co_{90}Fe_{10})$ [2 nm] with various Zn compositions. Various laminated metal layers 50 were formed as laminated structures including (Zn/$Co_{90}Fe_{10}$)×8 with a total thickness of 2 nm. Changing the respective thicknesses of Zn and $Co_{90}Fe_{10}$ provided the metal layers 50 with various Zn compositions. As a reference example, the magnetoresistive element without the metal layer 50 was prepared. Moreover, a $Co_{90}Fe_{10}$ [2 nm] layer, i.e., the metal layer 50 without containing Zn was prepared as a comparative example 5-1. A Zn [2 nm] layer, i.e., the metal layer 50 without containing $Co_{90}Fe_{10}$ was prepared as a comparative example 5-2.

The respective magnetoresistive elements manufactured were evaluated for MR change rates and areal resistances RA. The MR change rates and the areal resistances RA were measured with a DC four-terminal method.

As shown in FIG. 25, the magnetoresistive elements in accordance with the examples 5-1 to 5-12 showed MR change rates higher than those of the magnetoresistive elements in accordance with the reference example, the comparative examples 5-1 and 5-2. Moreover, when the metal layer contained Zn by not less than 5% and not more than 80%, it was shown that high MR change rates were acquired.

EXAMPLE 6

Magnetoresistive elements 200 were manufactured. The manufacturing conditions, MR (%), and RA ($\Omega\mu m^2$) of the magnetoresistive elements 200 manufactured are shown in FIG. 26.

Examples 6-1 to 6-12 differ from the examples 1-1 to 1-12 in that Zn and $Fe_{50}Ni_{50}$ are employed for metal layers 50 prepared at S20.

Two kinds of the metal layer 50 were manufactured as alloyed and laminated. The alloyed metal layers 50 were formed as $Zn(Fe_{50}Co_{50})$ [2 nm] with various Zn compositions. Various laminated metal layers 50 were formed as laminated structures including (Zn/$Fe_{50}Co_{50}$)×8 with a total thickness of 2 nm. Changing the respective thicknesses of Zn and $Fe_{50}Co_{50}$ provided the metal layers 50 with various Zn compositions. As a reference example, a magnetoresistive element without the metal layer 50 was prepared. Moreover, a $Fe_{50}Co_{50}$ [2 nm] layer, i.e., the metal layer 50 without containing Zn was prepared as a comparative example 6-1. A Zn [2 nm] layer, i.e., the metal layer 50 without containing $Fe_{50}Co_{50}$ was prepared as a comparative example 6-2.

The respective magnetoresistive elements manufactured were evaluated for the MR change rates and the areal resistances RA. MR change rates and areal resistances RA were measured with a DC four-terminal method.

As shown in FIG. 26, the magnetoresistive elements in accordance with the examples 6-1 to 6-12 showed MR change rates higher than those of the magnetoresistive elements in accordance with the reference example, the comparative examples 6-1 and 6-2. Moreover, when the metal layer 50 contains Zn by not less than 5% and not more than 80%, the magnetoresistive element showed high MR change rates.

EXAMPLE 7

Magnetoresistive elements 200 were manufactured. The manufacturing conditions, MR (%), and RA ($\Omega\mu m^2$) of the magnetoresistive elements 200 manufactured are shown in FIG. 27.

Examples 7-1 to 7-12 differ from the examples 1-1 to 1-12 in that Zn and $Co_{50}Ni_{50}$ are employed metal layers 50 prepared at S20.

Two kinds of the metal layer 50 were manufactured as alloyed and laminated. The alloyed metal layers 50 were formed as $Zn(CO_{50}Ni_{50})$ [2 nm] with various Zn compositions. Various laminated metal layers 50 were formed as laminated structures including $(Zn/Co_{50}Ni_{50})\times 8$ with a total thickness of 2 nm. Changing the respective thicknesses of Zn and $Fe_{50}Co_{50}$ provided the metal layers 50 with various Zn compositions. As a reference example, a magnetoresistive element without the metal layer 50 was prepared. Moreover, a $Co_{50}Ni_{50}$ [2 nm] layer, i.e., the metal layer 50 without containing Zn was prepared as a comparative example 7-1. A Zn [2 nm] layer, i.e., the metal layer 50 lacking $Co_{50}Ni_{50}$ was prepared as a comparative example 7-2.

The respective magnetoresistive elements manufactured were evaluated for MR change rates and areal resistances RA. The MR change rates and the areal resistances RA were measured with a DC four-terminal method.

As shown in FIG. 27, the magnetoresistive elements in accordance with the examples 7-1 to 7-12 showed MR change rates higher than those of the magnetoresistive elements in accordance with the reference example, the comparative examples 7-1 and 7-2. Moreover, when the metal layer 50 contains Zn by not less than 5% and not more than 80%, the magnetoresistive elements showed high MR change rates.

EXAMPLE 8

Magnetoresistive elements 200 were manufactured. The manufacturing conditions, MR (%), and RA ($\Omega\mu m^2$) of the magnetoresistive elements 200 manufactured are shown in FIG. 28.

Examples 8-1 to 8-5 differ from the examples 1-1 to 1-12 in that Zn(CoFe) layers are employed for metal layers 50 prepared at S20 and the compositions of Co and Fe are changed variously.

As a reference example, a magnetoresistive element without the metal layer 50 was prepared. The respective magnetoresistive elements manufactured were evaluated for MR change rates and areal resistances RA. The MR change rates and the areal resistances RA were measured with a DC four-terminal method.

As shown in FIG. 28, the magnetoresistive elements in accordance with the examples 8-1 to 8-12 showed MR change rates higher than those of the magnetoresistive elements in accordance with the reference example. Moreover, when the metal layer 50 has a Fe composition of not less than 10% and not more than 80% and has a Co composition of not less than 20% and not more than 90%, the magnetoresistive element showed high MR change rates.

EXAMPLE 9

Magnetoresistive elements 200 were manufactured. The manufacturing conditions, MR (%), and RA ($\Omega\mu m^2$) of the magnetoresistive elements 200 manufactured are shown in FIG. 29.

Examples 9-1 to 9-12 differ from the examples 1-1 to 1-12 in that metal layers 50 are prepared at S20 and the thicknesses of the metal layers 50 are changed variously.

As a reference example, a magnetoresistive element without the metal layer 50 was prepared.

The respective magnetoresistive elements manufactured were evaluated for MR change rates and areal resistances RA. The MR change rates and the areal resistances RA were measured with a DC four-terminal method.

As shown in FIG. 29, the magnetoresistive elements in accordance with the examples 9-1 to 9-12 showed MR change rates higher than those of the magnetoresistive elements in accordance with the reference example. Moreover, when the film thickness of the metal layer 50 is not less than 0.1 nm and not more than 4 nm, the magnetoresistive elements showed high MR change rates.

EXAMPLE 10

Magnetoresistive elements 200 were manufactured. The manufacturing conditions, MR (%), and RA ($\Omega\mu m^2$) of the magnetoresistive elements 200 manufactured are shown in FIG. 30.

An example 10-1 differs from the examples 1-1 to 1-12 in that Cu or Ag layers are employed for metal layers 50 prepared at S20 in the comparative examples.

As a reference example, a magnetoresistive element lacking the metal layer 50 was prepared. Moreover, a 2 nm layer including Cu and $Fe_{50}Co_{50}$ was prepared as the metal layer 50 in a comparative example 10-1. A 2 nm layer including Ag and $Fe_{50}Co_{50}$ was prepared as the metal layer 50 in a comparative example 10-2.

The respective magnetoresistive elements manufactured were evaluated for MR change rates and areal resistances RA. The MR change rates and the areal resistances RA were measured with a DC four-terminal method.

As shown in FIG. 30, the magnetoresistive element of the example 10-1 showed an MR change rate higher than those of the magnetoresistive elements of the reference example, the comparative examples 10-1 and 10-2.

EXAMPLE 11

Magnetoresistive elements 200 were manufactured. The manufacturing conditions, MR (%), and RA ($\Omega\mu m^2$) of the magnetoresistive elements 200 manufactured are shown in FIG. 30.

Examples 11-1 to 11-10 differ from the examples 1-1 to 1-12 in that oxide layers including Zn and $Fe_{50}Co_{50}$ prepared at S10 are employed for oxide layers 40.

Two kinds of the metal layers 50 were manufactured as alloyed and laminated. The alloyed metal layers 50 were formed as $Zn(Fe_{50}Co_{50})$ [2 nm] with various Zn compositions. Various laminated metal layers 50 were formed as laminated structures including $(Zn/Fe_{50}Co_{50})\times 8$ with a total thickness of 2 nm. Changing the respective thicknesses of Zn and $Fe_{50}Co_{50}$ provided the metal layers 50 with various Zn compositions. As a reference example, a magnetoresistive element without the metal layer 50 was prepared. Moreover, an $Fe_{50}Co_{50}$ [2 nm] layer, i.e., the metal layer 50 without Zn was prepared for a comparative example 11-1. A Zn [2 nm] layer, i.e., the metal layer 50 without $Fe_{50}Co_{50}$ was prepared as a comparative example 11-2.

The respective magnetoresistive elements manufactured were evaluated for MR change rates and areal resistances RA. The MR change rates and the areal resistances RA were measured with a DC four-terminal method.

As shown in FIG. 31, the magnetoresistive elements in accordance with examples 11-1 to 11-10 showed MR change rates higher than those of the magnetoresistive elements in accordance with the reference example, the comparative examples 11-1 and 11-2. Moreover, when the metal layer contained Zn by not less than 5% and not more than 80%, it was shown that high MR change rates were acquired.

EXAMPLE 12

Magnetoresistive elements 200 were manufactured. The manufacturing conditions, MR (%), and RA ($\Omega\mu m^2$) of the magnetoresistive elements 200 manufactured are shown in FIG. 32.

In an example 12-1, Fe and Zn were used as master materials to be changed into a Zn—Fe oxide layer 40 by means of ion-beam oxidation and reduction. In an example 12-2, Fe and Zn were used as master materials to be changed into a Zn—Fe oxide layer 40 by means of ion-beam oxidation only. In an example 12-3, Zn and $Fe_{50}Co_{50}$ were used as master materials to be changed into a Zn—$Fe_{50}Co_{50}$ oxide layer 40 by means of ion-beam oxidation and reduction. In an example 12-4, Fe and Zn were used as master materials to be changed into a Zn—$Fe_{50}Co_{50}$ oxide layer 40 by means of ion-beam oxidation only. Reference examples 12-1 to 12-4 lacked the metal layer 50 and had the respective oxide layers 40 formed under the same conditions as those to form the oxide layers 40 of the examples 12-1 to 12-4.

The respective magnetoresistive elements manufactured were evaluated for MR change rates and areal resistances RA. The MR change rates and the areal resistances RA were measured with a DC four-terminal method.

As shown in FIG. 32, the magnetoresistive elements of the examples 12-1 to 12-4 showed MR change rates higher than those of the magnetoresistive elements of the reference examples 12-1 to 12-4. Moreover, the magnetoresistive element of the example 12-1 of which oxide layer 40 underwent the final reduction treatment showed a higher MR change rate than the magnetoresistive element of the example 12-2 of which oxide layer 40 did not undergo the final reduction treatment. This tendency was observed in both cases with and without the metal layer 50. Moreover, the tendency was observed in both cases where the oxide layer 40 is based on Fe and where the oxide layer 40 is based on $Fe_{50}Co_{50}$.

Third Embodiment

Figure 33:
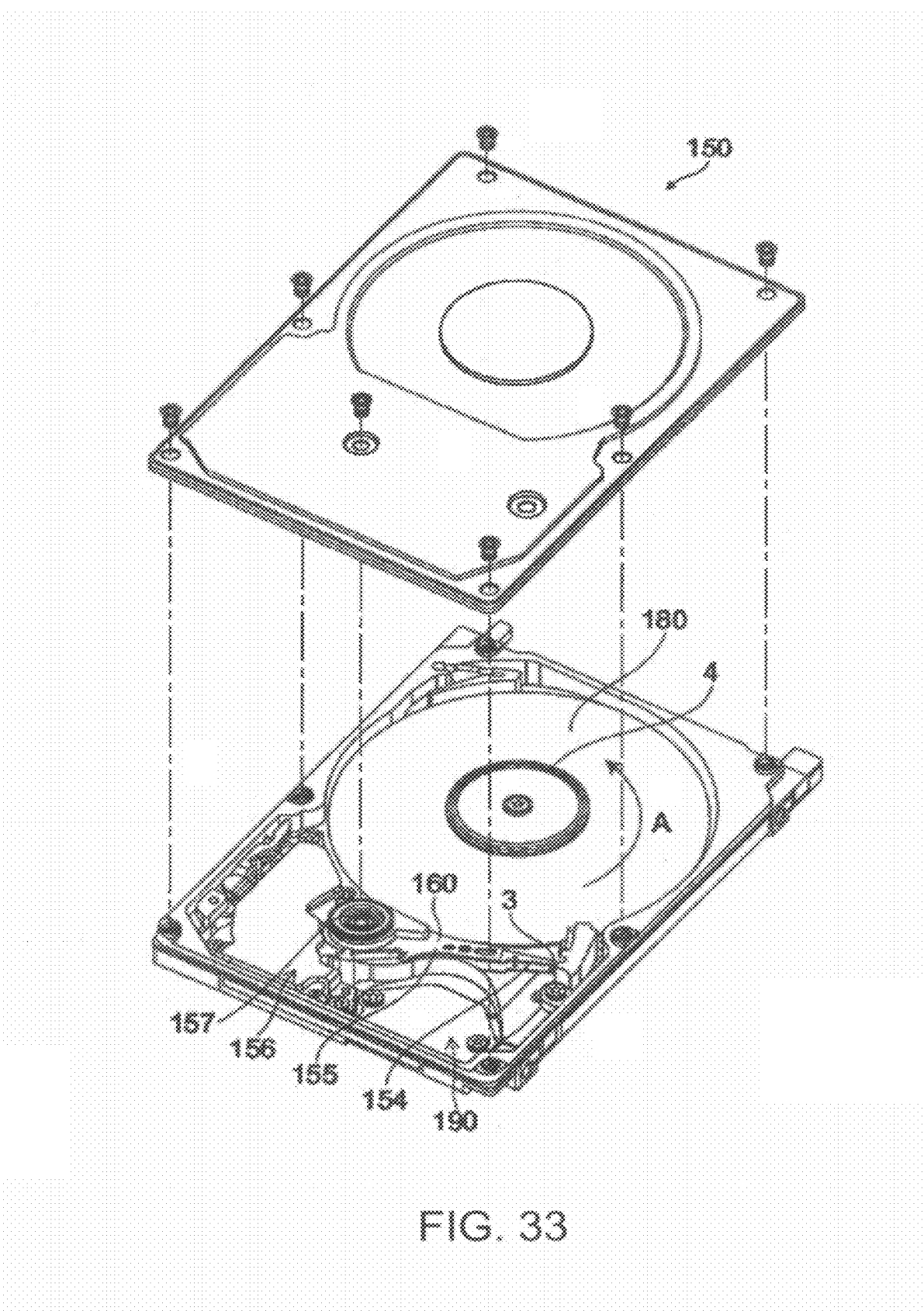
FIG. 33 is a view showing a magnetic recording/reproducing apparatus in accordance with a third embodiment.

FIG. 33 is a view showing a magnetic recording/reproducing apparatus 150 in accordance with a third embodiment.

The magnetic recording/reproducing apparatus 150 is an apparatus employing a rotary actuator. In FIG. 33, a spindle motor 4 is provided with a recording medium disk 180, and rotates the recording medium disk 180 in a direction shown by the arrow A by a motor (not shown) in response to a control signal from a drive control unit (not shown). Alternatively, the magnetic recording apparatus 150 in accordance with this embodiment may be provided with two or more recording medium disks 180.

The recording medium disk 180 rotates so that a pressing load due to the suspension 154 is balanced with a force generated on the air-bearing surface (also referred to as ABS) of the head slider 3, thereby suspending the air-bearing surface of the head slider 3 above the surface of the recording medium disk 180 with a prescribed flying height.

The suspension 154 is connected to an end of an actuator arm 155 including a bobbin to hold a drive coil (not shown). The other end of the actuator arm 155 is provided with a voice coil motor 156, i.e., a linear motor. A voice coil motor 156 can include a drive coil (not shown) and a magnetic circuit. The drive coil is wound up onto the bobbin of the actuator arm 155. The magnetic circuit includes a permanent magnet and a facing yoke so that the drive coil is sandwiched therebetween.

The actuator arm 155 is held by ball bearings which are provided to both the upper and lower two sides of a bearing portion 157, and can rotate slidably owing to the voice coil motor 156. As a result, the actuator arm 155 is capable of moving the magnetic recording head to an arbitrary position of the recording medium disk 180.

Fourth Embodiment

Figure 34A:
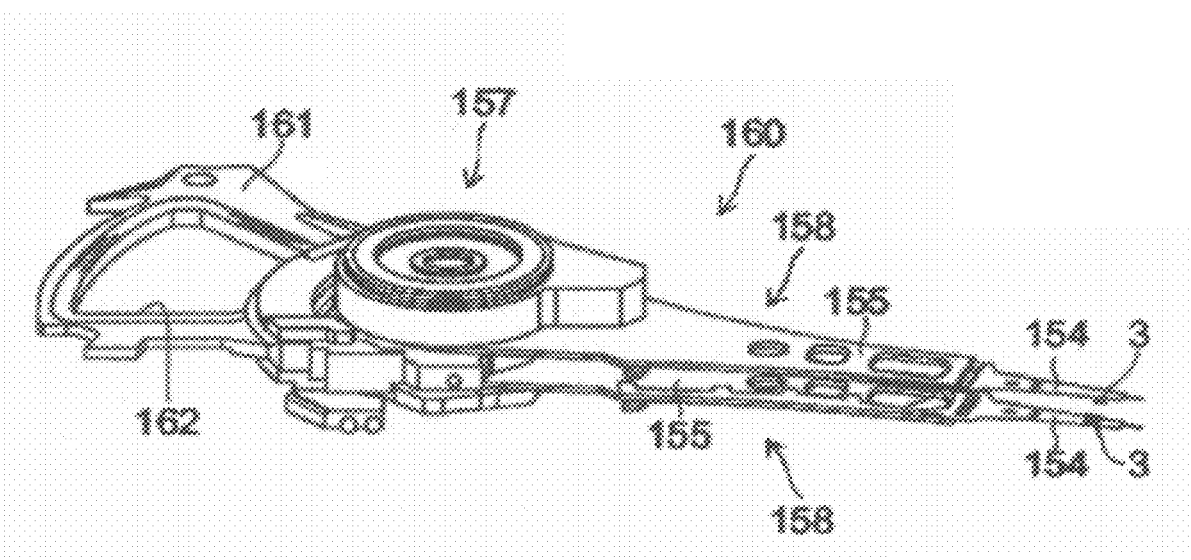
FIGS. 34A and 34B are views showing a head stack assembly in accordance with a fourth embodiment.
Figure 34B:
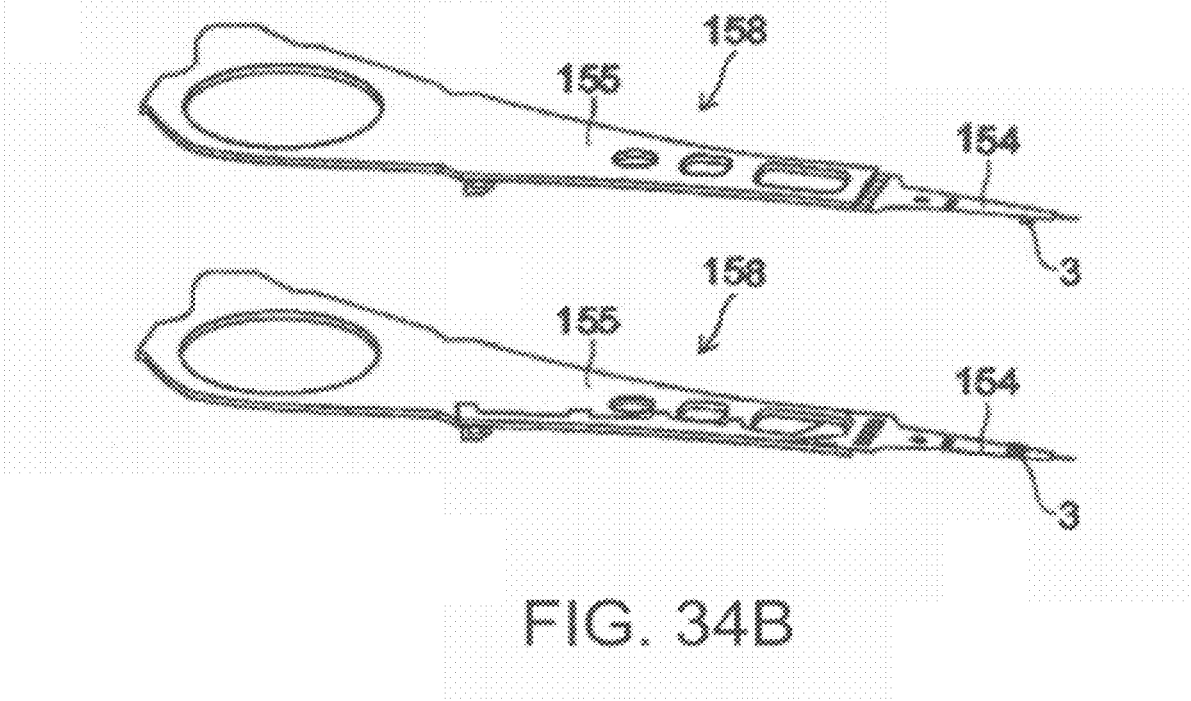

FIGS. 34A and 34B are views showing a head stack assembly in accordance with a fourth embodiment.

FIG. 34A is a perspective view illustrating a configuration of the magnetic recording/reproducing apparatus 150 in accordance with the fourth embodiment to enlarge the head stack assembly 160.

FIG. 34B is a perspective view illustrating a magnetic head stack assembly (head gimbal assembly referred to as "HGA") 158 to be included in a portion of the head stack assembly 160.

As illustrated in FIG. 34A, the head stack assembly 160 has the bearing portion 157, a head gimbal assembly (HGA) 158 extending from the bearing portion 157, and a suspension flame 161 which extends from the bearing portion 157 in a direction opposite to HGA and suspends a coil 162 of the voice coil motor.

As shown in FIG. 34B, the head gimbal assembly 158 has the actuator arm 155 extending from the bearing portion 157, and the suspension 154 extending from the actuator arm 155.

A head slider 3 is attached at the tip of the suspension 154. Then, either of the magnetic recording heads in accordance with the embodiments described above is carried by the head slider 3.

The magnetic head assembly (head gimbal assembly) 158 in accordance with the above embodiments is provided with the magnetic recording head according to the above embodiments, the head slider 3 carrying the magnetic recording head, the suspension 154 carrying the head slider 3 on one end thereof, and the actuator arm 155 connected to the other end of the suspension 154.

Fifth Embodiment

A magnetic memory will be described as a magnetic recording/reproducing apparatus in accordance with a fifth embodiment, which includes the magnetoresistive elements of the above embodiments. The magnetoresistive elements of the above embodiments enable it to form a magnetic random access memory (MRAM) where memory cells are arranged in an array. The magnetoresistive elements 100, 200, 300, 400, 500, 600, 700, 800, and 900 may be employed in addition to the magnetoresistive element 101 below.

Figure 35:
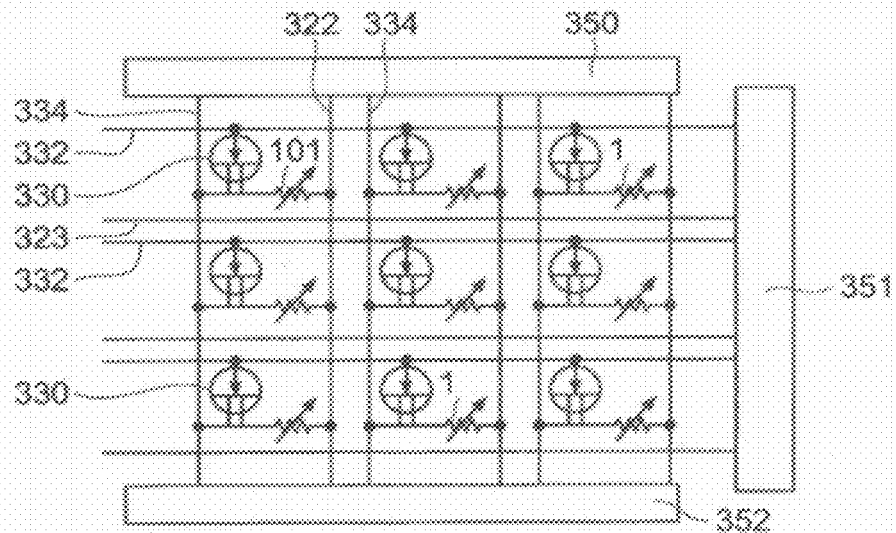
FIG. 35 is a diagram showing a configuration of a magnetic recording/reproducing apparatus in accordance with a fifth embodiment.

FIG. 35 is a diagram showing a composition of a magnetic recording/reproducing apparatus in accordance with the fifth embodiment.

That is, FIG. 11 illustrates a circuit configuration having memory cells arranged in an array. As shown in FIG. 35, the magnetic memory in accordance with the fifth embodiment is provided with a column decoder 350 and a row decoder 351 to select a cross point (a bit) therein. Only one switching transistor 330 is selected by a bit line 334 and a word line 332 to be switched on, thereby allowing it to detect a current passing through a specific magnetoresistive element using a sense amplifier 352 and to read out the bit information stored in the free layer 7 of the specific magnetoresistive element.

On the other hand, when a bit information is written, a current is passed through a specific written word line 323 and a specific written bit line 322 to generate a writing magnetic field and to apply the writing magnetic field to the free layer 7.

Figure 36:
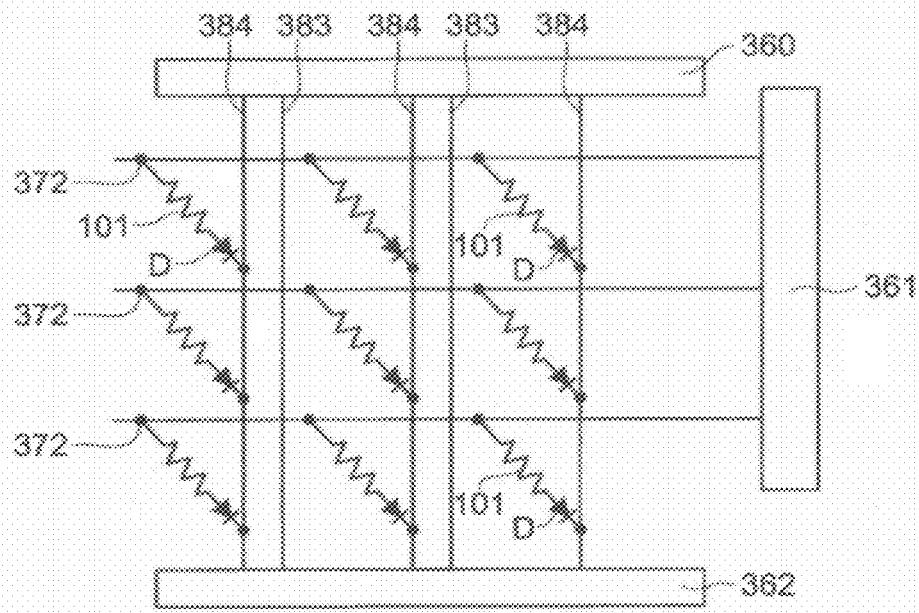
FIG. 36 is a diagram illustrating another configuration of the magnetic recording/reproducing apparatus in accordance with the fifth embodiment.

FIG. 36 is a diagram illustrating another configuration of the magnetic recording/reproducing apparatus in accordance with the fifth embodiment.

As shown in FIG. 36, both the bit line 372 and the word line 384 wired in a matrix are selected by the decoders 360, 361 and 362, thereby allowing it to select a specific memory cell in the array. Each memory cell has a structure where the magnetoresistive element 1 and a diode D are connected with each other in series. Here, the diode D prevents a sense current from bypassing any memory cells other than the selected memory cell including the selected magnetoresistive element 101. The respective writing currents are passed through the specific bit line 372 and word line 383 independently to generate a magnetic field. The magnetic field performs writing.

Figure 37:
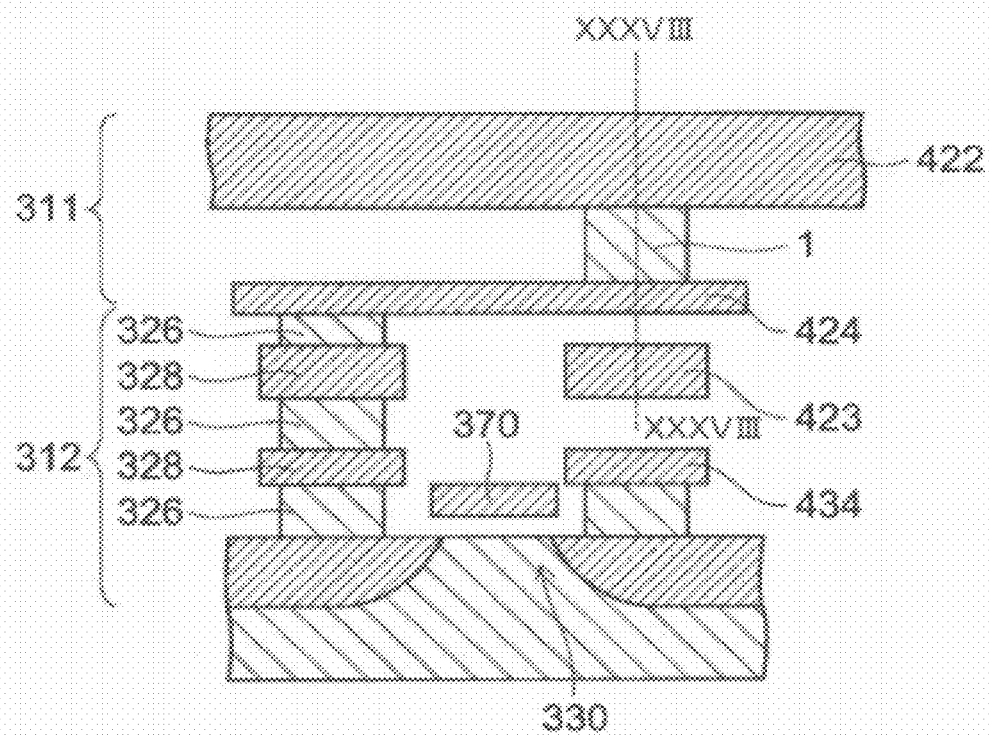
FIG. 37 is a typical sectional view illustrating a main part of the magnetic recording/reproducing apparatus in accordance with the fifth embodiment.

FIG. 37 is a typical sectional view illustrating a substantial part of the magnetic recording/reproducing apparatus in accordance with the fifth embodiment.

Figure 38:
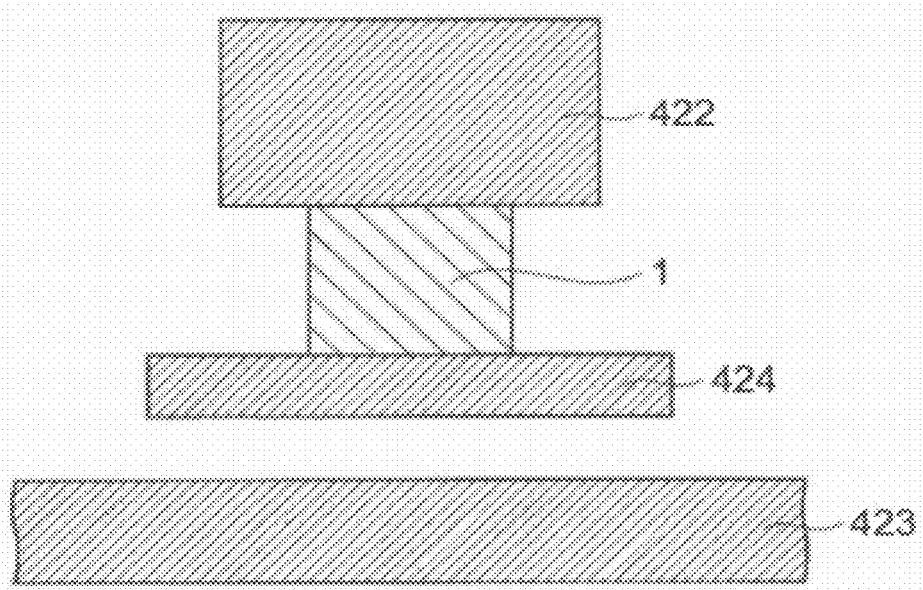
FIG. 38 is a sectional view cut along the broken line XXXVIII-XXXVIII line in FIG. 37.

FIG. 38 is a sectional view cut along the broken line XXXVIII-XXXVIII in FIG. 37.

FIGS. 37 and 38 illustrate a structure of the one-bit memory cell included in the magnetic recording/reproducing apparatus (magnetic memory) shown in FIG. 11. This memory cell includes a storage cell 311 and a transistor 312 for address selection.

The storage cell 311 has the magnetoresistive element 1, and a pair of lines 422, 424 which are connected to the magnetoresistive element 101. The magnetoresistive element 101 is one of the magnetoresistive elements in accordance with the embodiments mentioned above.

On the other hand, the transistor 312 for address selection is provided with the switching transistor 330 connected thereto through a via hole 326 and a buried line 328 thereto. The switching transistor 330 switches a current pass between the magnetoresistive element 101 and the line 434 in response to a voltage applied to a gate 370.

In addition, a writing line 423 is provided in a direction substantially vertical to a line 422 under the magnetoresistive element 101. These lines 422, 423 can be formed employing one of Al, Cu, W and Ta, or an alloy of these for example.

The lines 422 and 423 correspond to the bit line 322 and the word line 323, respectively.

Write is performed in such a memory cell as follows. Respective writing pulse currents are passed through the lines 422, 423 to write bit information in the magnetoresistive element 101, and form a superposed magnetic field of two magnetic fields generated by the respective writing pulse currents. The superposed magnetic field is applied to the recording layer of the magnetoresistive element to switch the magnetization of the recording layer.

Reading is performed as follows. A sense current is passed through the line 422, the magnetoresistive element 101 including the magnetic recording layer and the line 424 to estimate the resistance or resistance change of the magnetoresistive element 1.

The magnetic memory in accordance with the embodiments employing the magnetoresistive element in accordance with the embodiments mentioned above enables it to firmly perform write-in and read-out by controlling firmly magnetic domains of the recording layer and by writing firmly on the recording layer, even though the memory cell is to be downsized.

Embodiments are not limited to the embodiments described above, and can be expanded and modified to be included in the invention. One skilled in the art can choose a specific layer structure, or the shape or the material of electrodes, biasing layers or insulator layers for the magnetoresistive elements to acquire similar effects. For example, when applying the magnetoresistive element to a magnetic reproducing head, magnetic shields may be provided on the upper and lower surfaces of the element to control the reproduction resolution of the magnetic head.

The embodiments described above can be applied to not only a longitudinal magnetic recording system but a perpendicular one. Alternatively, the magnetic reproducing apparatus may be a "stationary type" regularly provided with a specific recording medium or a "removable type" for which a recording medium can be replaced.

As described above, the embodiments have been explained with reference to several examples. However, the invention is not limited to these specific examples. While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A magnetoresistive element comprising:
   a first electrode;
   a second electrode;
   a first magnetic layer to be provided between the first electrode and the second electrode and to have first magnetization whose direction is fixed or variable to an external magnetic field;
   a second magnetic layer to be provided between the first magnetic layer and the second electrode and to have second magnetization whose direction is variable to the external magnetic field;

a spacer layer to be provided between the first magnetic layer and the second magnetic layer;

an oxide layer to be provided between the first electrode and the first magnetic layer, provided in the first magnetic layer, provided between the first magnetic layer and the spacer layer, provided in the spacer layer, provided between the spacer layer and the second magnetic layer, provided in the second magnetic layer, or provided between the second magnetic layer and the second electrode, and to include at least one element selected from the group consisting of Zn, In, Sn, and Cd, and to include at least one element selected from the group consisting of Fe, Co, and Ni; and a metal layer to be provided in a direction and in contact with the oxide layer, the direction being substantially perpendicular to both the first layer and the second layer, and to include at least one element selected from the group consisting of Zn, In, Sn, and Cd by not less than 5 at % and not more than 80 at %; and to include at least one element selected from the group consisting of Fe, Co, and Ni.

2. The element according to claim 1, wherein the metal layer includes a laminated structure of:
a first layer containing at least one element selected from the group consisting of Zn, In, Sn, and Cd; and
a second layer containing at least one element selected from the group consisting of Fe, Co, and Ni.

3. The element according to claim 1, wherein the metal layer contains Fe by not less than 10 at % and not more than 80 at %.

4. The element according to claim 1, wherein a film thickness of the metal layer is not less than 0.1 nm and not more than 4 nm.

5. A head assembly comprising:
a head slider to carry a magnetoresistive element;
a suspension to carry the head slider at one end of the suspension; and
an actuator arm to be connected to the other end of the suspension,
wherein
the magnetoresistive element including:
a first electrode;
a second electrode;
a first magnetic layer to be provided between the first electrode and the second electrode and to have first magnetization whose direction is fixed or variable to an external magnetic field;
a second magnetic layer to be provided between the first magnetic layer and the second electrode and to have second magnetization whose direction is variable to the external magnetic field;
a spacer layer to be provided between the first magnetic layer and the second magnetic layer;
an oxide layer to be provided between the first electrode and the first magnetic layer, provided in the first magnetic layer, provided between the first magnetic layer and the spacer layer, provided in the spacer layer, provided between the spacer layer and the second magnetic layer, provided in the second magnetic layer, or provided between the second magnetic layer and the second electrode, and
to include at least one element selected from the group consisting of Zn, In, Sn, and Cd, and to include at least one element selected from the group consisting of Fe, Co, and Ni; and a metal layer to be provided in a direction and in contact with the oxide layer, the direction being substantially perpendicular to both the first layer and the second layer, and
to include at least one element selected from the group consisting of Zn, In, Sn, and Cd by not less than 5 at % and not more than 80 at %; and to include at least one element selected from the group consisting of Fe, Co, and Ni.

6. A magnetic recording/reproducing apparatus comprising:
the magnetic head assembly according to claim 5; and
a signal processor to perform signal-write on a magnetic recording medium or signal-read from the magnetic recording medium.

7. A memory cell array comprising:
two or more first interconnections to be provided in columns;
two or more second interconnections to be provided in rows; and
the magnetoresistive elements according to claim 1, of which first electrodes and second electrodes are in contact with the first interconnections and the second interconnections, respectively, and vice versa so that the magnetoresistive elements are sandwiched therebetween.

8. A manufacturing method of a magnetoresistive element, comprising:
forming a metal layer of the element
on a first electrode of the element after forming the first electrode and before forming an oxide layer of the element; or
on a first magnetic layer of the element before forming the oxide layer which is formed during formation of the first magnetic layer; or
on the first magnetic layer after forming the first magnetic layer and before forming the oxide layer; or
on a spacer layer of the element before forming the oxide layer which is formed during formation of the spacer layer; or
on the spacer layer after forming the spacer layer and before forming the oxide layer; or
on a second magnetic layer of the element before forming the oxide layer which is formed during formation of the second magnetic layer; or
on the second magnetic layer after forming the second magnetic layer and before forming the oxide layer; or
on the oxide layer after forming the oxide layer,
the metal layer including:
at least one element selected from the group consisting of Zn, In, Sn, and Cd; and
at least one element selected from the group consisting of Fe, Co, and Ni,
wherein
the element including:
the first electrode;
a second electrode;
the first magnetic layer to be provided between the first electrode and the second electrode and to have first magnetization whose direction is fixed or variable to an external magnetic field;
the second magnetic layer to be provided between the first magnetic layer and the second electrode and to have second magnetization whose direction is variable to the external magnetic field;
the spacer layer to be provided between the first magnetic layer and the second magnetic layer;

the oxide layer to be provided between the first electrode and the first magnetic layer, provided in the first magnetic layer, provided between the first magnetic layer and the spacer layer, provided in the spacer layer, provided between the spacer layer and the second magnetic layer, provided in the second magnetic layer, or provided between the second magnetic layer and the second electrode, and to include at least one element selected from the group consisting of Zn, In, Sn, and Cd, and to include at least one element selected from the group consisting of Fe, Co, and Ni; and the metal layer to be provided in a direction and in contact with the oxide layer, the direction being substantially perpendicular to both the first layer and the second layer, and to include at least one element selected from the group consisting of Zn, In, Sn, and Cd by not less than 5 at % and not more than 80 at %; and to include at least one element selected from the group consisting of Fe, Co, and Ni.

9. The method according to claim 8, wherein the metal layer include at least the element selected from the group consisting of Zn, In, Sn, and Cd by not less than 5 at % and not more than 80 at %.

10. The method according to claim 8, wherein a film thickness of the metal layer is not less than 0.1 nm and not more than 4 nm.

\* \* \* \* \*